(12) United States Patent
Makala et al.

(10) Patent No.: US 11,302,716 B2
(45) Date of Patent: Apr. 12, 2022

(54) THREE-DIMENSIONAL MEMORY DEVICE INCLUDING FERROELECTRIC-METAL-INSULATOR MEMORY CELLS AND METHODS OF MAKING THE SAME

(71) Applicant: SANDISK TECHNOLOGIES LLC, Addison, TX (US)

(72) Inventors: Raghuveer S. Makala, Campbell, CA (US); Yanli Zhang, San Jose, CA (US); Fei Zhou, Campbell, CA (US); Rahul Sharangpani, Fremont, CA (US); Adarsh Rajashekhar, Santa Clara, CA (US); Seung-Yeul Yang, Pleasanton, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/876,816

(22) Filed: May 18, 2020

(65) Prior Publication Data
US 2021/0358952 A1    Nov. 18, 2021

(51) Int. Cl.
*H01L 27/11597*  (2017.01)
*H01L 27/11587*  (2017.01)
(Continued)

(52) U.S. Cl.
CPC .... *H01L 27/11597* (2013.01); *H01L 23/5226* (2013.01); *H01L 23/5283* (2013.01);
(Continued)

(58) Field of Classification Search
CPC ............ H01L 23/5226; H01L 23/5283; H01L 27/11585; H01L 27/11587; H01L 27/1159; H01L 27/11597
See application file for complete search history.

(56) References Cited

U.S. PATENT DOCUMENTS

| 9,230,983 B1 | 1/2016 | Sharangpani et al. |
| 9,379,124 B2 | 6/2016 | Sharangpani et al. |
| (Continued) | | |

OTHER PUBLICATIONS

Endoh, T. et al., "Novel Ultra High Density Memory with a Stacked-Surrounding Gate Transistor (S-SGT) Structured Cell," IEDM Proc., (2001), 33-36.
(Continued)

*Primary Examiner* — Matthew E Warren
(74) *Attorney, Agent, or Firm* — The Marbury Law Group PLLC

(57) ABSTRACT

A memory opening or a line trench is formed through an alternating stack of insulating layers and sacrificial material layers. A memory opening fill structure or a memory stack assembly is formed, which includes a vertical stack of discrete intermediate metallic electrodes formed on sidewalls of the sacrificial material layers, a gate dielectric layer, and a vertical semiconductor channel. Backside recesses are formed by removing the sacrificial material layers selective to the insulating layers, and a combination of a ferroelectric dielectric layer and an electrically conductive layer within each of the backside recesses. The electrically conductive layer is laterally spaced from a respective one of the discrete intermediate metallic electrodes by the ferroelectric dielectric layer. Ferroelectric-metal-insulator memory elements are formed around the vertical semiconductor channel.

13 Claims, 62 Drawing Sheets

(51) Int. Cl.
*H01L 27/1159* (2017.01)
*H01L 27/11585* (2017.01)
*H01L 23/528* (2006.01)
*H01L 23/522* (2006.01)

(52) U.S. Cl.
CPC .... *H01L 27/1159* (2013.01); *H01L 27/11585* (2013.01); *H01L 27/11587* (2013.01)

(56) References Cited

U.S. PATENT DOCUMENTS

| | | | |
|---|---|---|---|
| 9,496,419 | B2 | 11/2016 | Sharangpani et al. |
| 9,570,455 | B2 | 2/2017 | Sharangpani et al. |
| 9,698,223 | B2 | 7/2017 | Sharangpani et al. |
| 9,768,270 | B2 | 9/2017 | Gunji-Yoneoka et al. |
| 9,941,299 | B1 | 4/2018 | Chen et al. |
| 10,283,513 | B1 | 5/2019 | Zhou et al. |
| 10,381,376 | B1 * | 8/2019 | Nishikawa ...... H01L 21/823481 |
| 10,438,645 | B2 | 10/2019 | Muller et al. |
| 10,460,788 | B2 | 10/2019 | Muller |
| 10,734,409 | B2 | 8/2020 | Yoo |
| 10,916,654 | B2 | 2/2021 | Fuji |
| 11,164,890 | B2 | 11/2021 | Zhang et al. |
| 2009/0323411 | A1 * | 12/2009 | Bach .................. H01L 27/1159 365/184 |
| 2011/0297912 | A1 | 12/2011 | Samachisa et al. |
| 2016/0043143 | A1 | 2/2016 | Sakotsubo |
| 2017/0141161 | A1 | 5/2017 | Sakotsubo |
| 2017/0352669 | A1 | 12/2017 | Sharangpani et al. |
| 2019/0221575 | A1 | 7/2019 | Dong et al. |
| 2019/0252405 | A1 | 8/2019 | Tsutsumi et al. |
| 2020/0006375 | A1 | 1/2020 | Zhou et al. |
| 2020/0006376 | A1 | 1/2020 | Makala et al. |
| 2020/0058672 | A1 | 2/2020 | Nishikawa et al. |
| 2020/0119047 | A1 | 4/2020 | Yoo et al. |
| 2020/0235244 | A1 * | 7/2020 | Doyle ................ H01L 29/7827 |
| 2021/0036019 | A1 * | 2/2021 | Sharangpani ..... H01L 27/11587 |
| 2021/0066348 | A1 * | 3/2021 | Prasad .............. H01L 21/02189 |
| 2021/0082957 | A1 | 3/2021 | Sakuma et al. |

OTHER PUBLICATIONS

U.S. Appl. No. 16/457,721, filed Jun. 28, 2019, SanDisk Technologies LLC.
U.S. Appl. No. 16/530,256, filed Aug. 2, 2019, SanDisk Technologies LLC.
U.S. Appl. No. 16/423,500, filed May 28, 2019, SanDisk Technologies LLC.
U.S. Appl. No. 16/249,300, filed Jan. 16, 2019, SanDisk Technologies LLC.
U.S. Appl. No. 16/200,115, filed Nov. 26, 2018, SanDisk Technologies LLC.
U.S. Appl. No. 16/291,673, filed Mar. 4, 2019, SanDisk Technologies LLC.
U.S. Appl. No. 16/278,426, filed Feb. 18, 2019, SanDisk Technologies LLC.
U.S. Appl. No. 16/362,857, filed Mar. 25, 2019, SanDisk Technologies LLC.
U.S. Appl. No. 16/440,378, filed Jun. 13, 2019, SanDisk Technologies LLC.
U.S. Appl. No. 16/412,764, filed May 15, 2019, SanDisk Technologies LLC.
U.S. Appl. No. 16/440,250, filed Jun. 13, 2019, SanDisk Technologies LLC.
U.S. Appl. No. 16/568,668, filed Sep. 12, 2019, SanDisk Technologies LLC.
U.S. Appl. No. 16/454,475, filed Jun. 27, 2019, SanDisk Technologies LLC.
U.S. Appl. No. 16/456,736, filed Jun. 28, 2019, SanDisk Technologies LLC.
U.S. Appl. No. 16/541,289, filed Aug. 15, 2019, SanDisk Technologies LLC.
U.S. Appl. No. 16/454,458, filed Jun. 27, 2019, SanDisk Technologies LLC.
U.S. Appl. No. 16/738,664, filed Jan. 9, 2020, SanDisk Technologies LLC.
U.S. Appl. No. 16/737,088, filed Jan. 8, 2020, SanDisk Technologies LLC.
U.S. Appl. No. 16/577,176, filed Sep. 20, 2019, SanDisk Technologies LLC.
U.S. Appl. No. 16/694,340, filed Nov. 25, 2019, SanDisk Technologies LLC.
U.S. Appl. No. 16/707,541, filed Dec. 9, 2019, SanDisk Technologies LLC.
U.S. Appl. No. 16/728,825, filed Dec. 27, 2019, SanDisk Technologies LLC.
U.S. Appl. No. 16/707,036, filed Dec. 9, 2019, SanDisk Technologies LLC.
Notification of Transmittal of the International Search Report and the Written Opinion of the International Searching Authority for International Patent Application No. PCTUS2020/067286, dated Apr. 25, 2021, 10 pages.
USPTO Office Communication, Notice of Allowance and Fee(s) Due for U.S. Appl. No. 16/876,877, dated Nov. 15, 2021, 20 pages.

* cited by examiner

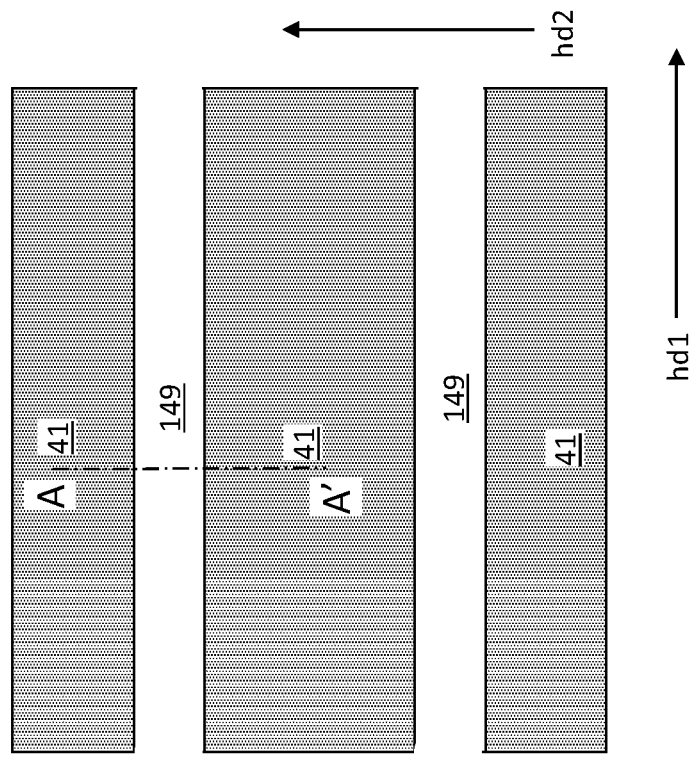
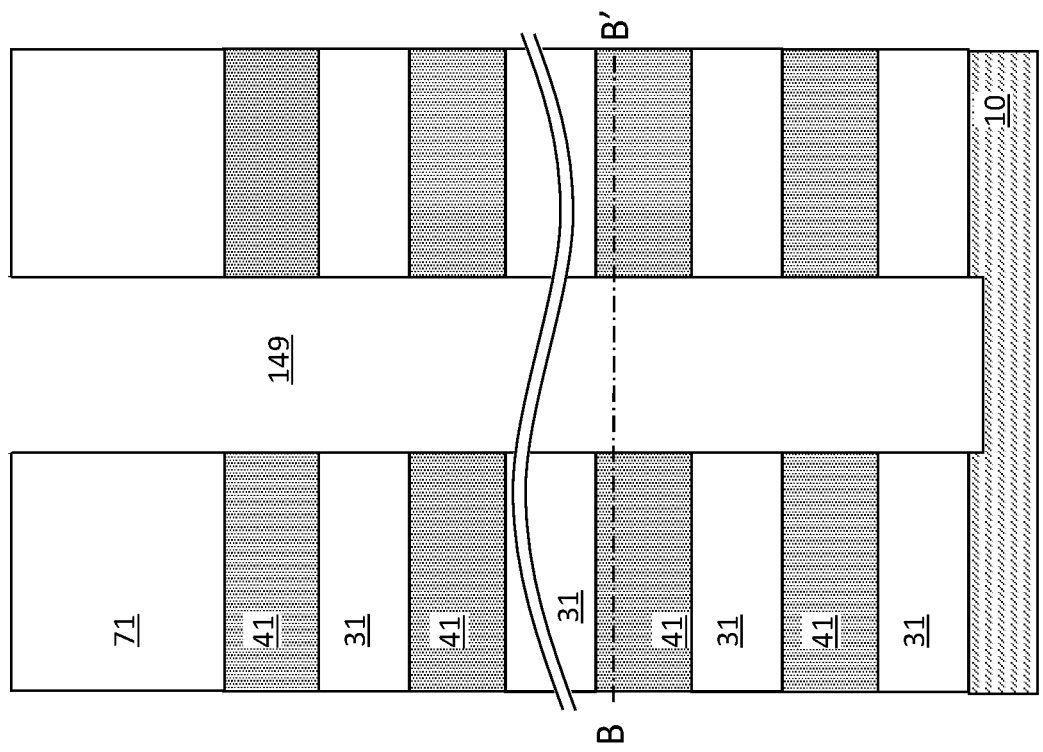
FIG. 5B
FIG. 5A

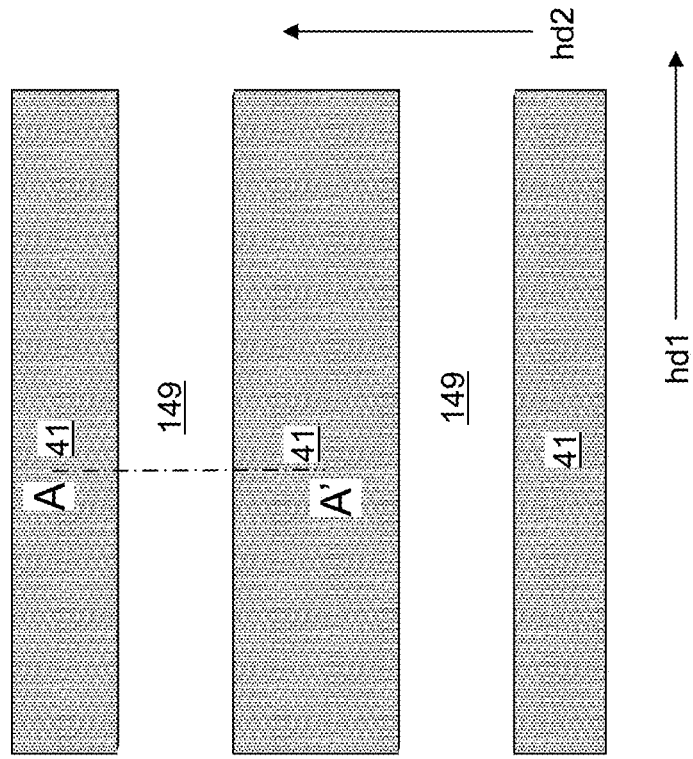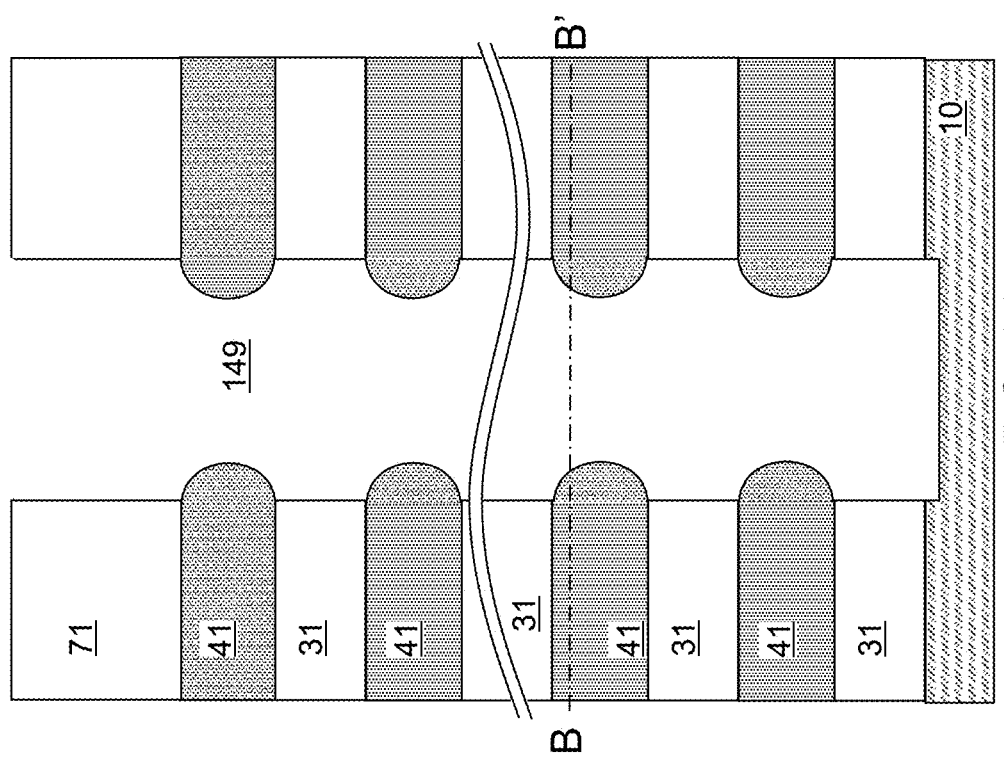
FIG. 6B
FIG. 6A

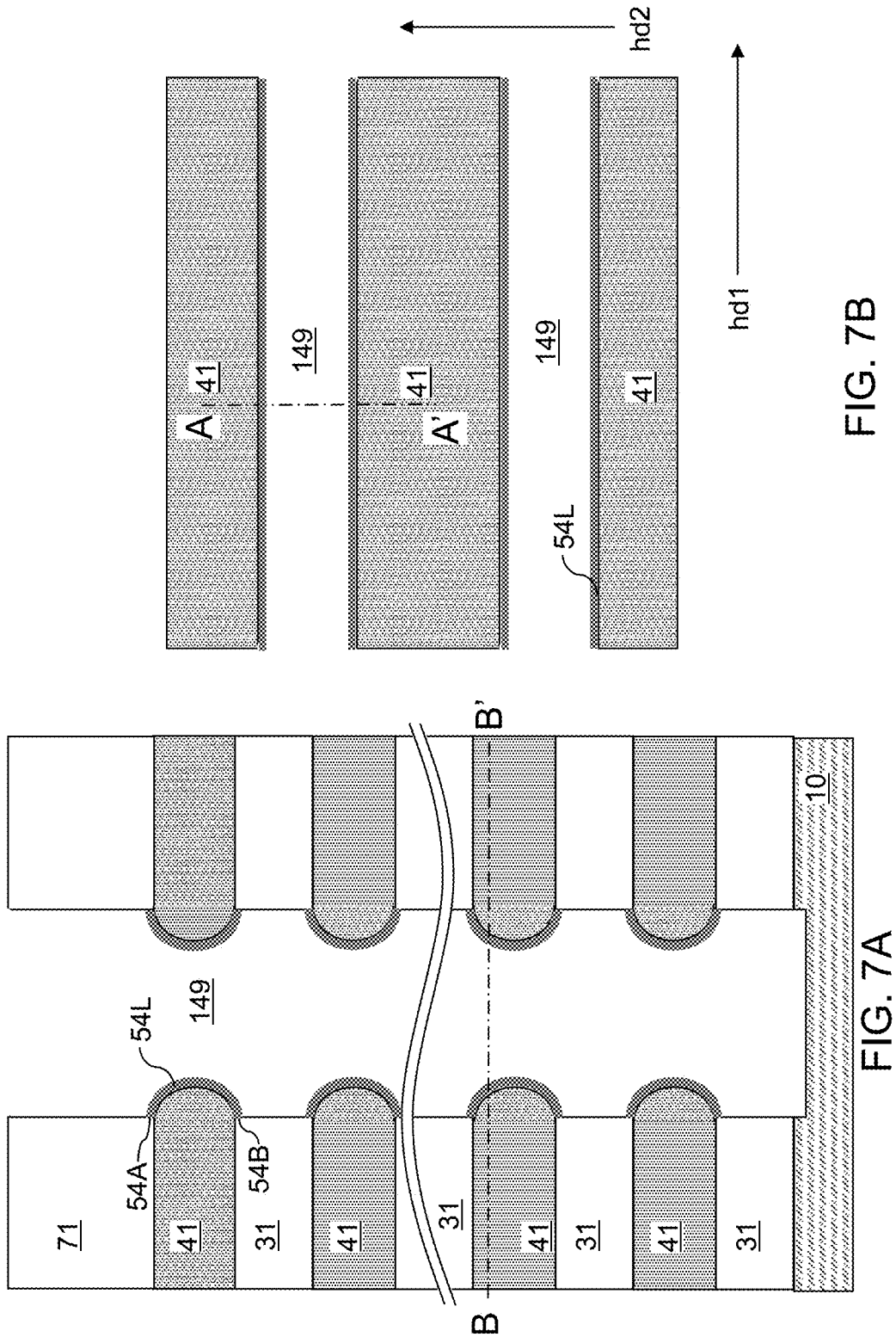

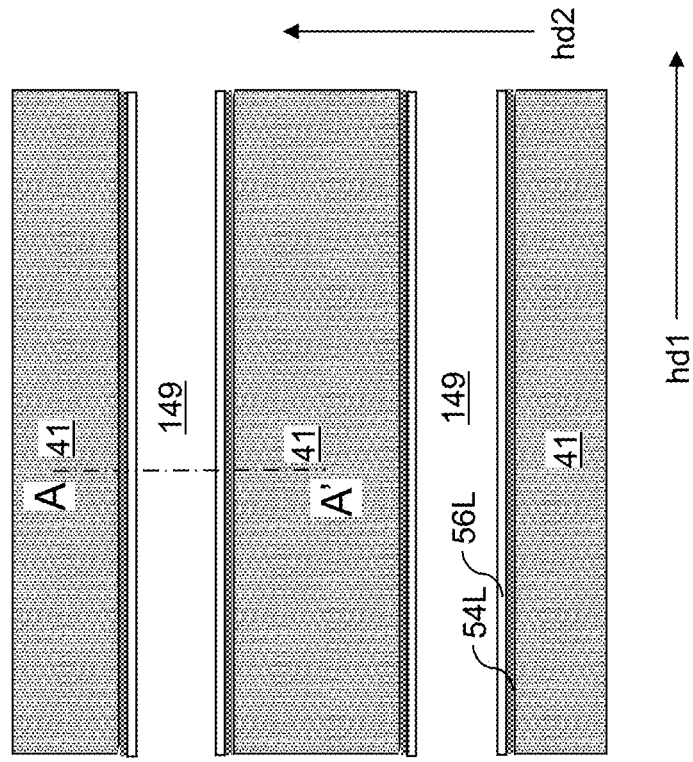
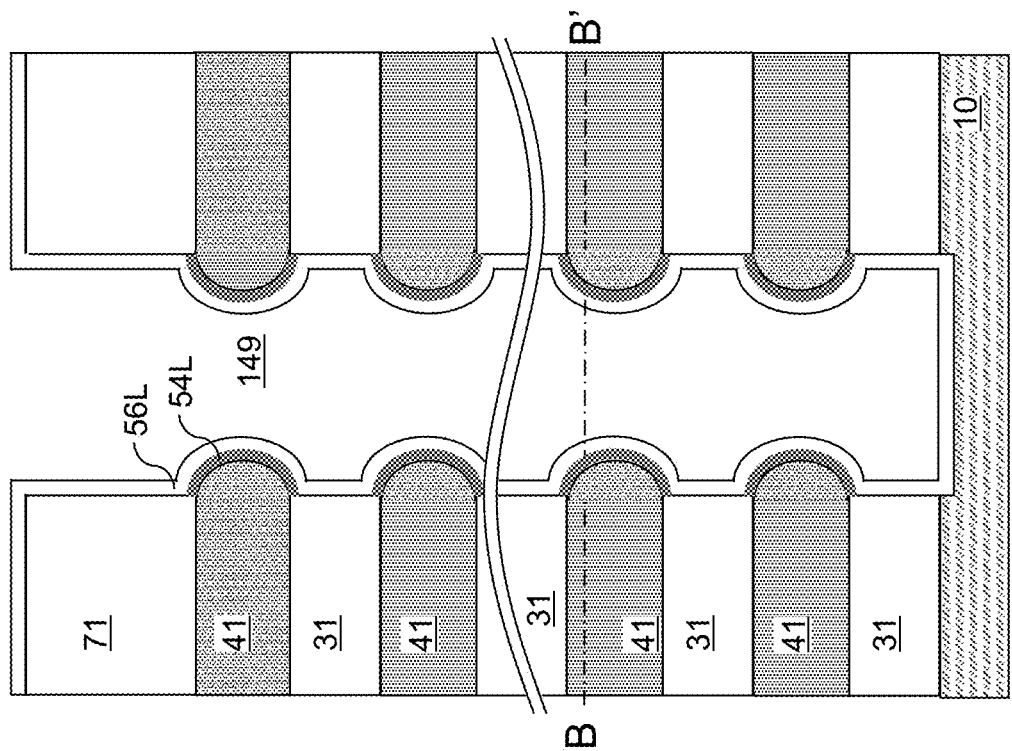
FIG. 8B
FIG. 8A

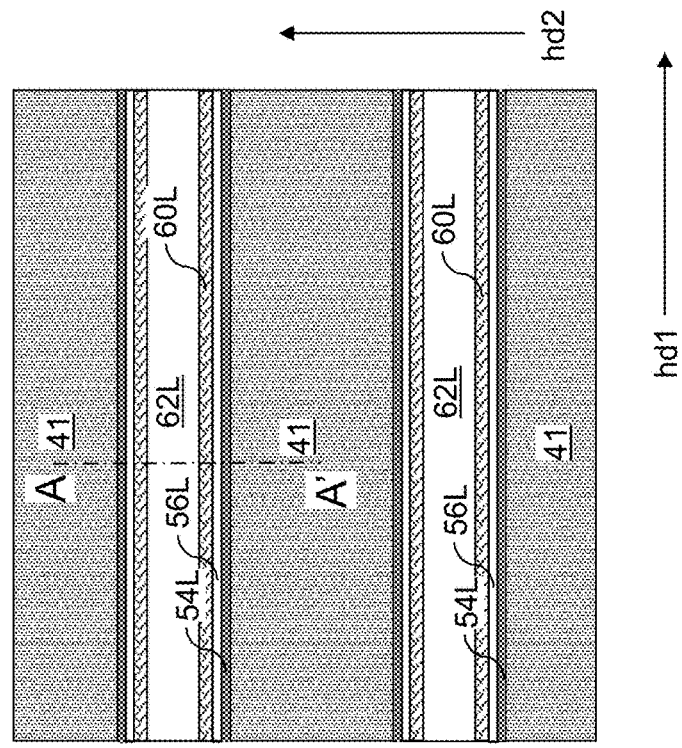
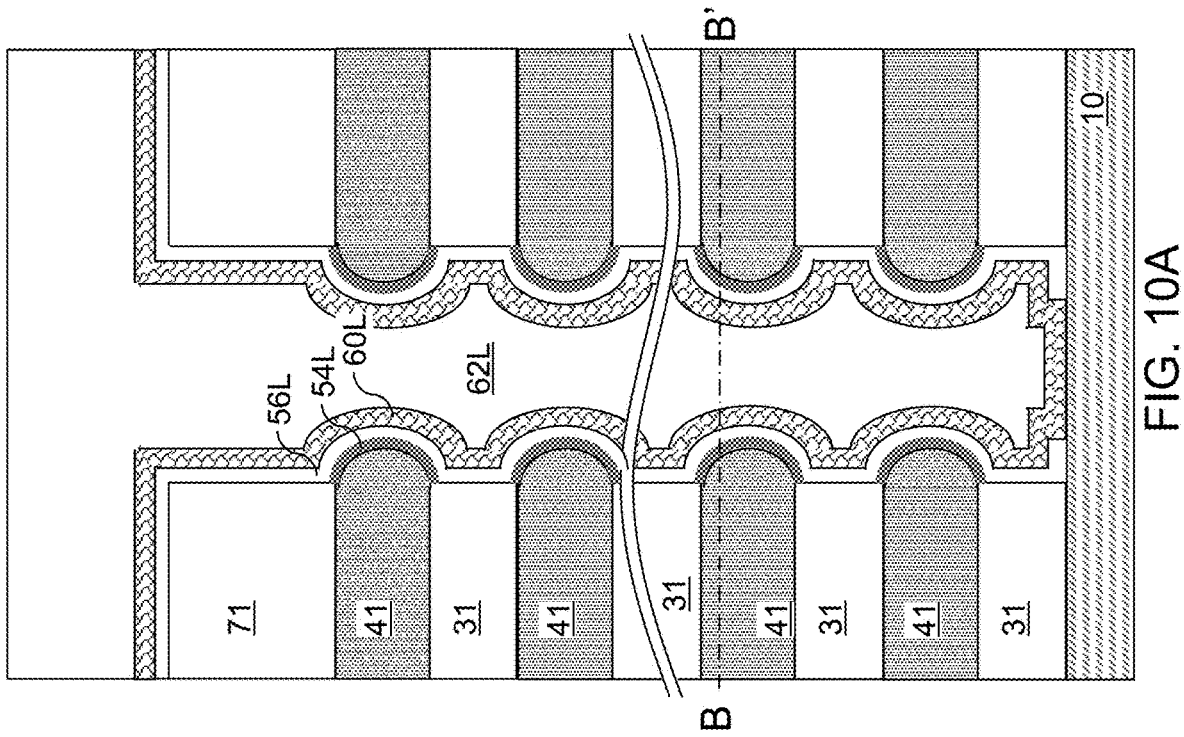
FIG. 10B
FIG. 10A

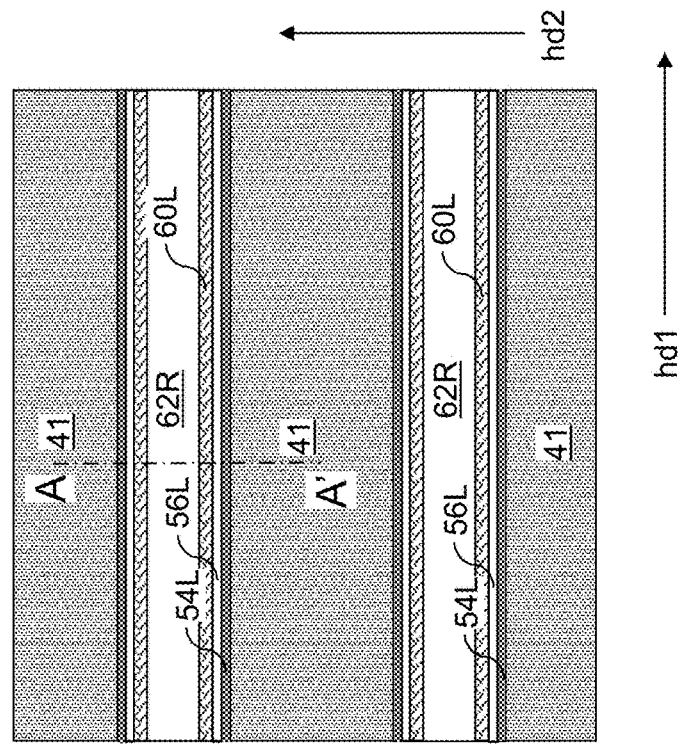
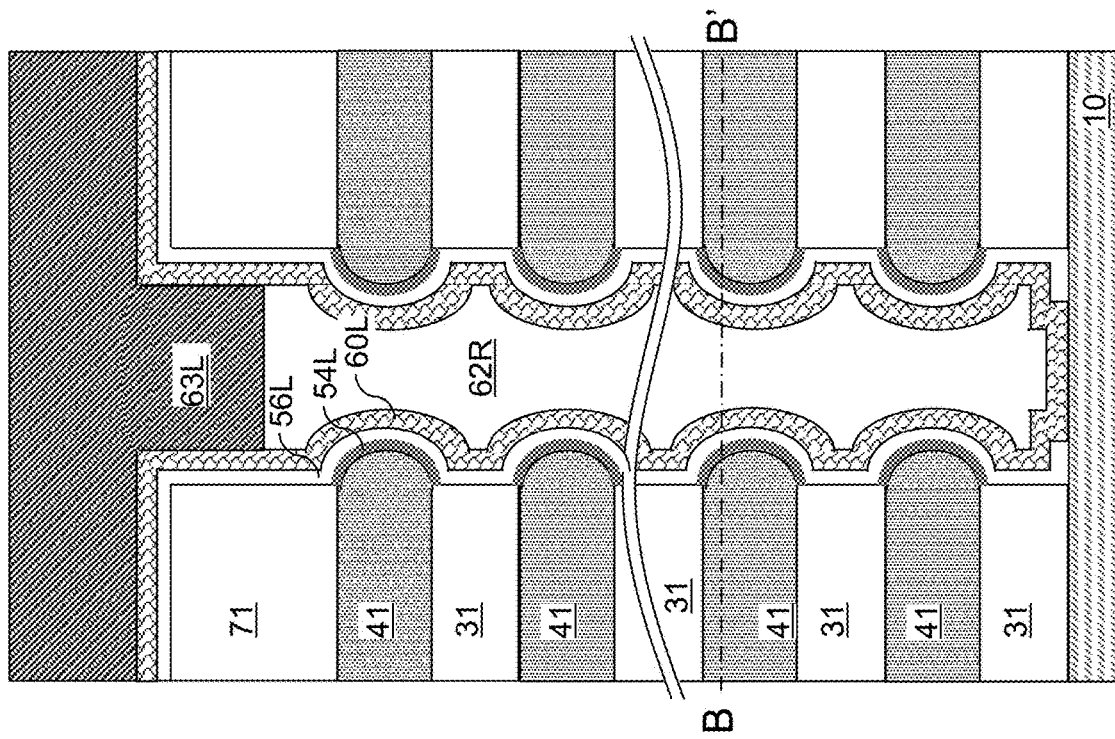
FIG. 11B
FIG. 11A

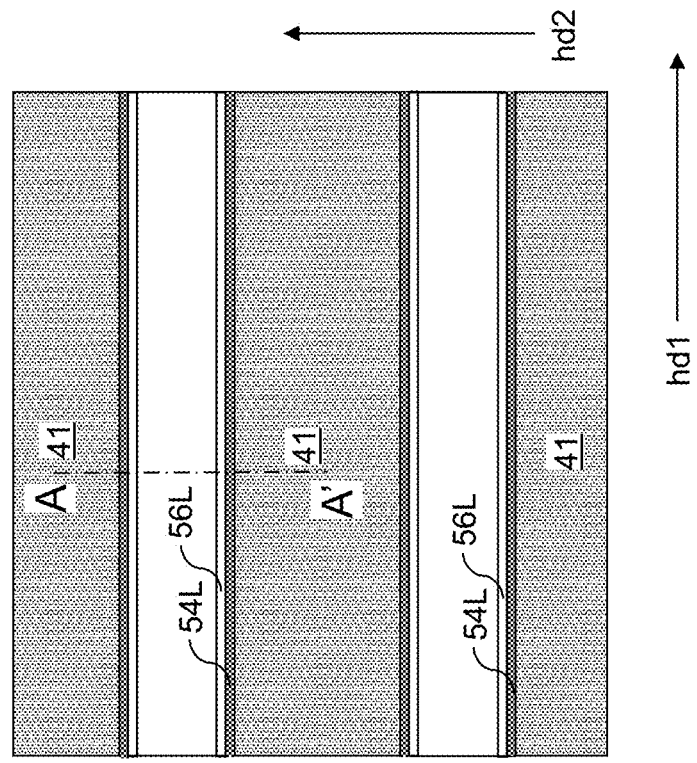
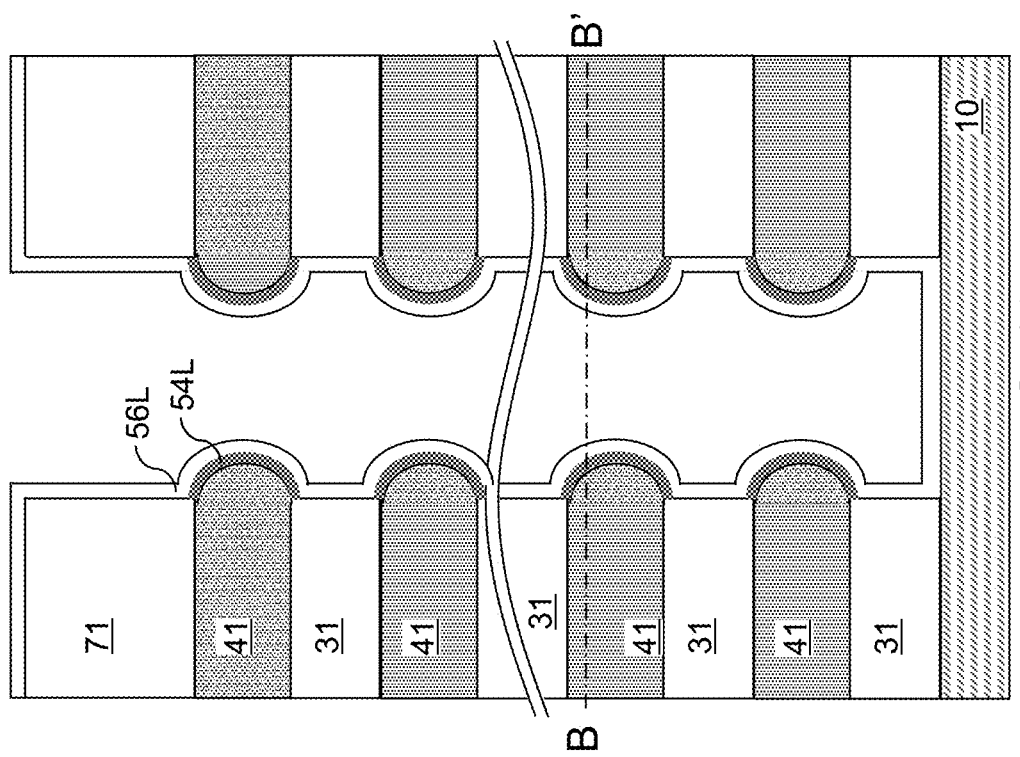
FIG. 20B
FIG. 20A

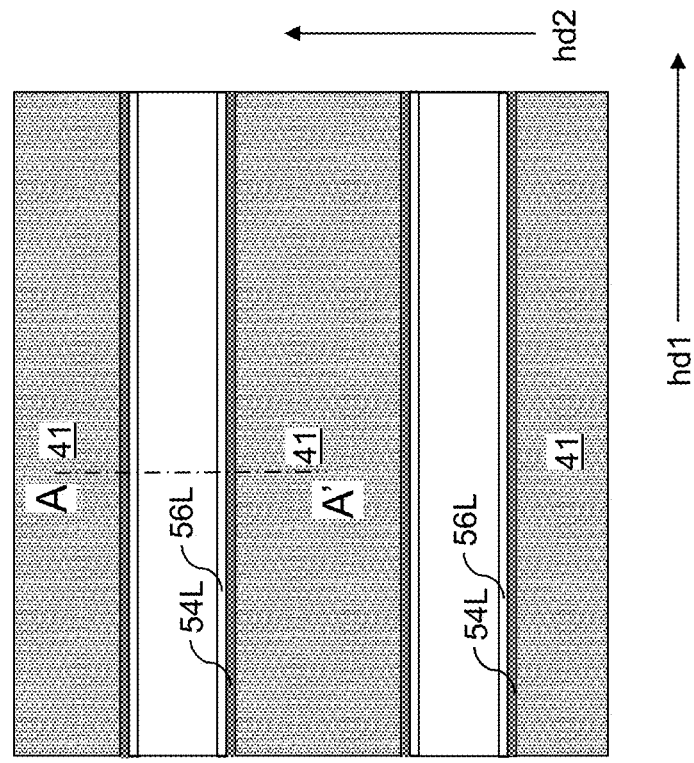
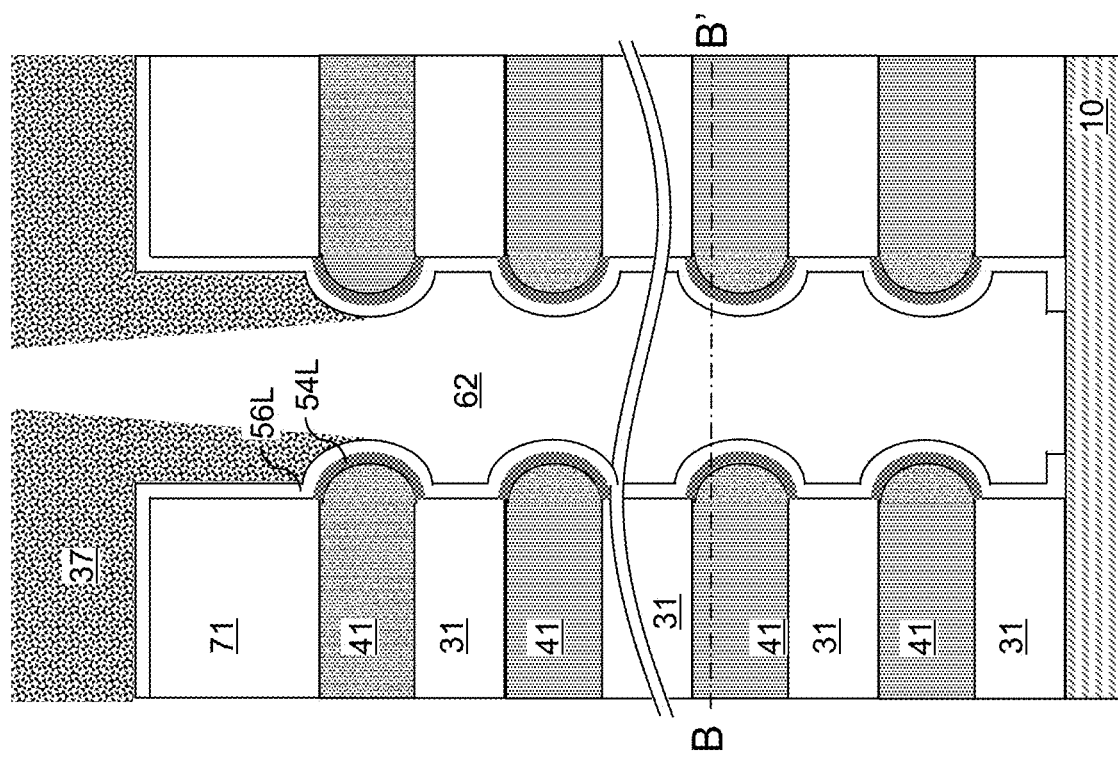
FIG. 21B
FIG. 21A

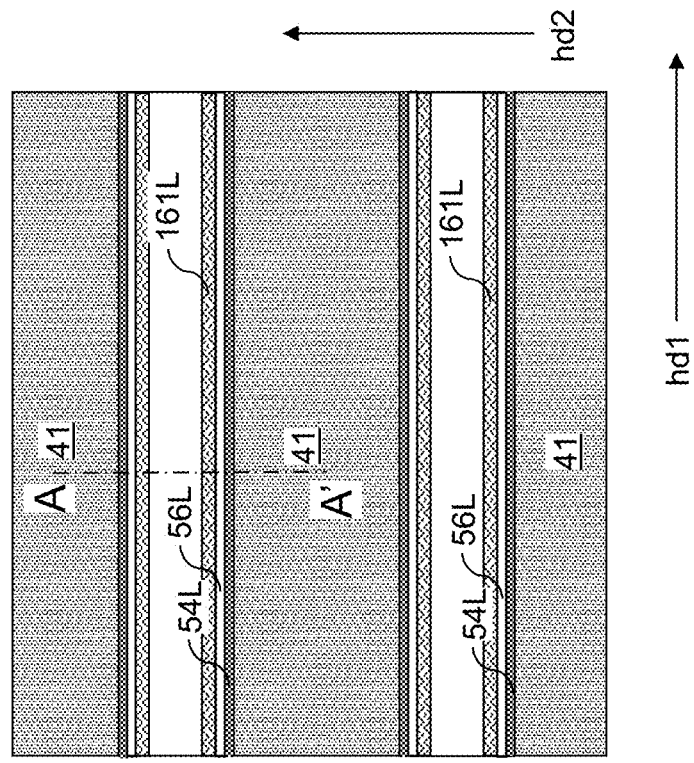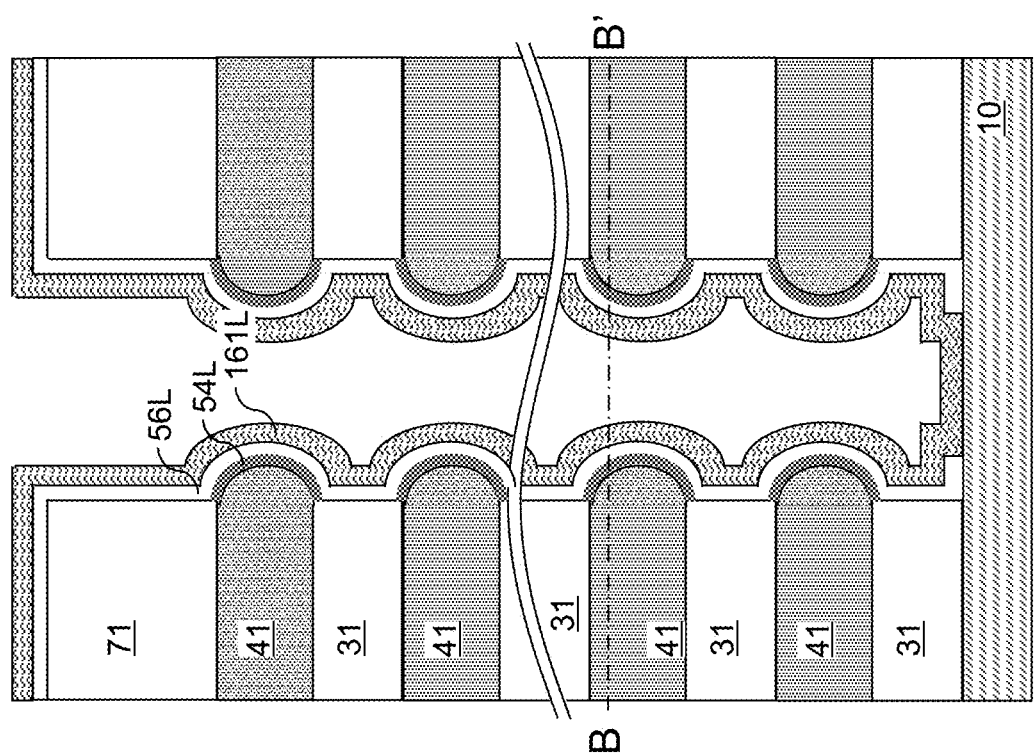
FIG. 22B
FIG. 22A

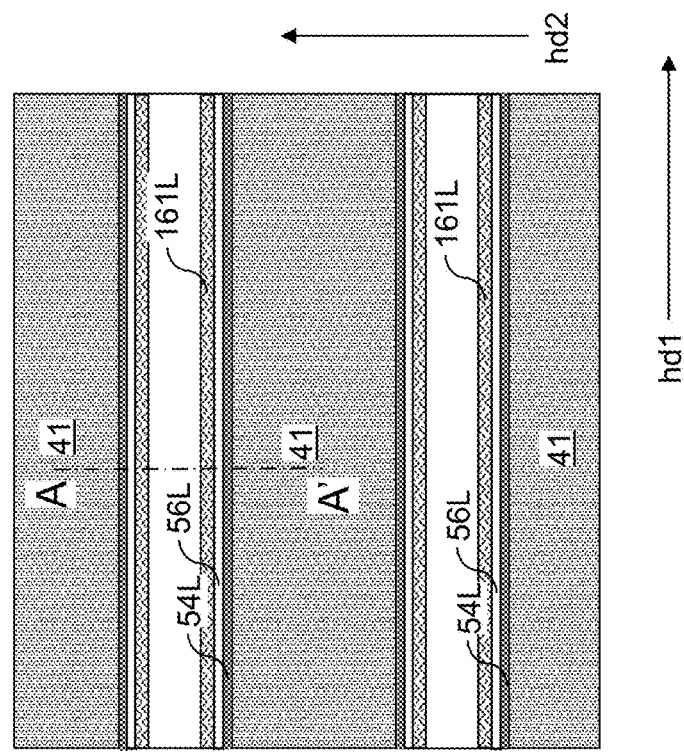
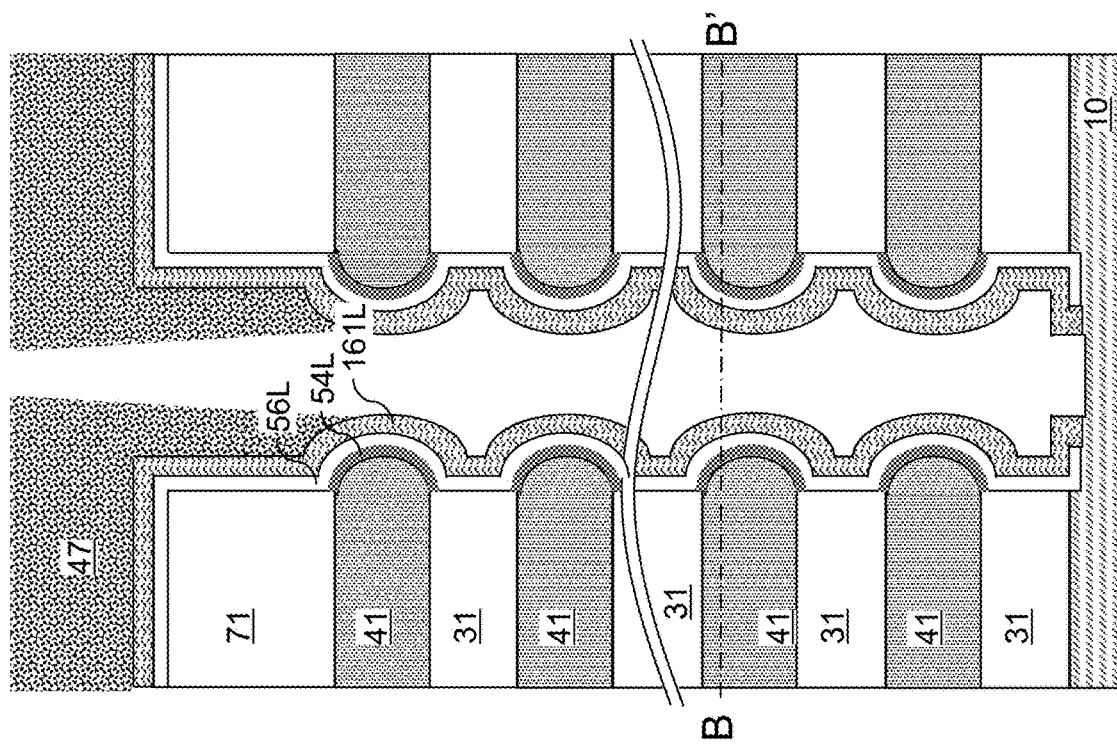
FIG. 23B
FIG. 23A

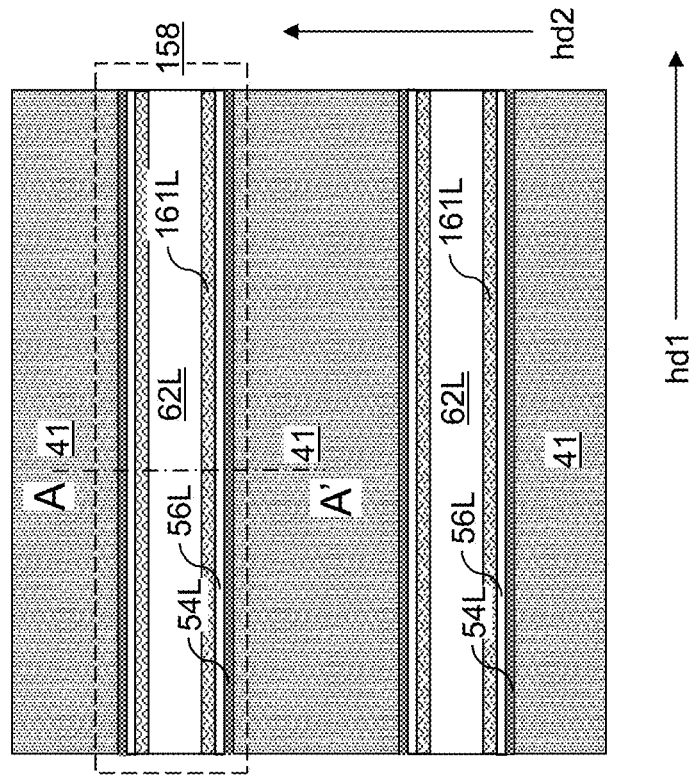
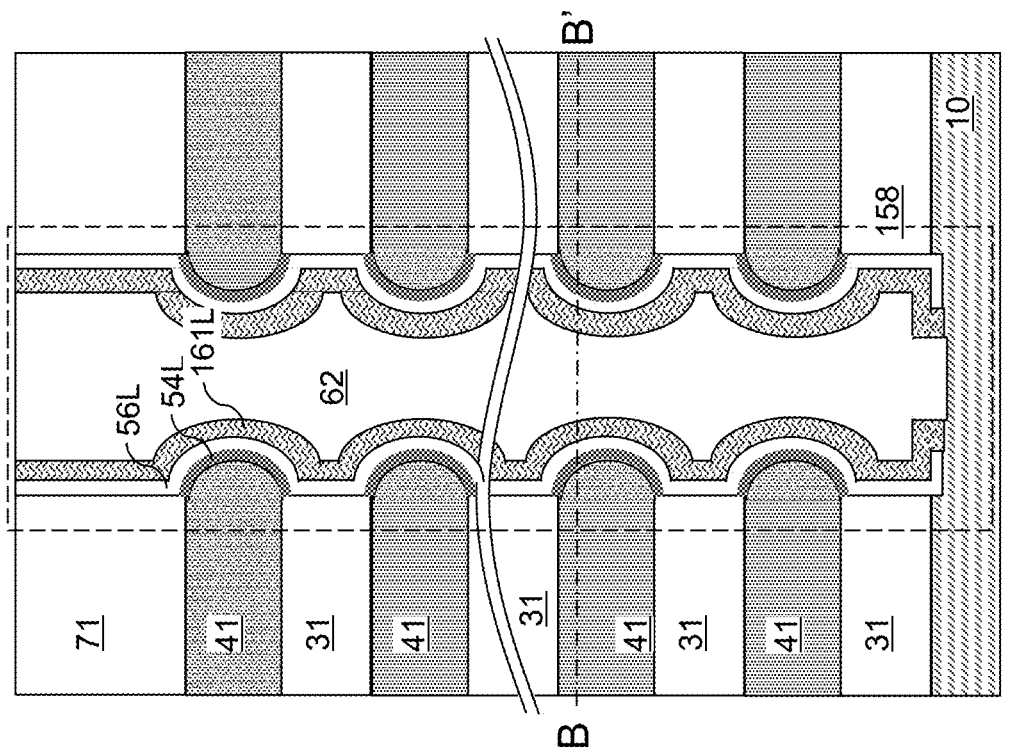
FIG. 25B
FIG. 25A

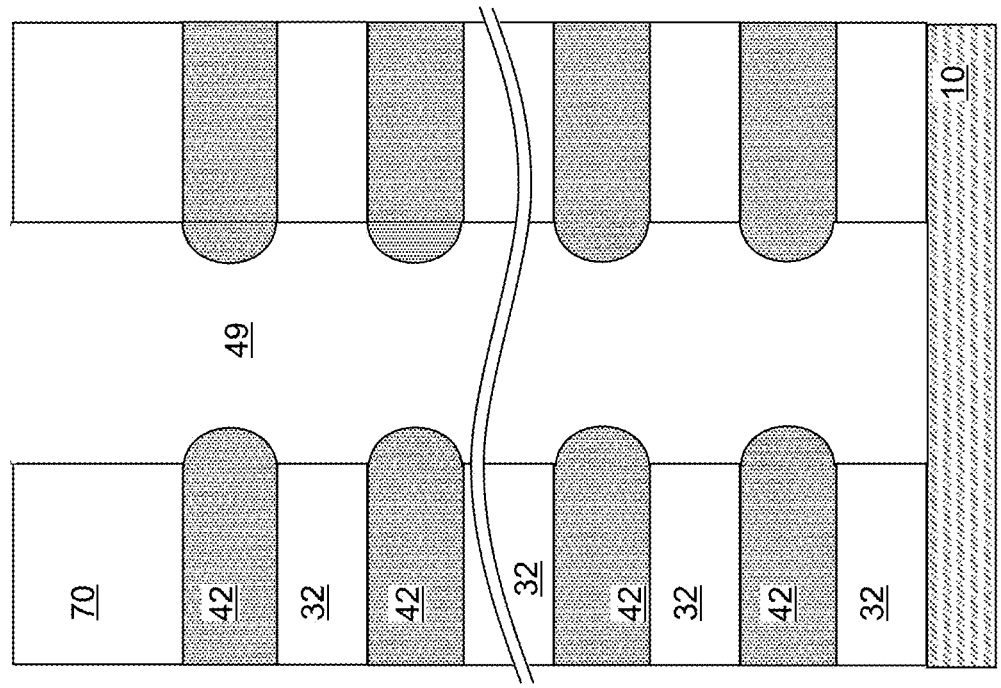
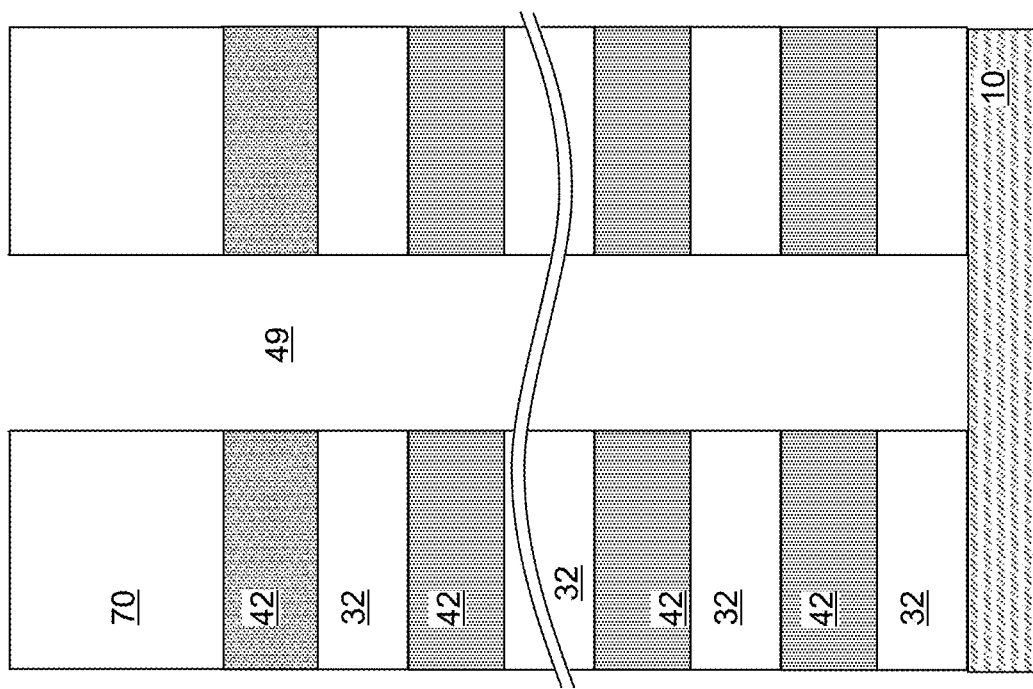

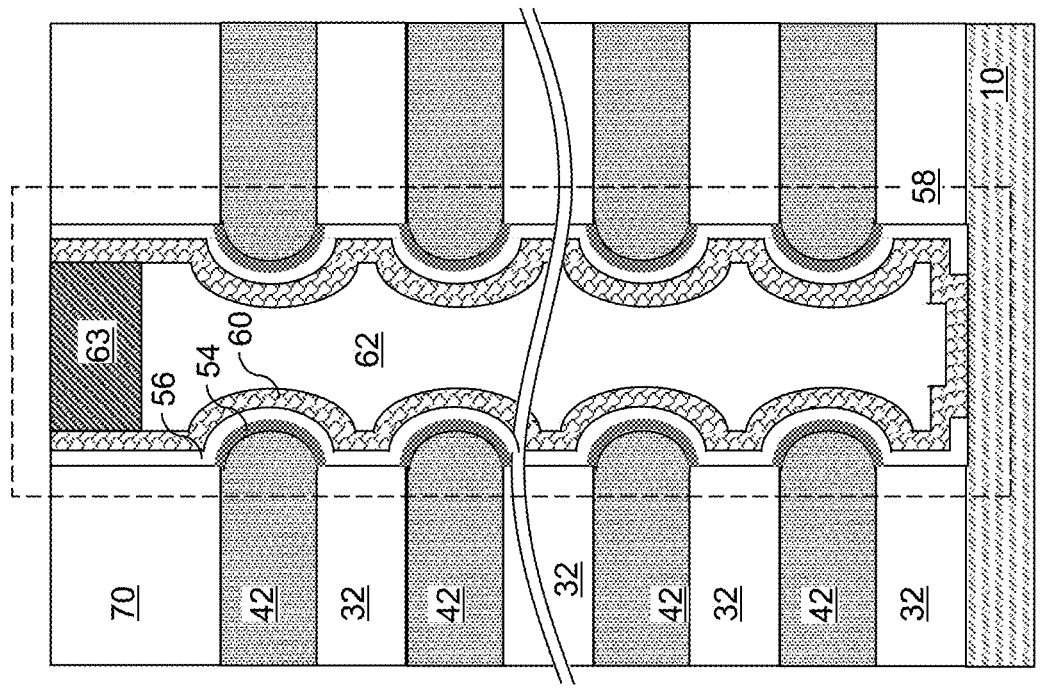
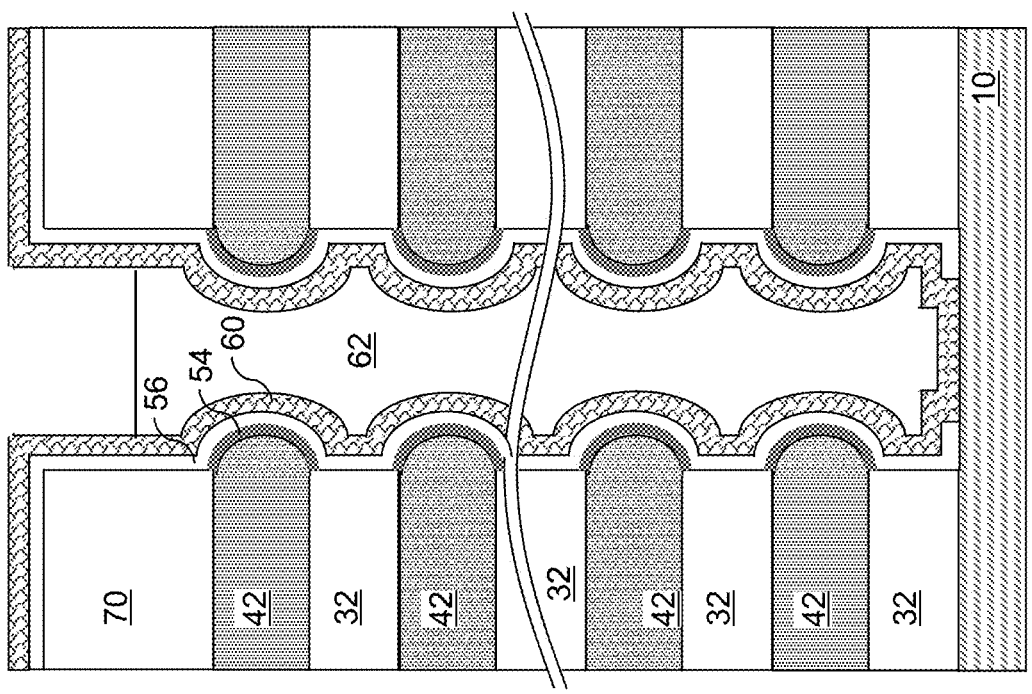

THREE-DIMENSIONAL MEMORY DEVICE INCLUDING FERROELECTRIC-METAL-INSULATOR MEMORY CELLS AND METHODS OF MAKING THE SAME

FIELD

The present disclosure relates generally to the field of semiconductor devices, and particular to a three-dimensional memory device including ferroelectric-metal-insulator memory cells and methods of making the same.

BACKGROUND

A configuration of a three-dimensional NAND memory device employs flat memory cells in which tunneling dielectrics have flat vertical surfaces. Such flat memory devices are described in an article by Hang-Ting Lue et al., titled "A 128 Gb (MLC)/192 Gb (TLC) Single-gate Vertical Channel (SGVC) Architecture 3D NAND using only 16 Layers with Robust Read Disturb, Long-Retention and Excellent Scaling Capability," IEDM Proceedings (2017) page 451.

SUMMARY

According to an aspect of the present disclosure, a three-dimensional memory device is provided, which comprises: alternating stacks of insulating strips and electrically conductive strips located over a substrate and laterally spaced apart from each other by line trenches laterally extending along a first horizontal direction and spaced apart from each other along a second horizontal direction; a two-dimensional array of memory stack assemblies located in the line trenches; and a two-dimensional array of dielectric pillar structures located in the line trenches and laterally offset from, and interlaced with, the two-dimensional array of memory stack assemblies, wherein each line trench is filled with a respective row of memory stack assemblies and a respective row of dielectric pillar structures that is interlaced with the respective row of memory stack assemblies, wherein: each memory stack assembly comprises a vertical semiconductor channel, at least one gate dielectric layer, and two vertical stacks of discrete intermediate metallic electrodes; each of the electrically conductive strips is laterally spaced from each memory stack assembly by a respective ferroelectric dielectric layer; and each of the discrete intermediate metallic electrodes has a greater contact area with the respective at least one gate dielectric layer than with the respective ferroelectric dielectric layer.

According to another aspect of the present disclosure, a method of forming a three-dimensional memory device is provided, which comprises: forming alternating stacks of insulating strips and sacrificial material strips over a substrate, wherein the alternating stacks are laterally spaced apart from each other by line trenches laterally extending along a first horizontal direction; forming metallic liners by selectively growing a metallic material on physically exposed surfaces of the sacrificial material strips in the line trenches; filling each of the line trenches with a respective line trench fill structure that includes a gate dielectric material layer, a semiconductor channel material layer, and a respective subset of the metallic liners; dividing the line trench fill structures into memory stack assemblies, wherein each of the memory stack assemblies comprises a vertical semiconductor channel, at least one gate dielectric layer, and two vertical stacks of discrete intermediate metallic electrodes, wherein the vertical semiconductor channel comprises a patterned portion of one of the semiconductor channel material layers, the at least one gate dielectric layer comprise patterned portions of one of the gate dielectric material layers, and the two vertical stacks of discrete intermediate metallic electrodes comprise patterned portions of the metallic liners; and replacing the sacrificial material strips with combinations of a ferroelectric dielectric layer and an electrically conductive layer, wherein the ferroelectric dielectric layer is deposited directly on a respective subset of the discrete intermediate metallic electrodes.

According to yet another aspect of the present disclosure, a three-dimensional memory device is provided, which comprises: an alternating stack of insulating layers and electrically conductive layers located over a substrate; a memory opening vertically extending through the alternating stack; and a memory opening fill structure located in the memory opening and comprising a vertical stack of discrete intermediate metallic electrodes, a gate dielectric layer, and a vertical semiconductor channel, wherein each of the electrically conductive layers is laterally spaced from the memory opening fill structure by a respective ferroelectric dielectric layer; and each of the discrete intermediate metallic electrodes has a greater contact area with the gate dielectric layer than with the respective ferroelectric dielectric layer.

According to still another aspect of the present disclosure, a method of forming a three-dimensional memory device is provided, which comprises: forming an alternating stack of insulating layers and sacrificial material layers; forming a memory opening extending through the alternating stack; forming a vertical stack of discrete intermediate metallic electrodes on sidewalls of the sacrificial material layers around the memory opening; forming a gate dielectric layer and a vertical semiconductor channel over the vertical stack of discrete intermediate metallic electrodes; forming backside recesses by removing the sacrificial material layers selective to the insulating layers; and forming a combination of a ferroelectric dielectric layer and an electrically conductive layer within each of the backside recesses, wherein the electrically conductive layer is laterally spaced from a respective one of the discrete intermediate metallic electrodes by the ferroelectric dielectric layer.

BRIEF DESCRIPTION OF THE DRAWINGS

FIG. 5A is a vertical cross-sectional view of a line trench in the first exemplary structure of FIGS. 4A and 4B.

FIG. 5B is a horizontal cross-sectional view along the plane B-B' of the structure of FIG. 5A. The vertical plane A-A' corresponds to the plane of the vertical cross-sectional view of FIG. 5A.

FIG. 6A is a vertical cross-sectional view of a line trench in the first exemplary structure after laterally recessing the insulating strips and formation of convex sidewalls of the sacrificial material strips according to the first embodiment of the present disclosure.

FIG. 6B is a horizontal cross-sectional view along the plane B-B' of FIG. 6A. The vertical plane A-A' corresponds to the plane of the vertical cross-sectional view of FIG. 6A.

FIG. 7A is a vertical cross-sectional view of a line trench in the first exemplary structure after formation of metallic liners according to the first embodiment of the present disclosure.

FIG. 7B is a horizontal cross-sectional view along the plane B-B' of FIG. 7A. The vertical plane A-A' corresponds to the plane of the vertical cross-sectional view of FIG. 7A.

FIG. 8A is a vertical cross-sectional view of a line trench in the first exemplary structure after formation of a gate dielectric material layer according to the first embodiment of the present disclosure.

FIG. 8B is a horizontal cross-sectional view along the plane B-B' of FIG. 8A. The vertical plane A-A' corresponds to the plane of the vertical cross-sectional view of FIG. 8A.

FIG. 10A is a vertical cross-sectional view of a line trench in the first exemplary structure after formation of a semiconductor channel material layer and a continuous dielectric fill material layer according to the first embodiment of the present disclosure.

FIG. 10B is a horizontal cross-sectional view along the plane B-B' of FIG. 10A. The vertical plane A-A' is the plane of the cross-section for FIG. 10A.

FIG. 11A is a vertical cross-sectional view of a line trench in the first exemplary structure after formation of dielectric core rails and a drain material layer according to the first embodiment of the present disclosure.

FIG. 11B is a horizontal cross-sectional view along the plane B-B' of 11A. The vertical plane A-A' is the plane of the cross-section for FIG. 11A.

FIG. 20A is a vertical cross-sectional view of an alternative configuration of the first exemplary structure after formation of a gate dielectric material layer according to the first embodiment of the present disclosure.

FIG. 20B is a horizontal cross-sectional view along the horizontal plane B-B' of FIG. 20A. The vertical plane A-A' is the plane of the cross-section for FIG. 20A.

FIG. 21A is a vertical cross-sectional view of a line trench in the alternative configuration of the first exemplary structure after formation of an opening through the gate dielectric material layer at the bottom of each line trench according to the first embodiment of the present disclosure.

FIG. 21B is a horizontal cross-sectional view along the plane B-B' of FIG. 21A. The vertical plane A-A' corresponds to the plane of the vertical cross-sectional view of FIG. 21A.

FIG. 22A is a vertical cross-sectional view of a line trench in the alternative configuration of the first exemplary structure after formation of a sacrificial channel material layer according to the first embodiment of the present disclosure.

FIG. 22B is a horizontal cross-sectional view along the plane B-B' of FIG. 22A. The vertical plane A-A' is the plane of the cross-section for FIG. 22A.

FIG. 23A is a vertical cross-sectional view of a line trench in the alternative configuration of the first exemplary structure after formation of an opening through the sacrificial channel material layer at the bottom of each line trench according to the first embodiment of the present disclosure.

FIG. 23B is a horizontal cross-sectional view along the plane B-B' of FIG. 23A. The vertical plane A-A' is the plane of the cross-section for FIG. 23A.

FIG. 25A is a vertical cross-sectional view of a line trench in the alternative embodiment of the first exemplary structure after formation of line trench fill structures according to the first embodiment of the present disclosure.

FIG. 25B is a horizontal cross-sectional view along the plane B-B' of 25A. The vertical plane A-A' is the plane of the cross-section for FIG. 25A.

FIGS. 34A-34H are sequential schematic vertical cross-sectional views of a memory opening within the second exemplary structure during formation of a memory opening fill structure therein according to the second embodiment of the present disclosure.

DETAILED DESCRIPTION

Figure 1:
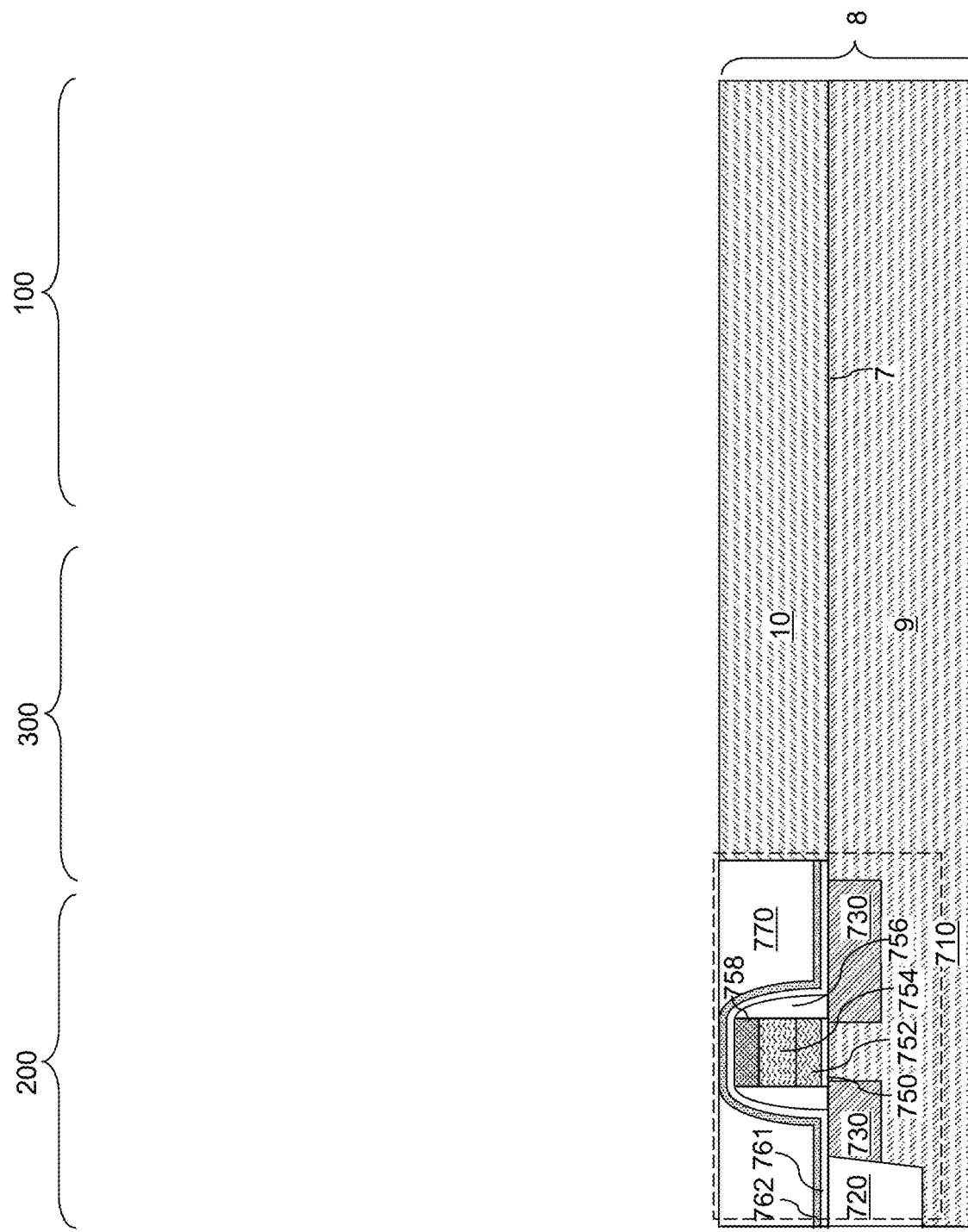
FIG. 1 is a schematic vertical cross-sectional view of a first exemplary structure after formation of at least one peripheral device and a semiconductor material layer according to a first embodiment of the present disclosure.

As discussed above, the present disclosure is directed to a three-dimensional memory device including ferroelectric-metal-insulator memory cells and methods of making the same, the various aspects of which are discussed herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many number of external commands as the total number of planes therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming. A page is also the smallest unit that can be selected to a read operation.

Referring to FIG. 1, a first exemplary structure according to the first embodiment of the present disclosure is illustrated, which can be employed, for example, to fabricate a device structure containing vertical NAND memory devices. The first exemplary structure includes a substrate, which can be a semiconductor substrate. The substrate includes at least one substrate semiconductor layer, which can include, for example, a lower substrate semiconductor layer 9 and an upper substrate semiconductor layer 10. The lower substrate semiconductor layer 9 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the lower substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1 \times 10^{-6}$ S/cm to $1 \times 10^{5}$ S/cm. As used herein, a "semiconductor material" refers to a material having electrical conductivity in the range from $1 \times 10^{-6}$ S/cm to $1 \times 10^{5}$ S/cm in the absence of electrical dopants therein, and is capable of producing a doped material having electrical conductivity in a range from 1 S/cm to $1 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1 \times 10^{5}$ S/cm. As used herein, an "insulator material" or a "dielectric material" refers to a material having electrical conductivity less than $1 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1 \times 10^{-6}$ S/cm to $1 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 710 for a peripheral circuitry can be formed on a portion of the lower substrate semiconductor layer 9. The at least one semiconductor device can include, for example, field effect transistors. For example, at least one shallow trench isolation structure 720 can be formed by etching portions of the lower substrate semiconductor layer 9 and depositing a dielectric material therein. A gate dielectric layer, at least one gate conductor layer, and a gate cap dielectric layer can be formed over the lower substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the lower substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the lower substrate semiconductor layer 9. As used herein, a surface is "physically exposed" if the surface is in physical contact with vacuum, or a gas phase material (such as air). The upper substrate semiconductor layer 10, if present, can be formed on the top surface of the lower substrate semiconductor layer 9 prior to, or after, formation of the at least one semiconductor device 710 by deposition of a single crystalline semiconductor material, for example, by selective epitaxy. The deposited semiconductor material can be the same as, or can be different from, the semiconductor material of the lower substrate semiconductor layer 9. The deposited semiconductor material can be any material that can be employed for the lower substrate semiconductor layer 9 as described above. The single crystalline semiconductor material of the upper substrate semiconductor layer 10 can be in epitaxial alignment with the single crystalline structure of the lower substrate semiconductor layer 9. Portions of the deposited semiconductor material located above the top surface of the planarization dielectric layer 770 can be removed, for example, by chemical mechanical planarization (CMP). In this case, the upper substrate semiconductor layer 10 can have a top surface that is coplanar with the top surface of the planarization dielectric layer 770. In one embodiment, the upper substrate semiconductor layer 10 can have a doping of a first conductivity type.

The region (i.e., area) of the at least one semiconductor device 710 is herein referred to as a peripheral device region 200. The region in which a memory array is subsequently formed is herein referred to as a memory array region 100. A staircase region 300 for subsequently forming stepped terraces of electrically conductive strips can be provided between the memory array region 100 and the peripheral device region 200.

Figure 2:
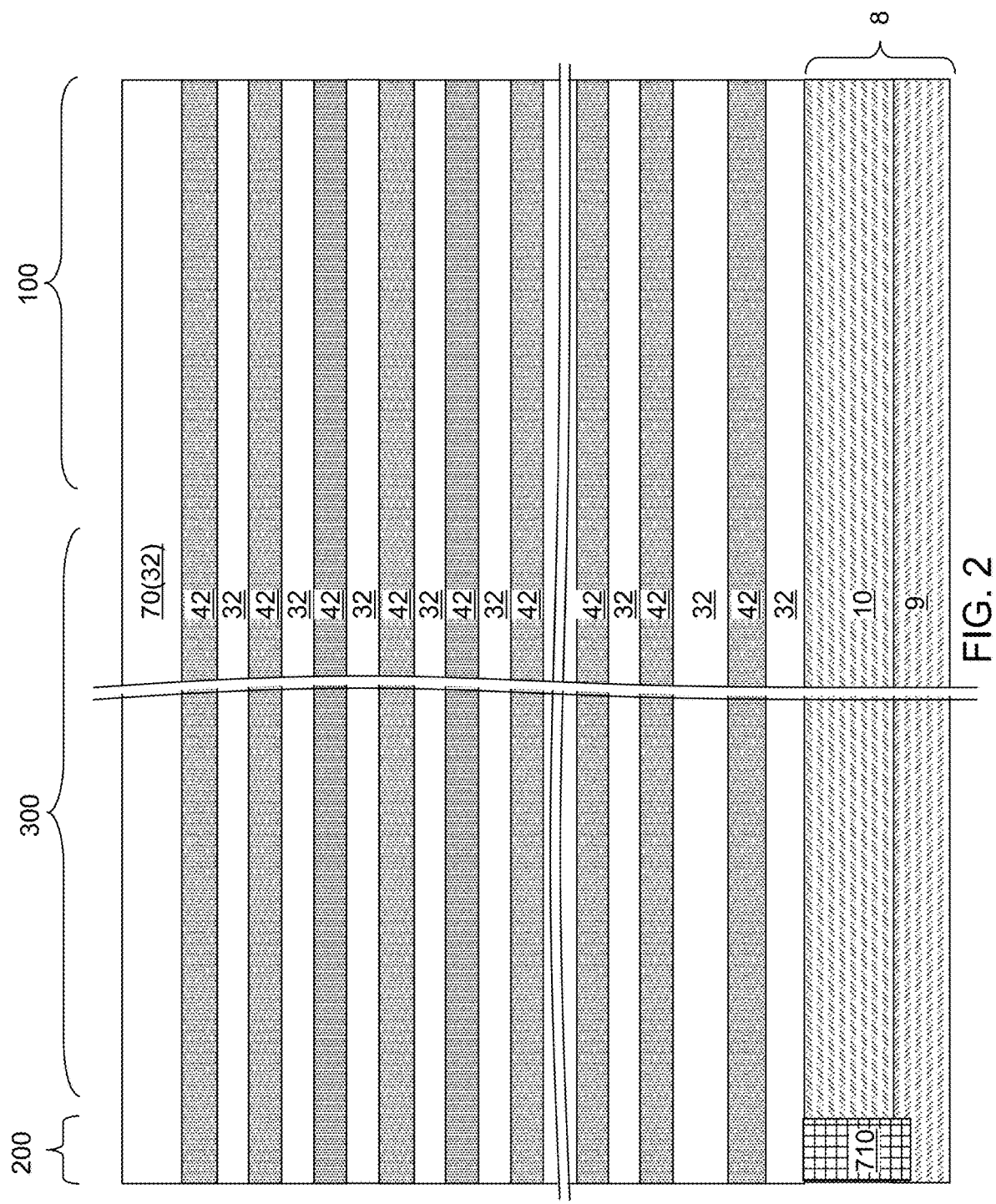
FIG. 2 is a schematic vertical cross-sectional view of the first exemplary structure after formation of a vertically alternating sequence of insulating layers and spacer material layers according to the first embodiment of the present disclosure.

Referring to FIG. 2, a vertically alternating sequence of first material layers (such as insulating layers 32) and second material layers (such as sacrificial material layers 42) is formed over the substrate 8. As used herein, a "vertically alternating sequence" refers to an alternating sequence of multiple instances of a first element and multiple instances of a second element that alternate vertically such that an instance of the second element overlies and/or underlies each instance of the first element, and an instance of the first element overlies and/or underlies each instance of the second element. The vertically alternating sequence can include a stack of an alternating plurality of first material layers (which can be insulating layers 32) and second material layers (which can be sacrificial material layer 42). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. Thus, a vertically alternating sequence of first elements and second elements is an alternating plurality of the first elements and the second elements in which the alternating of the first elements and second elements occurs along the vertical direction. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

In one embodiment, the vertically alternating sequence (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by plasma enhanced chemical vapor deposition (PECVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD) or plasma enhanced atomic layer deposition (PEALD).

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the vertically alternating sequence (32, 42) can have a uniform thickness that is substantially invariant within each respective sacrificial material layer 42. The topmost layer among the insulating layers 32 is herein referred to as a topmost insulating layer 70. The topmost insulating layer 70 can have a greater thickness than each of the insulating layers 32.

Figure 3:
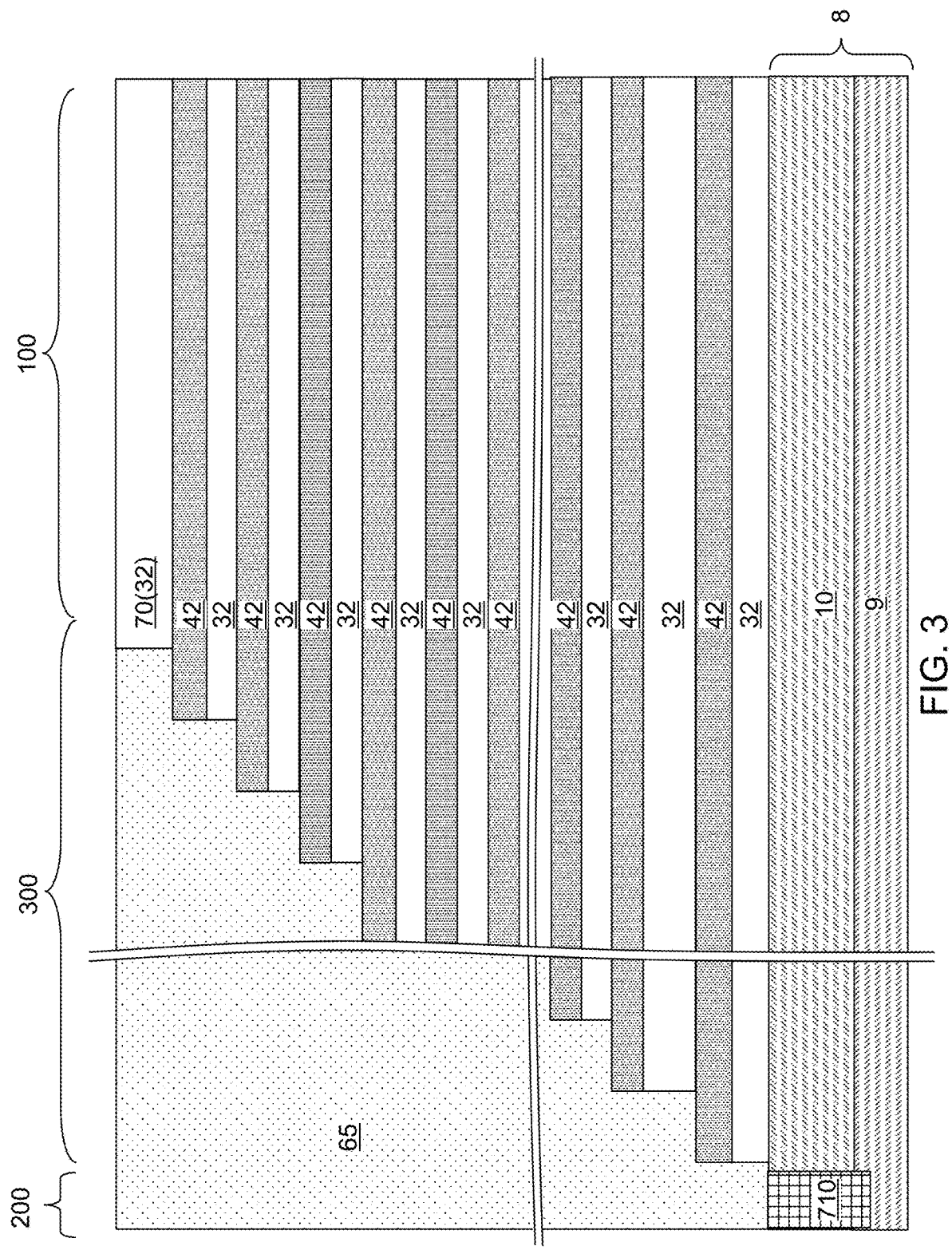
FIG. 3 is a schematic vertical cross-sectional view of the first exemplary structure after formation of stepped terraces and a retro-stepped dielectric material portion according to the first embodiment of the present disclosure.
Figure 4A:
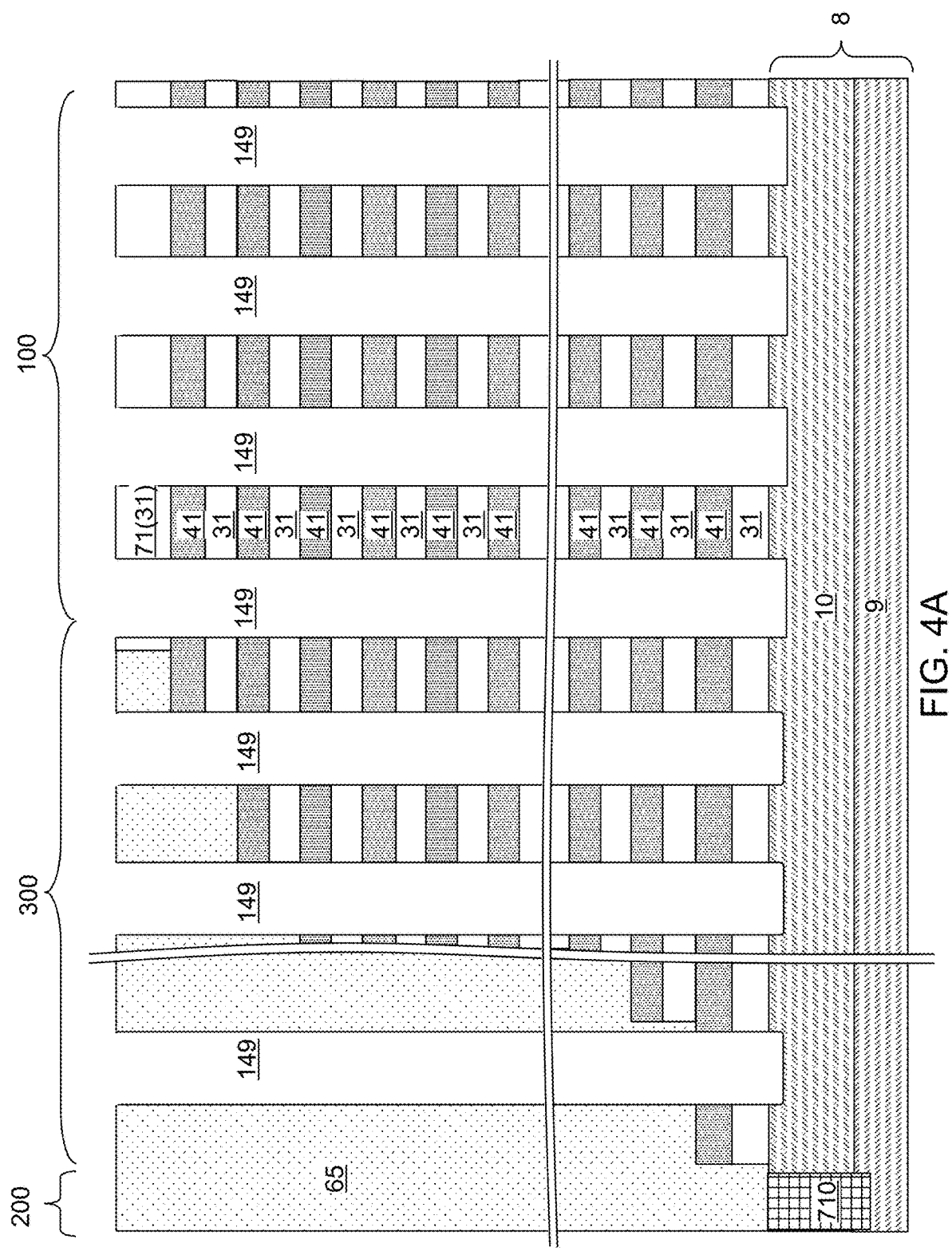
FIG. 4A is a schematic vertical cross-sectional view of the first exemplary structure after formation of line trenches according to the first embodiment of the present disclosure.
Figure 4B:
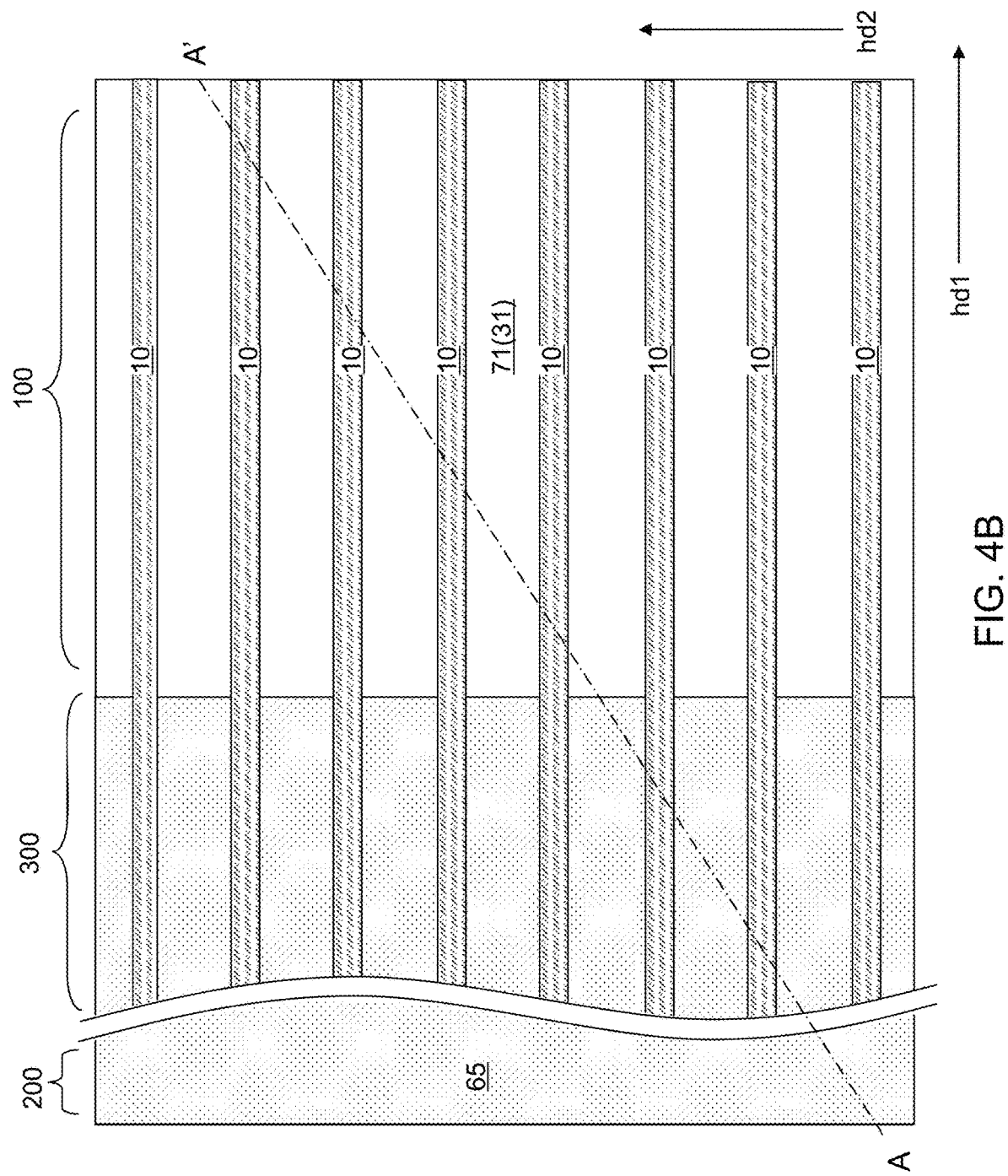
FIG. 4B is a top-down view of the first exemplary structure of FIG. 4A. The vertical plane A-A' is the plane of the cross-section for FIG. 4A.

Referring to FIG. 3, the vertically alternating sequence of the insulating layers 32 and the sacrificial material layers 42 can be patterned to form stepped surfaces that continuously extend from a bottommost layer of the vertically alternating sequence (32, 42) to a topmost layer of the alternating sequence (32, 42) in the staircase region 300. A stepped cavity can be formed within the staircase region 300 which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate 8. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Stepped surfaces are formed at a peripheral portion of the vertically alternating sequence (32, 42) through formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the vertically alternating sequence (32, 42). Each sacrificial material layer 42 other than a topmost sacrificial material layer 42 within the vertically alternating sequence (32, 42) laterally extends farther than any overlying sacrificial material layer 42 within the vertically alternating sequence (32, 42). The terrace region includes stepped surfaces of the vertically alternating sequence (32, 42) that continuously extend from a bottommost layer within the vertically alternating sequence (32, 42) to a topmost layer within the vertically alternating sequence (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost insulating layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Referring to FIGS. 4A, 4B, 5A, and 5B, a lithographic material stack (not shown) including at least a photoresist layer can be formed over the topmost insulating layer 70 and the retro-stepped dielectric material portion 65, and can be lithographically patterned to form line-shaped openings therein. The line-shaped openings laterally extend along a first horizontal direction hd1, and have a uniform width along a second horizontal direction hd2 that is perpendicular to the first horizontal direction hd1. The pattern in the lithographic material stack can be transferred through the topmost insulating layer 70 or the retro-stepped dielectric material portion 65, and through the vertically alternating sequence (32, 42) by at least one anisotropic etch that employs the patterned lithographic material stack as an etch mask. Portions of the vertically alternating sequence (32, 42) underlying the line-shaped openings in the patterned lithographic material stack are etched to form line trenches 149. As used herein, a "line trench" refers to a trench that has laterally extends straight along a horizontal direction.

The line trenches 149 laterally extend along the first horizontal direction hd1 through the vertically alternating sequence (32, 42). In one embodiment, the line trenches 149 have a respective uniform width that is invariant under translation along the first horizontal direction hd1. In one embodiment, the line trenches 149 can have the same width throughout, and the spacing between neighboring pairs of the line trenches 149 can be the same. In this case, the line trenches 149 can constitute a one-dimensional periodic array of line trenches 149 having a pitch along a second horizontal direction hd2 that is perpendicular to the first horizontal direction hd1. The width of the line trenches 149 along the second horizontal direction hd2 can be in a range from 30 nm to 500 nm, such as from 60 nm to 250 nm, although lesser and greater widths can also be employed.

The line trenches 149 extend through each layer of the vertically alternating sequence (32, 42) and the retro-stepped dielectric material portion 65. The chemistry of the anisotropic etch process employed to etch through the materials of the vertically alternating sequence (32, 42) can alternate to optimize etching of the first and second materials in the vertically alternating sequence (32, 42). The anisotropic etch can be, for example, a series of reactive ion etches. The sidewalls of the line trenches 149 can be substantially vertical, or can be tapered. The patterned lithographic material stack can be subsequently removed, for example, by ashing.

The line trenches 149 laterally extend through the entire memory array region 100, and laterally extend into the staircase region 300. The line trenches 149 may laterally extend through the entire staircase region 300 along the first horizontal direction hd1, or may laterally extend only through part of a width, but not the entire width along the first horizontal direction hd1, of the staircase region 300. In one embodiment, an over-etch into the upper substrate semiconductor layer 10 may be optionally performed after the top surface of the upper substrate semiconductor layer 10 is physically exposed at a bottom of each line trench 149. The overetch may be performed prior to, or after, removal of the lithographic material stack. In other words, the recessed surfaces of the upper substrate semiconductor layer 10 may be vertically offset from the un-recessed top surfaces of the upper substrate semiconductor layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the line trenches 149 can be coplanar with the topmost surface of the upper substrate semiconductor layer 10. Optionally, an etch stop layer may be employed (not shown) between the alternating stack (32, 42) and the substrate 8.

Each of the line trenches 149 may include a sidewall (or a plurality of sidewalls) that extends substantially perpendicular to the topmost surface of the substrate. The lower substrate semiconductor layer 9 and the upper substrate semiconductor layer 10 collectively constitute a substrate 8, which can be a semiconductor substrate. Alternatively, the upper substrate semiconductor layer 10 may be omitted, and the line trenches 149 can be extend to a top surface of the lower substrate semiconductor layer 9.

The line trenches 149 divide the vertically alternating sequence (32, 42) of insulating layers 32 and sacrificial material layers 42 into alternating stacks of insulating strips 31 and sacrificial material strips 41. The topmost insulating layer 70 can be divided into topmost insulating strips 71, each of which is an insulating strip 31. Each insulating strip 31 is a patterned portion of a respective insulating layer 32, and each sacrificial material strip 41 is a patterned portion of a respective sacrificial material layer 42. Each insulating strip 31 and each sacrificial material strip 41 laterally extend along the first horizontal direction hd1, and can have a uniform thickness along the second horizontal direction hd2. Alternating stacks (31, 41) of insulating strips 31 and sacrificial material strips 41 can be formed over the substrate 8. The alternating stacks (31, 41) can be laterally spaced apart from each other by line trenches 149 that laterally extend along the first horizontal direction hd1 and are spaced apart from each other along the second horizontal direction hd2.

In one embodiment, the line trenches 149 can laterally extend from an interface between the illustrated retro-stepped dielectric material portion 65 and the substrate 8 to an interface between another retro-stepped dielectric material portion (not illustrated) and the substrate 8 located on an opposite side of the illustrated retro-stepped dielectric material portion 65. In this case, each alternating stack (31, 41) of insulating strips 31 and sacrificial material strips 41 is not connected to any neighboring alternating stack (31, 41). Alternatively, the line trenches 149 may laterally extend partly through the stepped surfaces of the vertically alternating sequence (32, 42) of insulating layers 32 and sacrificial material layers 42. In this case, insulating strips 31 and/or sacrificial material strips 41 located at upper levels can be disconnected from each other.

Referring to FIGS. 6A and 6B, at least one isotropic etch process etches is performed to laterally recess the insulating strips 31 relative to the sacrificial material strips 41. The at least one isotropic etch process etches the material of the insulating strips 31 at a higher etch rate than a material of the sacrificial material strips 41. According to an aspect of the present disclosure, the at least one isotropic etch process can form convex sidewalls on the sacrificial material strips 41 by collaterally etching the material of the sacrificial material strips 41 while laterally recessing the insulating strips 31. For example, if the insulating layers 32 include silicon oxide and if the sacrificial material layers 42 include silicon nitride, a wet etch process employing an organic HF-containing etchant (i.e., hydrofluoric acid and an organic additive) that enables collateral etching of silicon nitride. The amount of the organic additive is selected such that the selectivity of the etchant between silicon oxide and silicon nitride can be in a range from 1.1 to 10, such as from 2 to 6. In other words, the etch rate for silicon oxide can be greater than the etch rate for silicon nitride by a factor in a range from 1.1 to 10. Organic HF-containing etchants include, for example, a mixture of hydrofluoric acid and a polyol (such as ethylene glycol, propylene glycol, or a glycerol). Additional polyols that can be employed in the organic HF-containing etchant include carboxylic acid polyols such as glyceric acid (2,3-dihydroxypropanoic acid), 2,3-dihydroxybutanoic acid, or 3,4-dihydroxy-butanoic acid. The amount of the organic additive can be selected to provide a suitable etch rate ratio between silicon oxide and silicon nitride. In one embodiment, the at least one isotropic etch process may include a plurality of isotropic etch process providing different etch ratios between silicon oxide and silicon nitride. For example, a first isotropic etch process having a low etch rate ratio (for example, 1.5) between silicon oxide and silicon nitride can be performed to laterally recess sidewalls of the sacrificial material layers with a vertical center segment, a tapered upper segment, and a tapered lower segment. A second isotropic etch process having a medium etch rate ratio (for example, 2) can be subsequently performed to increase the taper angle at the top end and at the bottom end of each recessed sidewall of the sacrificial material strips 41. A third isotropic etch process having a high etch rate ratio (for example, 4) can be subsequently performed to increase the taper angle at the top end and at the bottom end of each recessed sidewall of the sacrificial material strips 41. The resulting vertical cross-sectional profile of the sidewalls of the sacrificial material strips 41 can be convex. The resulting vertical cross-sectional profile of the sidewalls of the insulating strips 31 can be vertical. The convex sidewalls of the sacrificial material strips 41 protrude inward laterally in each of the line trenches 149 after the at least one isotropic etch process.

Referring to FIGS. 7A and 7B, a selective metal deposition process can be performed to selectively grow metal from the physically exposed surfaces of the sacrificial material strips 41 without growth of the metal from the physically exposed surfaces of the insulating strips 31. A metal-containing precursor gas that induces nucleation of the metal on the physically exposed surfaces of sacrificial material strips 41 without inducing nucleation of the metal on the physically exposed surfaces of the insulating strips 31. Generally, any selective metal deposition process can be employed which can selectively deposit a metal on the physically exposed surfaces of the sacrificial material strips 41 while suppressing deposition of the metal on the surfaces of the insulating strips 31. The metal can consist essentially of at least one transition metal element (such as a single transition metal element) that is selected from iridium, ruthenium, palladium, osmium, rhenium, molybdenum, cobalt or tungsten. For example, ruthenium may be selectively deposited by metal organic atomic layer deposition (MOALD). In an illustrative example, the insulating strips 31 can include silicon oxide and the sacrificial material strips 41 can include silicon nitride, and the metal-containing precursor gas can include ruthenium tetroxide ($RuO_4$). In this case, atomic layer deposition process including an alternating sequence of a precursor adsorption step (i.e., a ruthenium tetroxide adsorption step) and a reduction step can be employed. An atomic layer of ruthenium tetroxide can be adsorbed on silicon nitride surfaces or on surfaces of previously deposited ruthenium in each precursor adsorption step. The atomic layer of ruthenium tetroxide can be reduced to ruthenium in each reduction step. Alternatively, to selectively deposit tungsten, silicon may be selectively deposited first and then converted to tungsten.

Discrete, vertically separated metallic liners 54L are formed by selectively growing a metallic material on physically exposed surfaces of the sacrificial material strips 41 in the line trenches 149. Two vertical stacks of metallic liners 54L can be formed within each line trench 149. Each metallic liner 54L can include, and/or can consist essentially of, an elemental metal. The metallic material can consist essentially of at least one transition metal element (such as a single transition metal element) that is selected from iridium, ruthenium, palladium, osmium, rhenium, molybdenum, cobalt or tungsten. In one embodiment, the elemental metal can be ruthenium. The metallic liners 54L are formed directly on the convex sidewalls of the sacrificial material strips 41. Each metallic liner 54L comprises an outer concave sidewall in contact with a respective one of the sacrificial material strips 41, and an inner convex sidewall that is physically exposed. Each metallic liner 54L can comprise an upper vertical sidewall 54A connecting an upper periphery of the inner convex sidewall and an upper periphery of the outer concave sidewall, and a lower vertical sidewall 54B connecting a lower periphery of the inner convex sidewall and a lower periphery of the outer concave sidewall. The upper vertical sidewall 54A can contact a portion of a sidewall of an insulating strip 31, and the lower vertical sidewall 54B can contact a portion of a sidewall of another insulating strip 31. The thickness of the metallic liner 54L can be uniform throughout, and can be in a range from 2 nm to 20 nm, such as from 3 nm to 12 nm, although lesser and greater thicknesses can also be employed.

Referring to FIGS. 8A and 8B, a gate dielectric material layer 56L can be formed by conformal deposition of a non-ferroelectric gate dielectric material. The gate dielectric material layer 56L can include silicon oxide, a dielectric metal oxide (such as aluminum oxide), or a combination thereof. The thickness of the gate dielectric material layer 56L can be in a range from 1 nm to 12 nm, such as from 2 nm to 6 nm, although lesser and greater thicknesses can also be employed.

Figure 9B:
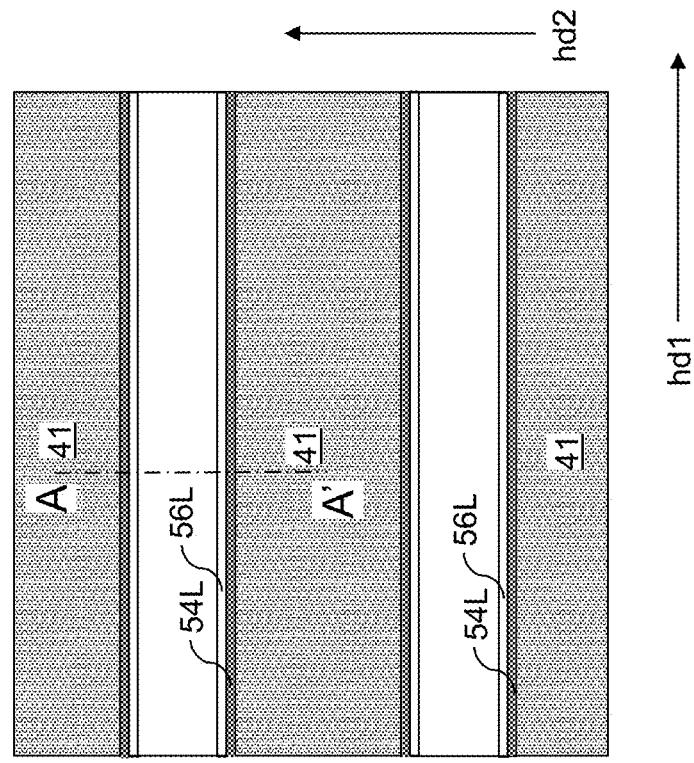
FIG. 9B is a horizontal cross-sectional view along the plane B-B' of FIG. 9A. The vertical plane A-A' corresponds to the plane of the vertical cross-sectional view of FIG. 9A.
Figure 9A:
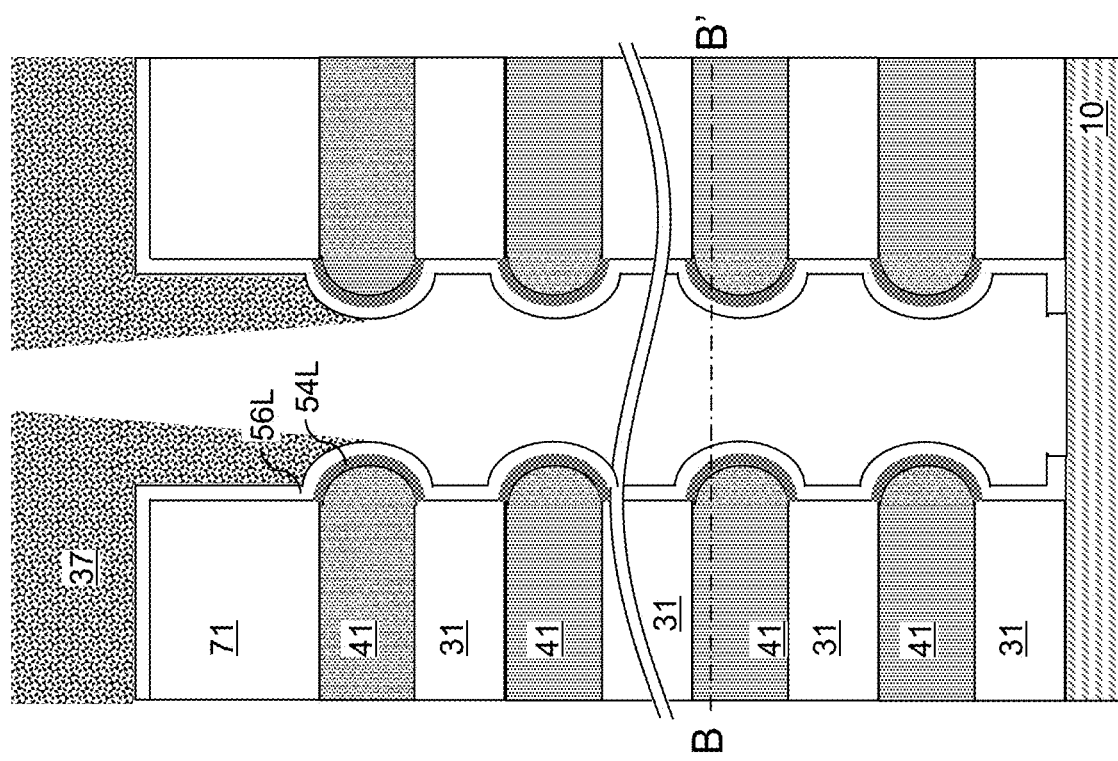
FIG. 9A is a vertical cross-sectional view of a line trench in the first exemplary structure after formation of an opening through the gate dielectric material layer at the bottom of each line trench according to the first embodiment of the present disclosure.

Referring to FIGS. 9A and 9B, an opening is formed through the gate dielectric material layer 56L at the bottom of each line trench 149. For example, a patterning film 37 can be anisotropically deposited to over the top surface of the topmost insulating strips 71 and over the topmost one of the laterally protruding portions of the gate dielectric material layer 56L. The patterning film 37 can include an amorphous carbon-based etch resistant material such as Advanced Patterning Film™ provided by Applied Materials, Inc™. An anisotropic etch process can be performed to etch through a horizontal portion of the gate dielectric material layer 56L at the bottom of each line trench 149. A top surface of the substrate 8, such as a top surface of the upper substrate semiconductor layer 10, can be physically exposed within each opening in the gate dielectric material layer 56L at the bottom of each line trench 149. The patterning film 37 can be subsequently removed, for example, by ashing. Alternatively, a sacrificial cover material layer can be conformally deposited in lieu of the patterning film 37, and may be employed as a protective material layer during formation of the opening in the gate dielectric material layer 56L at the bottom of each line trench 149. The sacrificial cover material layer may include amorphous carbon or any other sacrificial material that can be removed selective to the material of the gate dielectric material layer 56L, and can be removed after formation of the opening in the gate dielectric material layer 56L, for example, by ashing.

Referring to FIGS. 10A and 10B, a semiconductor channel material layer 60L can be deposited over the gate dielectric material layer 56L by a conformal deposition process. The semiconductor channel material layer 60L can extend through the openings in the gate dielectric material layer 56L, and can directly contact physically exposed top surfaces of the upper substrate semiconductor layer 10. The semiconductor channel material layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L includes amorphous silicon or polysilicon. The semiconductor channel material layer 60L can be formed by a conformal deposition method such as low pressure chemical vapor deposition (LPCVD). In one embodiment, the semiconductor channel material layer 60L can be formed by conformally depositing a conformal polycrystalline semiconductor material layer over the gate dielectric material layer 56L. The thickness of the semiconductor channel material layer 60L can be in a range from 2 nm to 20 nm, such as from 3 nm to 10 nm, although lesser and greater thicknesses can also be employed. In one embodiment, the semiconductor channel material layer 60L can have a doping of the first conductivity type, which is the same conductivity type as the conductivity type of the doping of the upper substrate semiconductor layer 10. In one embodiment, the semiconductor channel material layer 60L can comprise a semiconducting material including electrical dopants at an atomic concentration in a range from $1 \times 10^{14}/cm^3$ to $1 \times 10^{18}/cm^3$.

A continuous dielectric fill material layer 62L including a dielectric fill material such as silicate glass can be deposited in remaining volumes of the line trenches 149 by a conformal deposition process (such as low pressure chemical vapor deposition) or a self-planarizing deposition process (such as spin coating). The continuous dielectric fill material layer 62L fills the remaining volumes of the line trenches 149, and is deposited over horizontal portions of the semiconductor channel material layer 60L that overlie the topmost insulating strips 71.

Referring to FIGS. 11A and 11B, the continuous dielectric fill material layer 62L can be vertically recessed to form dielectric core rails 62R. Each dielectric core rail 62R is a patterned remaining portion of the continuous dielectric fill material layer 62L, and can have a top surface below the horizontal plane including the top surface of the topmost insulating strips 71. As used herein, a "rail" or a "rail structure" refers to an elongated structure that laterally extends along a horizontal direction (which is a "lengthwise" direction). Generally, each dielectric core rail 62R can be formed by deposition and vertical recessing of a dielectric fill material in the line trenches 149.

A drain material layer 63L can be formed by depositing a doped semiconductor material having a doping of a second conductivity type. The second conductivity type is the opposite of the first conductivity type. For example, if the first conductivity type is p-type, the second conductivity type is n-type, and vice versa. The drain material layer 63L includes dopants of the second conductivity type at an atomic concentration in a range from $5 \times 10^{19}/cm^3$ to $2 \times 10^{21}/cm^3$, although lesser and greater dopant concentrations can also be employed.

Figure 12A:
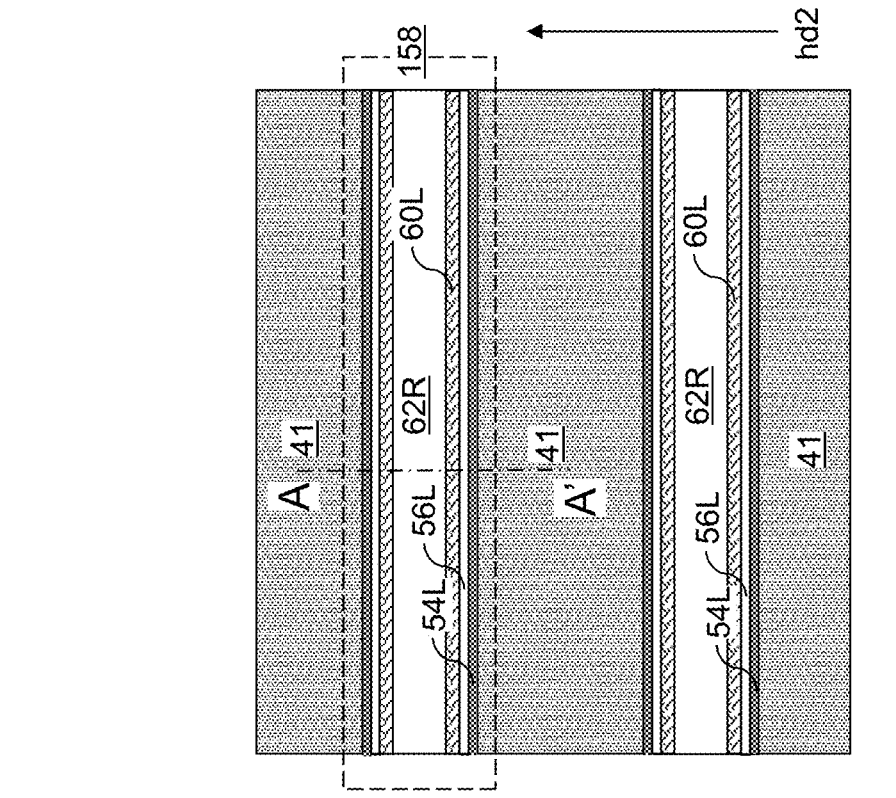
FIG. 12A is a vertical cross-sectional view of a line trench in the first exemplary structure after formation of line trench fill structures according to the first embodiment of the present disclosure.
Figure 12B:
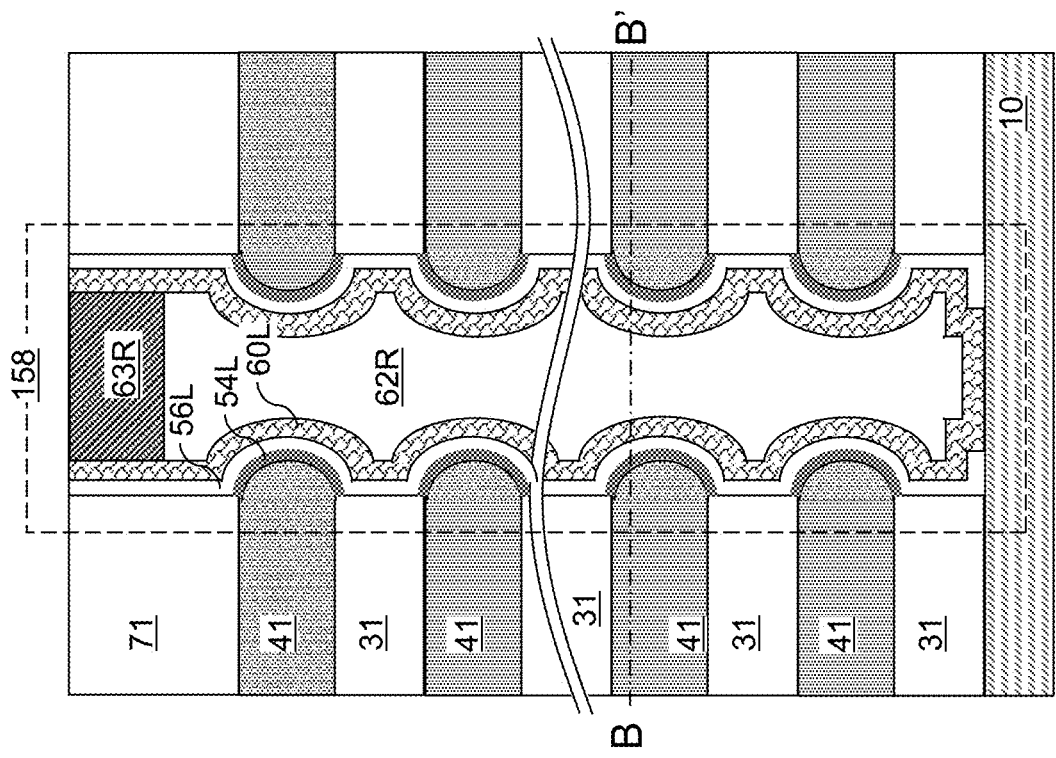
FIG. 12B is a horizontal cross-sectional view along the plane B-B' of 12A. The vertical plane A-A' is the plane of the cross-section for FIG. 12A.
Figure 13A:
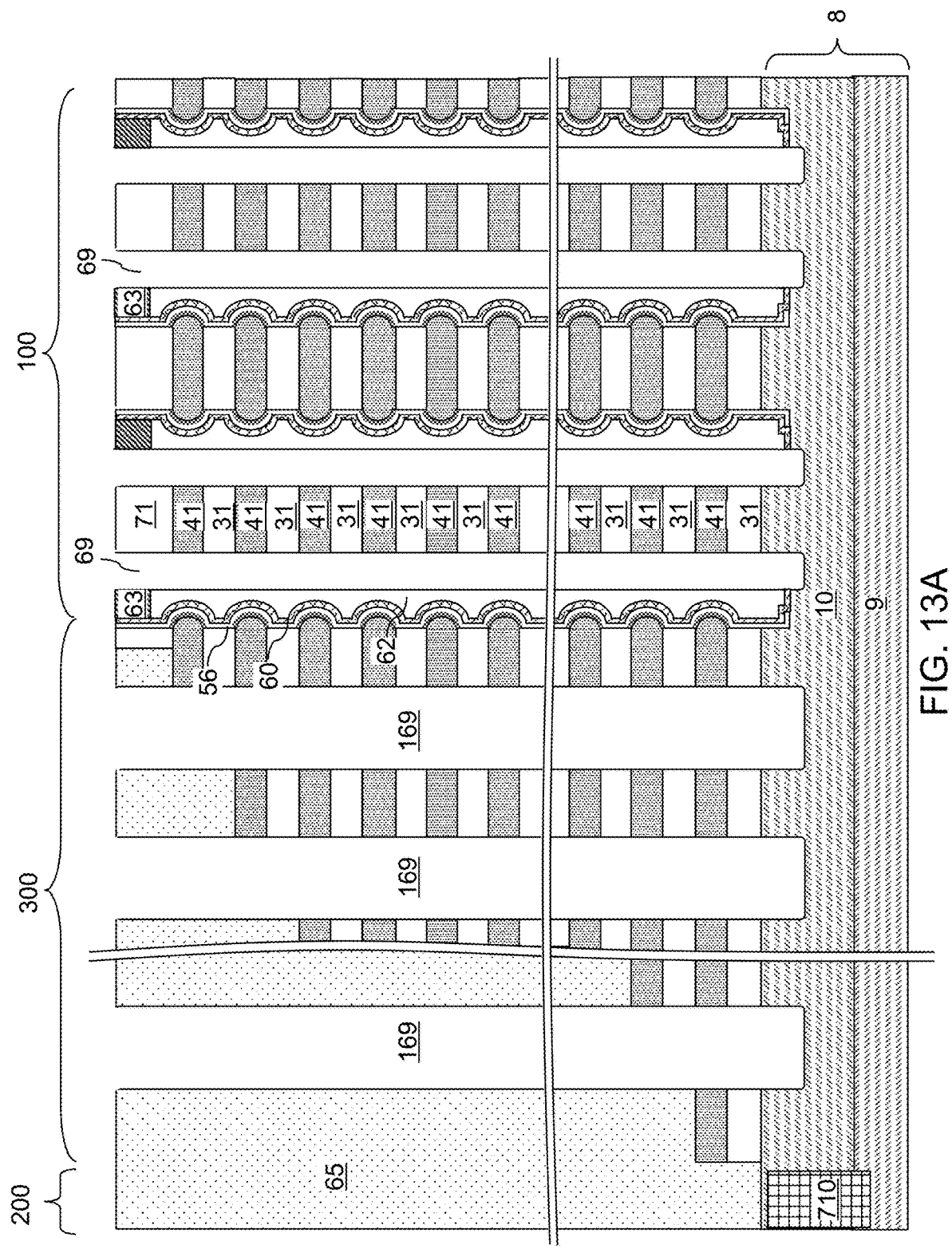
FIG. 13A is a vertical cross-sectional view of the first exemplary structure after formation of pillar cavities according to the first embodiment of the present disclosure.
Figure 13B:
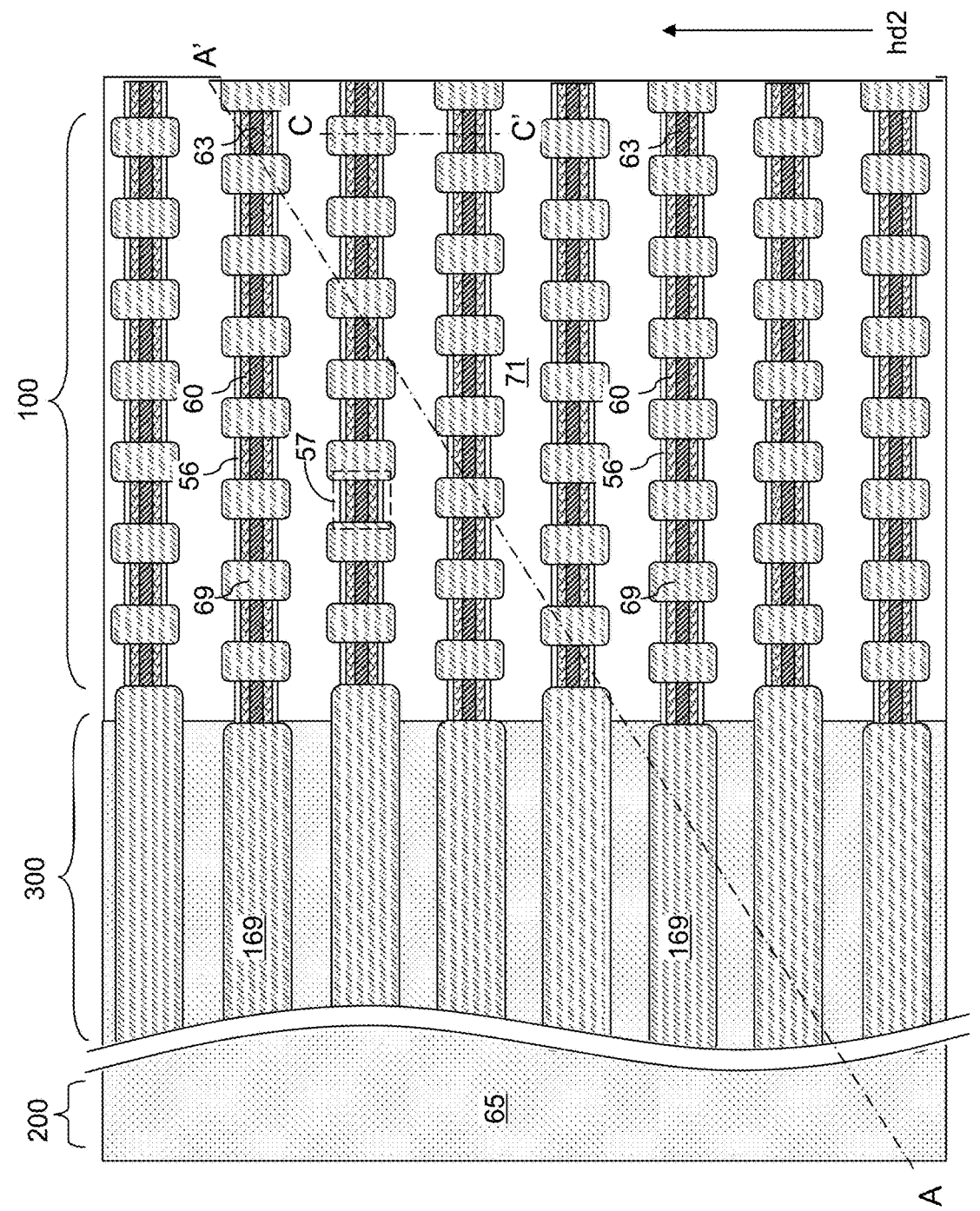
FIG. 13B is a top-down view of the first exemplary structure of FIG. 13A. The vertical plane A-A' is the plane of the cross-section for FIG. 13A.
Figure 13C:
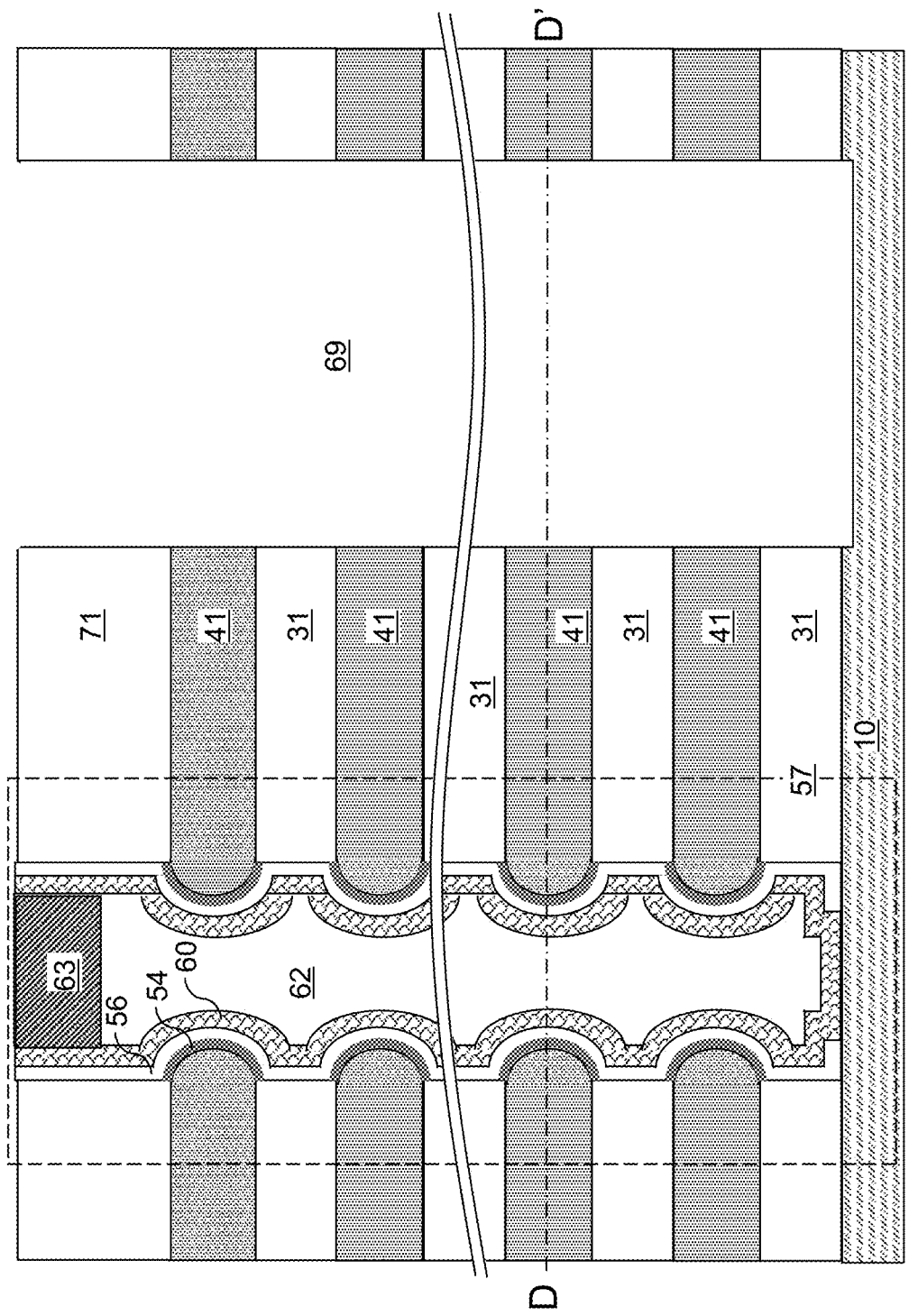
FIG. 13C is a vertical cross-sectional view of a portion of the first exemplary structure along the vertical plane C-C' of FIG. 13B.
Figure 13D:
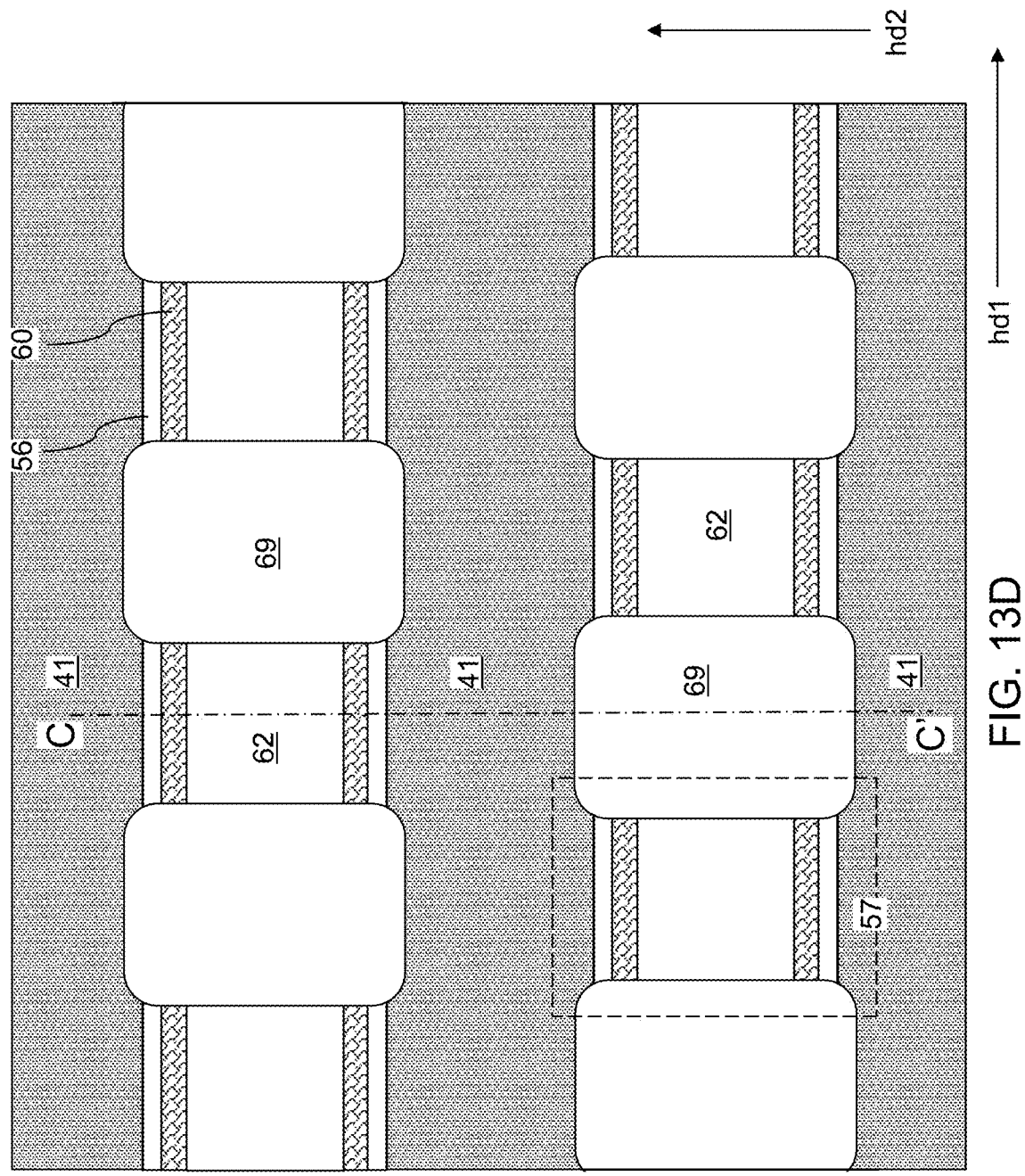
FIG. 13D is a horizontal cross-sectional view of along the plane D-D' of 13C. The vertical plane C-C' is the plane of the cross-section for FIG. 13C.

Referring to FIGS. 12A and 12B, portions of the drain material layer 63L, the semiconductor channel material layer 60L, and the gate dielectric material layer 56L that are located above the horizontal plane including the top surface of the topmost insulating strips 71 can be removed by a planarization process such as a chemical mechanical planarization (CMP) process. Each contiguous set of material portions that fills a line trench 149 comprises a line trench fill structure 158. Each line trench fill structure 158 includes two vertical stacks of metallic liners 54L, a gate dielectric material layer 56L which is a patterned portion of the gate dielectric material layer 56L as formed at the processing steps of FIGS. 8A and 8B, a semiconductor channel material layer 60L which is a patterned portion of the semiconductor channel material layer 60L as formed at the processing steps of FIGS. 10A and 10B, a dielectric core rail 62R, and a drain material rail 63R which is a patterned remaining portion of the drain material layer 63L after the planarization process. A laterally alternating sequence of alternating stacks (31, 41) and line trench fill structures 158 is formed. The alternating stacks (31, 41) (each of which is a vertically-alternating stack) and the line trench fill structures 158 can laterally alternate along the second horizontal direction hd2.

Referring to FIGS. 13A-13D, a two-dimensional array of pillar cavities 69 and elongated isolation cavities 169 can be formed through the line trench fill structures 158. The pillar cavities 69 are formed in the memory array region 100, and the elongated isolation cavities 169 can be formed in the staircase region 300. For example, a photoresist layer (not shown) can be applied over the first exemplary structure, and can be lithographically patterned to form rows of openings that overlie the line trench fill structures 158. Further, elongated openings can be formed in the portion of the photoresist layer located in the staircase region 300. The elongated openings overlie portions of the line trench fill structures 158 in the staircase region 300, and/or are formed within areas corresponding to extensions of the line trench fill structures 158 into the staircase region 300 along the first horizontal direction hd1 (in case the line trench fill structures 158 do not fully extend through the staircase region 300).

An anisotropic etch is performed employing the patterned photoresist layer as an etch mask. Unmasked portions of the line trench fill structures 158, the alternating stacks (31, 41), and the retro-stepped dielectric material portion 65 are etched through by the anisotropic etch process. The anisotropic etch process can be a reactive ion etch process that indiscriminately etches the materials of the line trench fill structures 158, the alternating stacks (31, 41), and the retro-stepped dielectric material portion 65. End point detection can be effected by sensing of physical exposure of the surfaces of the upper substrate semiconductor layer 10. The pillar cavities 69 are formed in the memory array region 100 underneath a respective opening in the photoresist layer, and the elongated isolation cavities 169 can be formed in the staircase region 300 underneath a respective opening in the photoresist layer.

The two-dimensional array of pillar cavities 69 can include rows of pillar cavities 69. Each row of pillar cavities 69 can overlap with the area of respective one of the line trench fill structures 158. The pillar cavities 69 can have substantially vertical sidewalls, and laterally divide each line trench fill structure 158 into memory stack assemblies 57. In one embodiment, the pillar cavities 69 can be formed as a two-dimensional array of pillar cavities 69 extending through the line trench fill structures 158. Each of the pillar cavities 69 extends to the substrate 8, and sidewalls of remaining portions of the insulating layers 32 and the sacrificial material layers 42 are physically exposed around the pillar cavities 69. Elongated isolation cavities 169 laterally extending along the first horizontal direction hd1 can be formed in the staircase region 300 in areas that correspond to extensions of the line trench fill structures 158. The widths of the pillar cavities 69 and the elongated isolation cavities 169 can be greater than the maximum width of the line trenches 149 to ensure that each component within a line trench fill structure 158 is laterally divided by the pillar cavities 69 and the elongated isolation cavities 169. Thus, the line trenches 149 can be modified by the pillar cavities 69 and the elongated isolation cavities 169 to include laterally undulating sidewalls.

A two-dimensional array of memory stack assemblies 57 is formed. Each memory stack assembly 57 is a patterned portion of a line trench fill structure 158. Each memory stack assembly 57 includes a vertical semiconductor channel 60, at least one gate dielectric layer 56 (e.g., two gate dielectric layers 56), two vertical stacks of discrete intermediate metallic electrodes 54, and a dielectric core 62 that is a patterned portion of the dielectric core rail 62R. The vertical semiconductor channel 60 comprises a patterned portion of a semiconductor channel material layer 60L within a respective line trench 149. The two gate dielectric layers 56 comprise patterned portions of a gate dielectric material layer 56L within the respective line trench 149. The two vertical stacks of discrete intermediate metallic electrodes 54 comprise patterned portions of two vertical stacks of metallic liners 54L. The two-dimensional array of memory stack assemblies 57 is formed in the line trenches 149, and is interlaced with a two-dimensional array of pillar cavities 69.

In one embodiment, each of the discrete intermediate metallic electrodes 54 comprises a concave outer sidewall that contacts a convex sidewall of a respective one of the sacrificial material strips 41. In one embodiment, each of the two gate dielectric layers 56 contacts a respective vertical stack of discrete intermediate metallic electrodes 54 within the two vertical stacks of discrete intermediate metallic electrodes 54. In one embodiment, each of the two gate dielectric layers 56 has a laterally-undulating vertical cross-sectional profile that includes straight gate dielectric segments that contact a respective one of the insulating strips 31 and curved gate dielectric segments contacting a respective vertical stack of discrete intermediate metallic electrodes 54. Each straight gate dielectric segment is located directly on a sidewall of an insulating strip 31, and each curved gate dielectric segment is located directly on a convex inner sidewall of a discrete intermediate metallic electrode 54. In one embodiment, each of the curved gate dielectric segments of the gate dielectric layers 56 comprises a concave outer sidewall that contacts a respective one of the discrete intermediate metallic electrodes 54 and a convex inner sidewall that contacts a concave sidewall segment of a vertical semiconductor channel 60.

In one embodiment, each discrete intermediate metallic electrode 54 within the two vertical stacks of discrete intermediate metallic electrodes 54 comprises an outer concave sidewall in contact with a respective one of the sacrificial material strips 41, and an inner convex sidewall in contact with one of the two gate dielectric layers 56 within a memory stack assembly 57. In one embodiment, each discrete intermediate metallic electrode 54 within the two vertical stacks of discrete intermediate metallic electrodes comprises an upper vertical sidewall 54A connecting an upper periphery of the inner convex sidewall and an upper periphery of the outer concave sidewall and contacting one of the insulating strips 31, and a lower vertical sidewall 54B connecting a lower periphery of the inner convex sidewall and a lower periphery of the outer concave sidewall and contacting another of the insulating strips 31.

In one embodiment, the vertical semiconductor channel 60 has a laterally-undulating vertical cross-sectional profile, and includes straight semiconductor channel segments located at levels of the insulating strips 31 and curved semiconductor channel segments located at levels of the vertical stacks of discrete intermediate metallic electrodes 54, which are levels of the sacrificial material strips 41. In one embodiment, the vertical semiconductor channel in each memory stack assembly 57 comprises, and/or consists essentially of, a polycrystalline semiconductor material, such as polysilicon. In one embodiment, each of the memory stack assemblies 57 comprises a dielectric core 62 contacting convex surfaces of a respective vertical semiconductor channel 60.

Figure 14A:
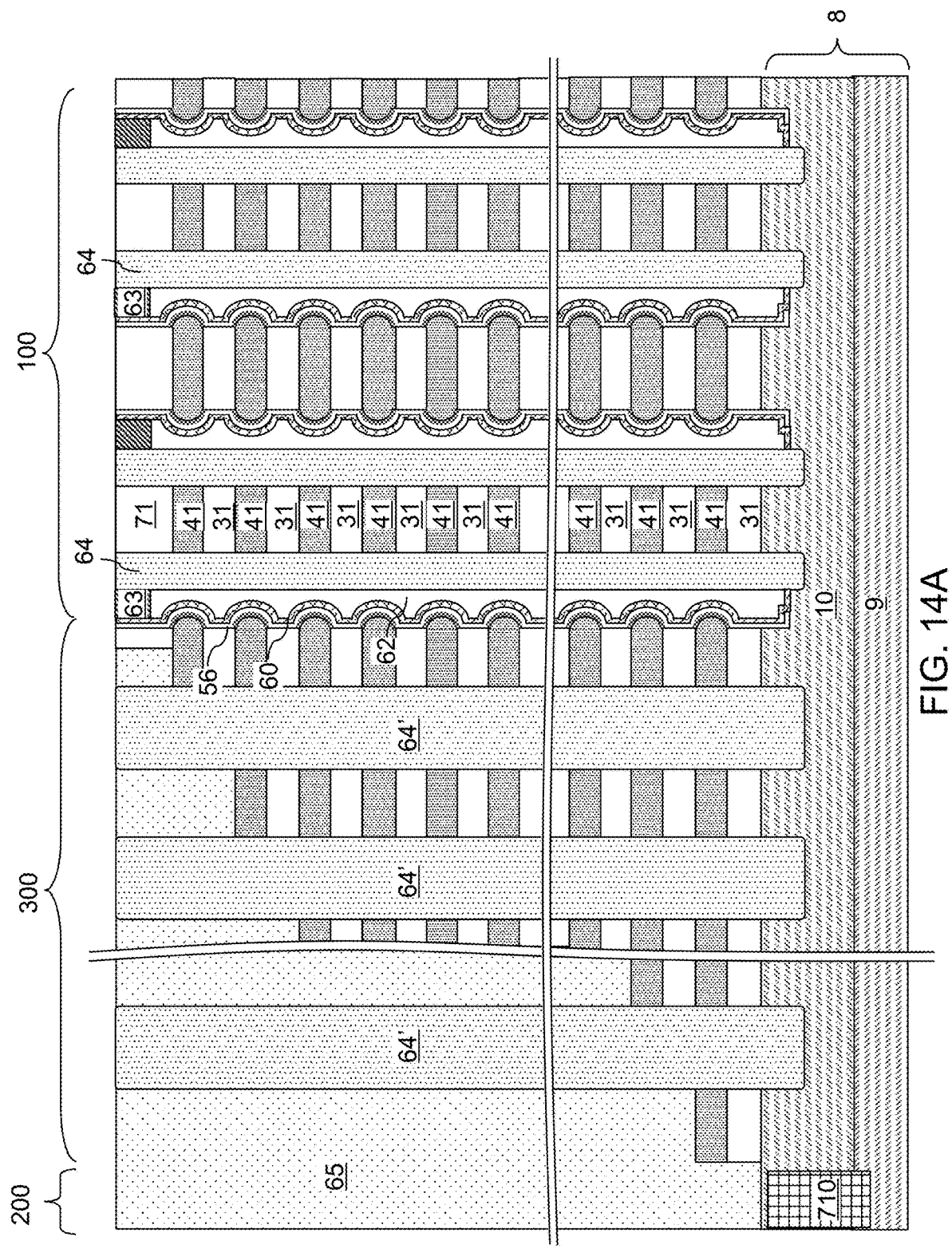
FIG. 14A is a vertical cross-sectional view of the first exemplary structure after formation of dielectric pillar structures according to the first embodiment of the present disclosure.
Figure 14B:
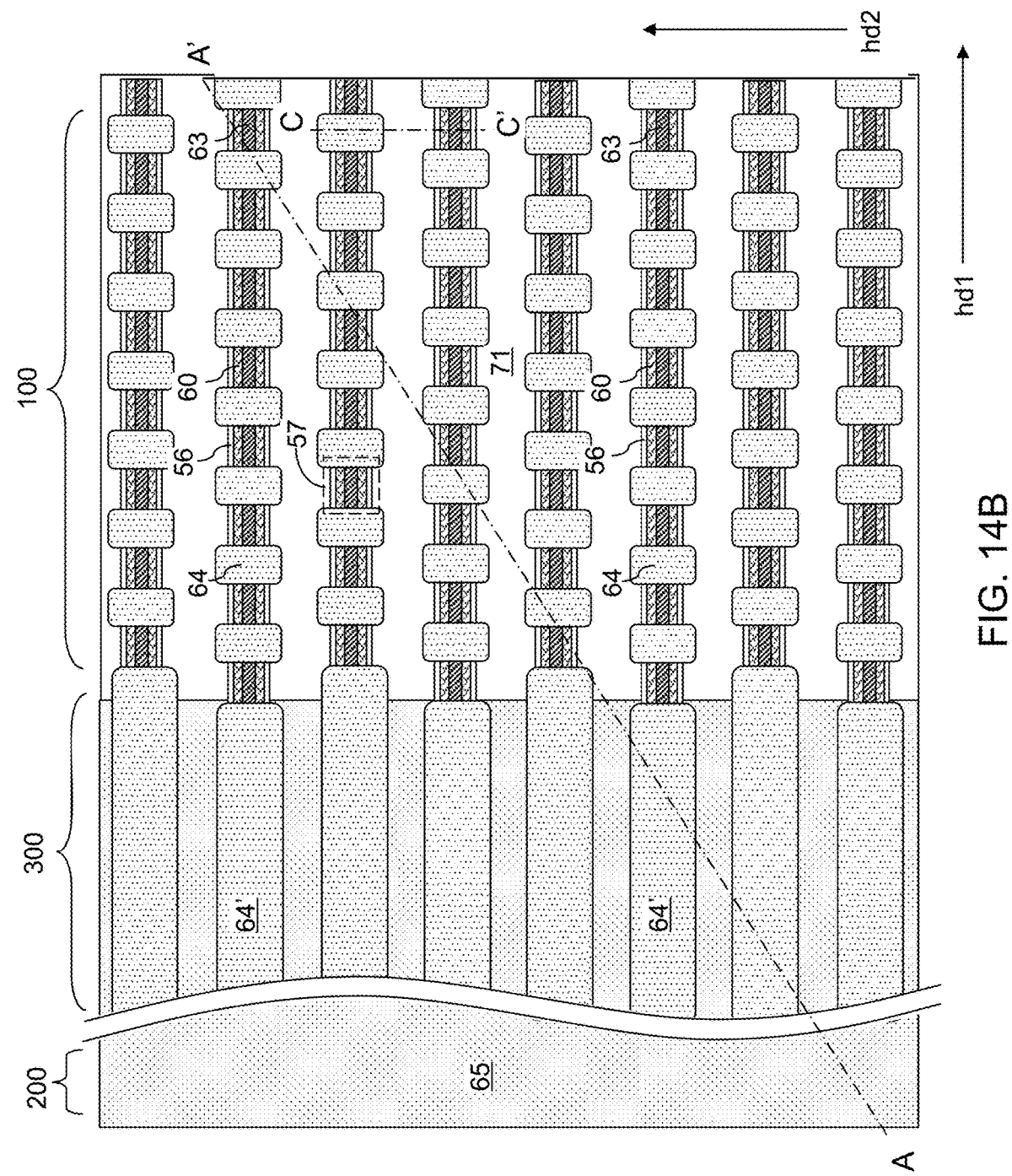
FIG. 14B is a top-down view of the first exemplary structure of FIG. 14A. The vertical plane A-A' is the plane of the cross-section for FIG. 14A.
Figure 14C:
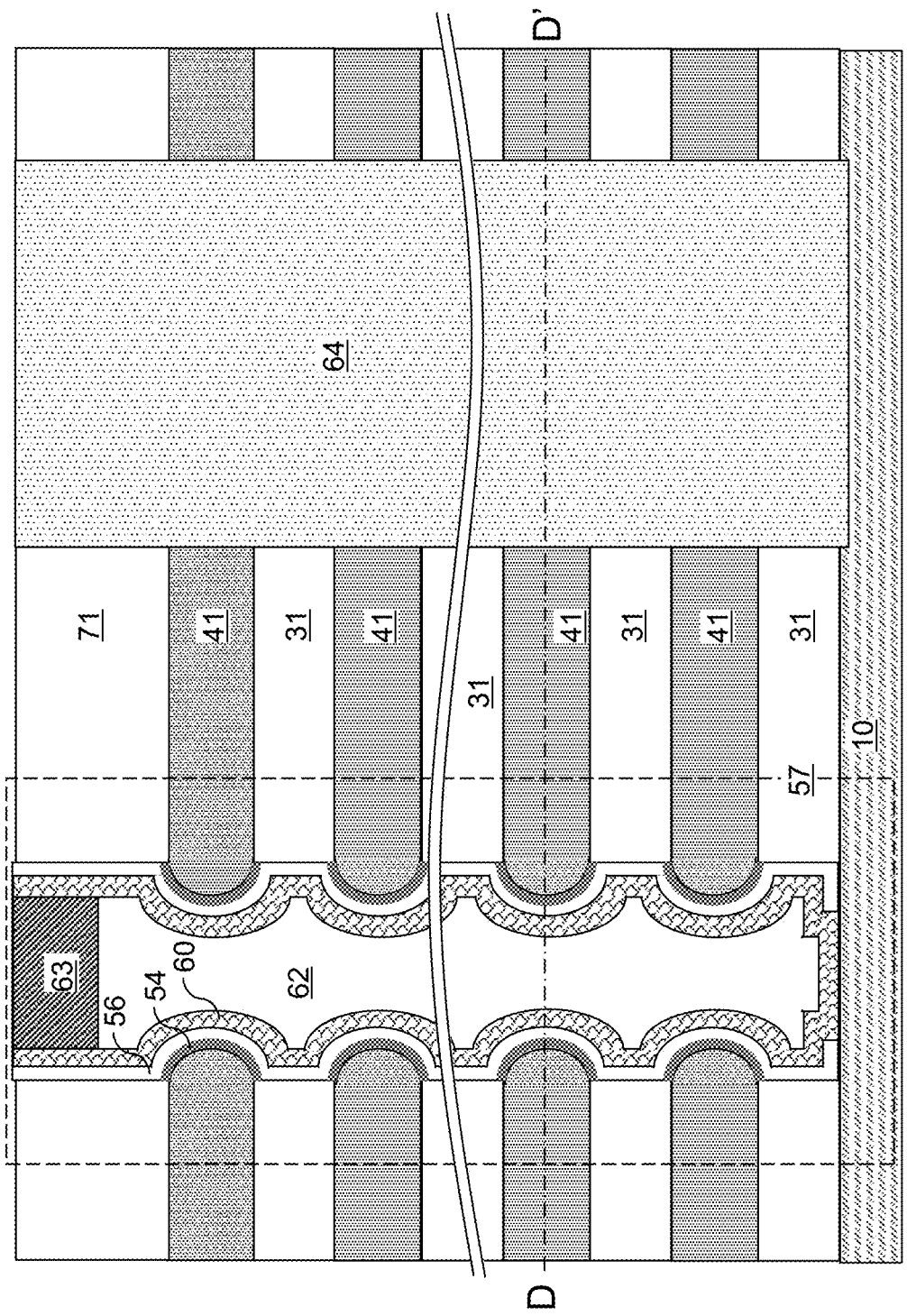
FIG. 14C is a vertical cross-sectional view of a portion of the first exemplary structure along the vertical plane C-C' of FIG. 14B.
Figure 14D:
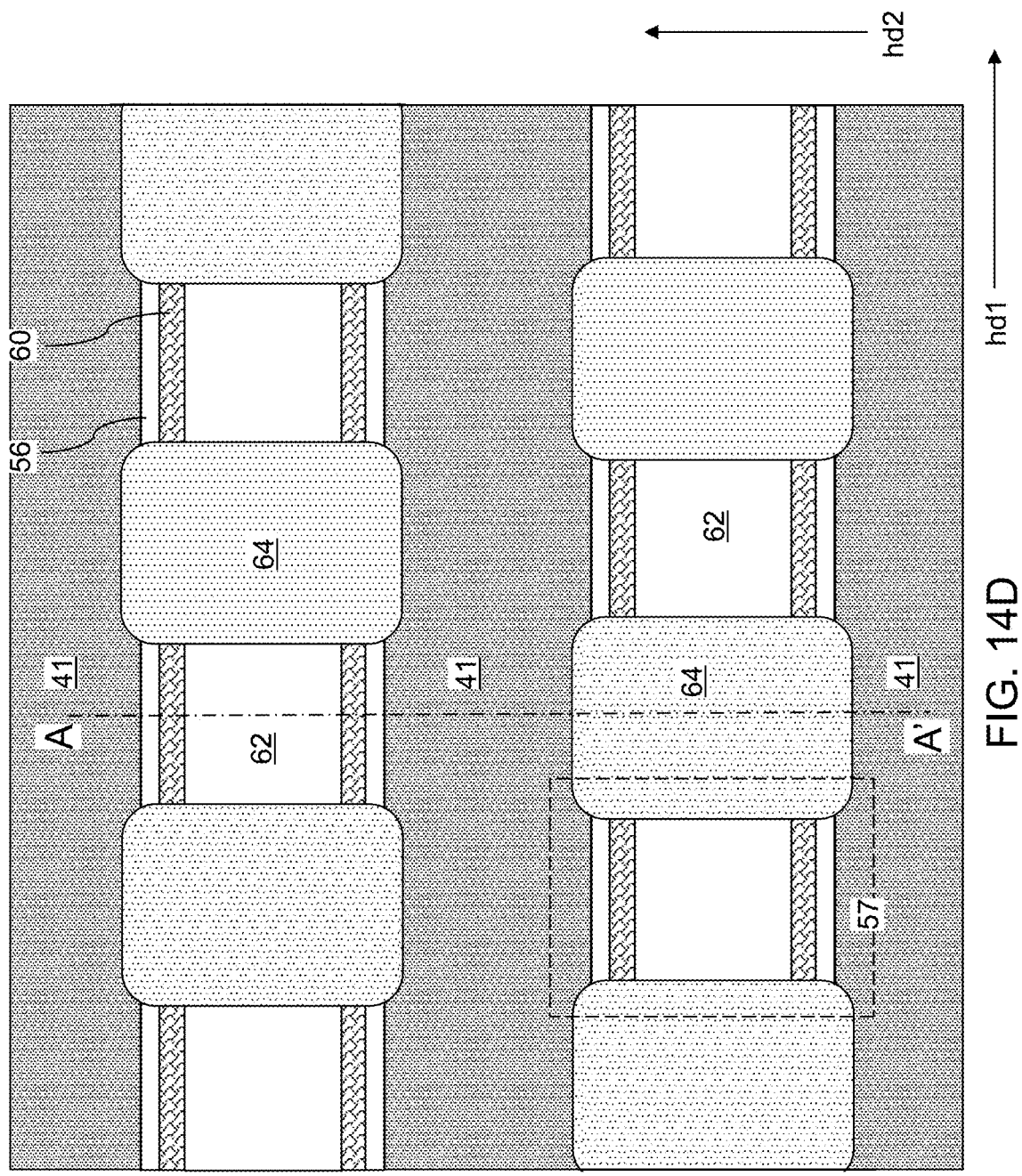
FIG. 14D is a horizontal cross-sectional view along the plane D-D' of FIG. 14C. The vertical plane C-C' is the plane of the cross-section for FIG. 14C.

Referring to FIGS. 14A and 14B, a dielectric material such as doped silicate glass or undoped silicate glass can be deposited in the voids in the line trenches 149, which can include the pillar cavities 69 and the elongated isolation cavities 169. Dielectric pillar structures 64 are formed within the volumes of the pillar cavities 69. A dielectric wall structure 64' is formed in each elongated isolation cavity 169. The dielectric wall structures 64' laterally extend along the first horizontal direction hd1. Each of the line trenches 149 can be filled with a respective laterally alternating sequence of memory stack assemblies 57 and dielectric pillar structures 64. Each of the memory stack assemblies 57 comprises a respective one of the vertical semiconductor channels 60. The two-dimensional array of dielectric pillar structures 64 can be located in the line trenches 149, and can be laterally offset from, and can be interlaced with, the two-dimensional array of memory stack structures 57. Each line trench 149 can be filled with a respective row of memory stack structures 57 and a respective row of dielectric pillar structures 64 that is interlaced with the respective row of memory stack structures 57.

Figure 15A:
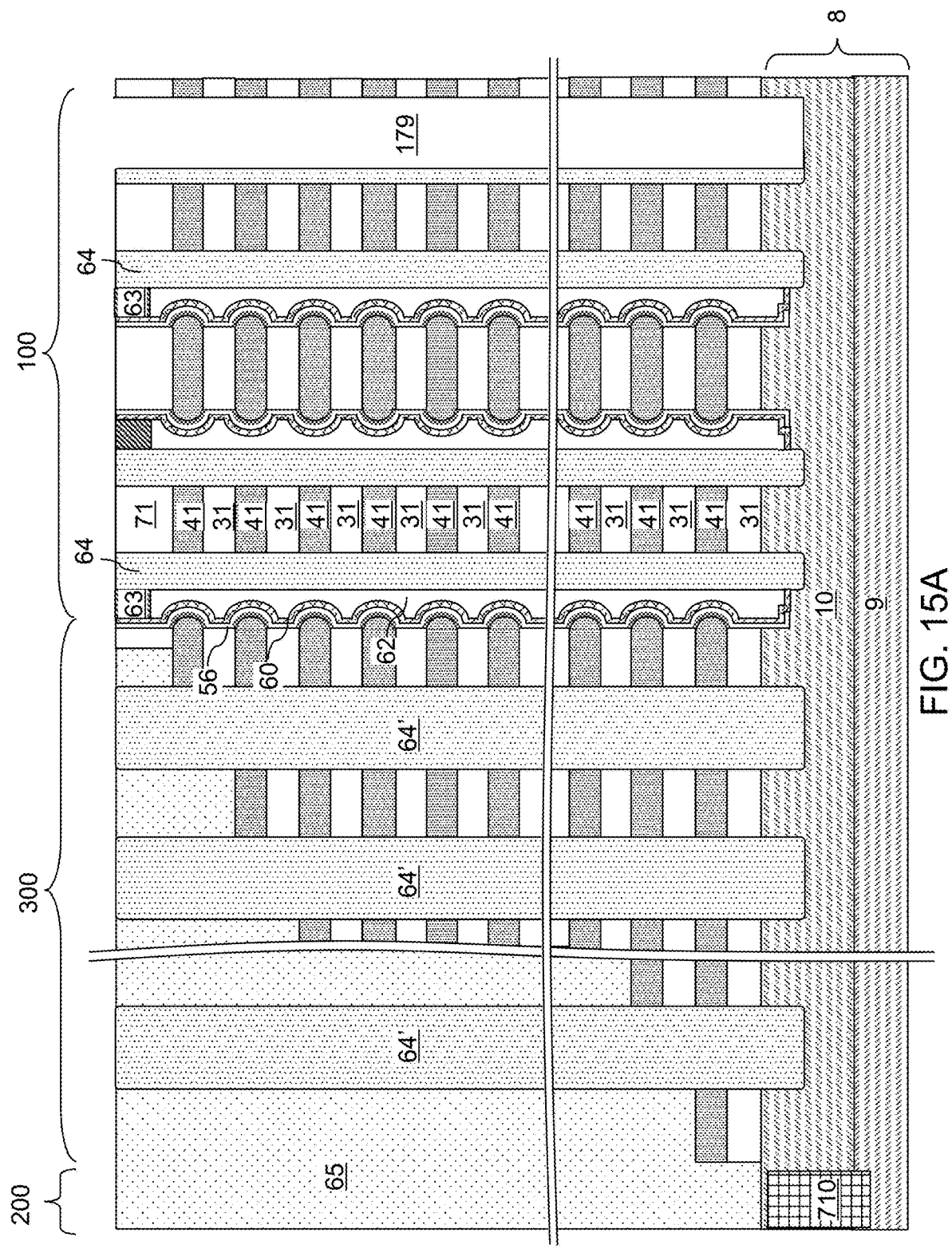
FIG. 15A is a vertical cross-sectional view of the first exemplary structure after formation of backside via cavities according to the first embodiment of the present disclosure.
Figure 15B:
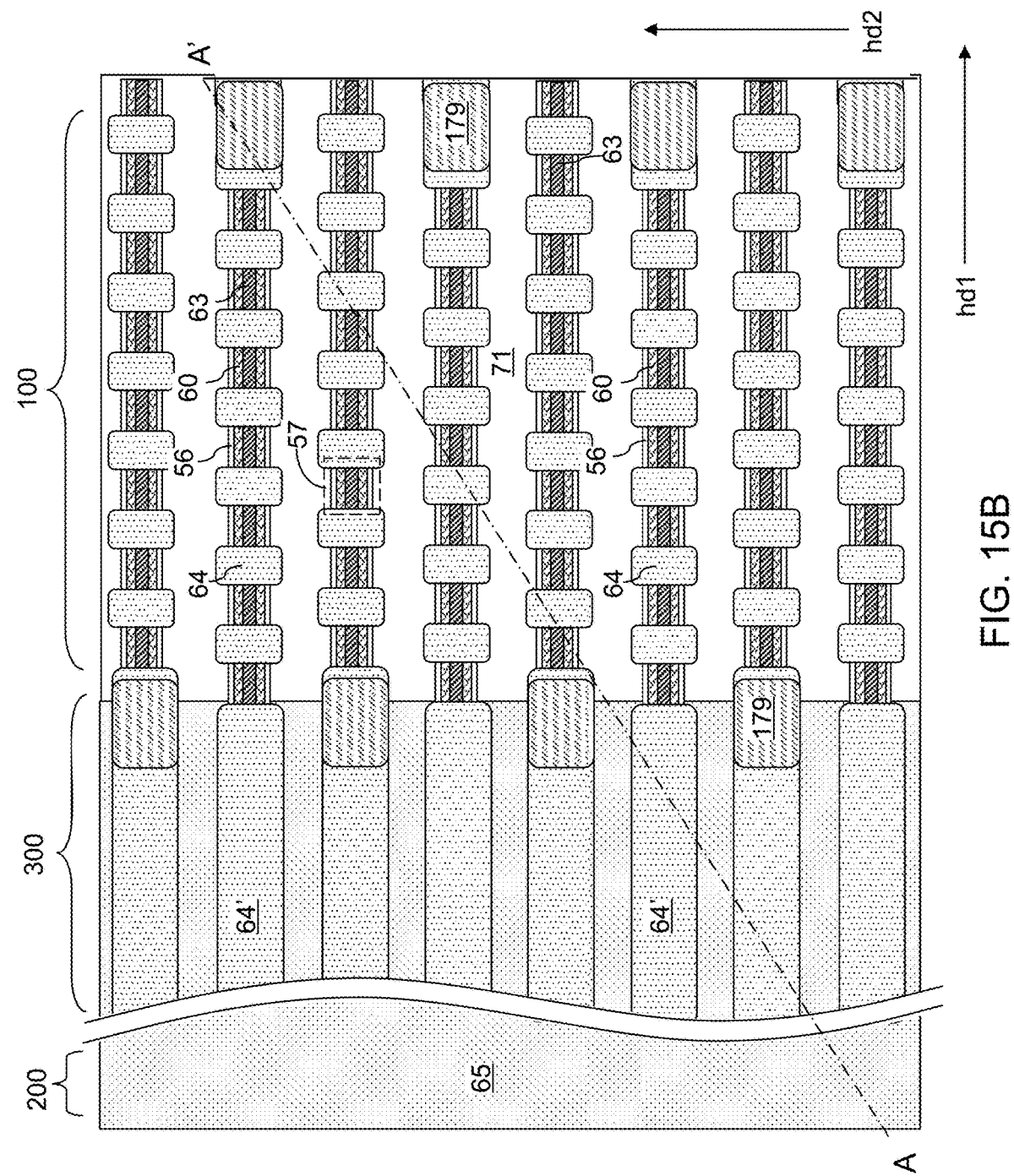
FIG. 15B is a top-down view of the first exemplary structure of FIG. 15A. The vertical plane A-A' is the plane of the cross-section for FIG. 15A.

Referring to FIGS. 15A and 15B, backside via cavities 179 can be formed through a subset of the dielectric pillar structures 64 and portions of the dielectric wall structures 64'. The locations of the backside via cavities 179 can be selected such that each sacrificial material strip 41 contacts at least one of the backside via cavities 179. Further, the locations of the backside via cavities 179 can be selected such that each point within the sacrificial material strip 41 is laterally spaced from a most proximal one of the sacrificial material strips 41 by a lateral distance that does not exceed a lateral etch distance during a subsequent etch process that etches the material of the sacrificial material strips 41 selective to the materials of the insulating strips 31 and the discrete intermediate metallic electrodes 54. In one embodiment, a subset of the backside via cavities 179 can have the same area as a respective one of the dielectric pillar structures 64. In this case, a backside via cavity 179 can be formed by removing a respective dielectric pillar structure 64. In another embodiment, the backside via cavities 179 can only partially overlap in area with a respective one of the dielectric pillar structures 64. In yet another embodiment, the backside via cavities 179 may overlap in area, at least partially, with two or more of the dielectric pillar structures 64 and with any intervening memory stack assemblies 57. In this case, a subset of the memory stack assemblies 57 may be removed during formation of the backside via cavities 179. A subset of the backside via cavities 179 formed through the dielectric wall structures 64' may divide one or more of the dielectric wall structures 64' into multiple discrete portions.

Figure 16:
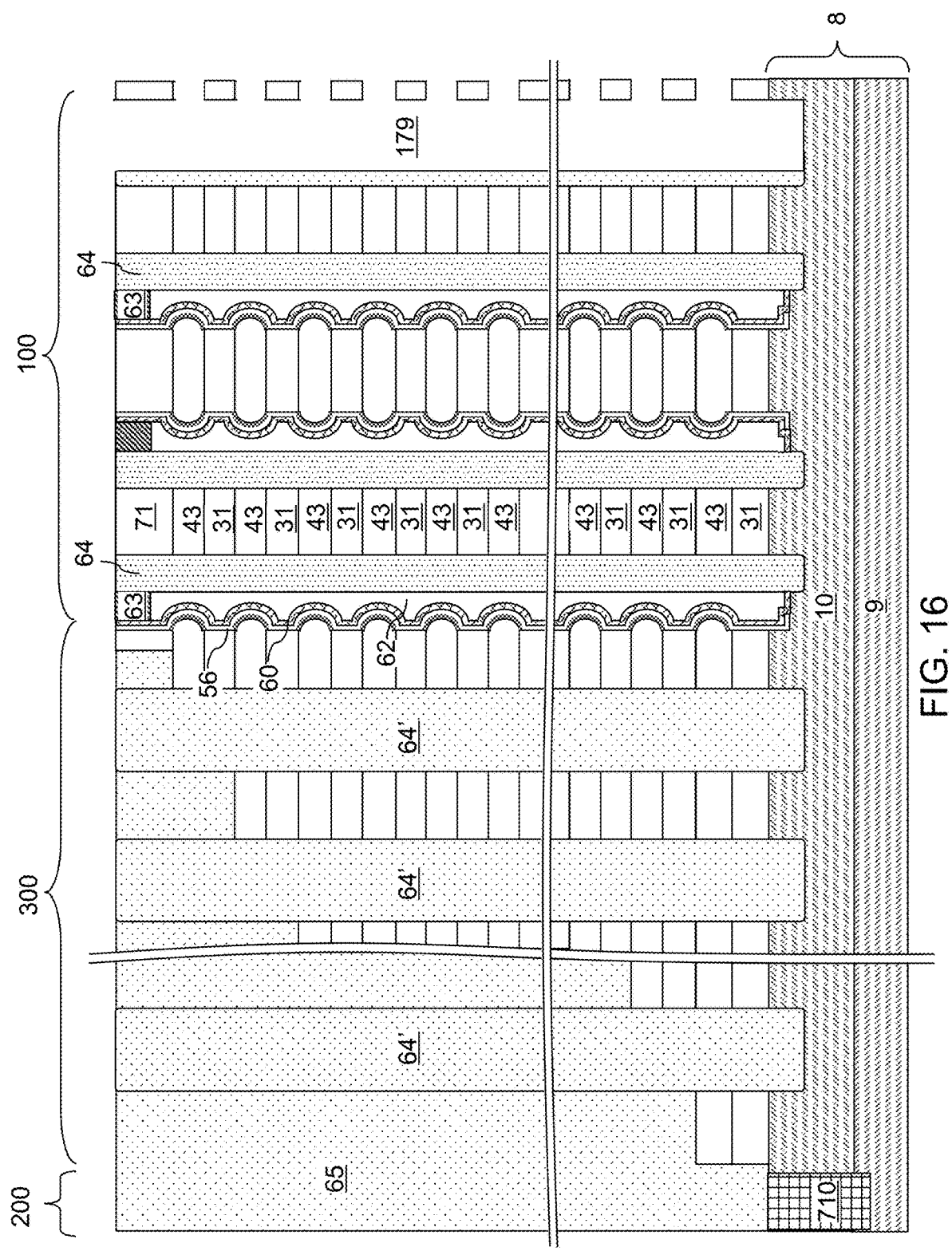
FIG. 16 is a schematic vertical cross-sectional view of the first exemplary structure after formation of backside recesses according to the first embodiment of the present disclosure.

Referring to FIG. 16, an etchant that selectively etches the second material of the sacrificial material strips 41 with respect to the first material of the insulating strips 31 and the discrete intermediate metallic electrodes 54 can be introduced into the backside via cavities 179, for example, employing an isotropic etch process. Backside recesses 43 are formed in volumes from which the sacrificial material strips 41 are removed. The removal of the second material of the sacrificial material strips 41 can be selective to the first material of the insulating strips 31, the material of the retro-stepped dielectric material portion 65, the material of the dielectric pillar structures 64 and the dielectric wall structures 64', and the material of the discrete intermediate metallic electrodes 54. In one embodiment, the sacrificial material strips 41 can include silicon nitride, and the materials of the insulating strips 31 and the retro-stepped dielectric material portion 65 can be silicon oxide materials such as undoped silicate glass and/or a doped silicate glass.

The isotropic etch process that removes the second material selective to the first material and the discrete intermediate metallic electrodes 54 can be a wet etch process employing a wet etch solution, or can be a gas phase (dry) etch process in which the etchant is introduced in a vapor phase into the backside via cavities 179. For example, if the sacrificial material strips 41 include silicon nitride, the etch process can be a wet etch process in which the first exemplary structure is immersed within a wet etch tank including hot phosphoric acid, which etches silicon nitride selective to silicon oxide. The duration of the isotropic etch process can be selected such that the sacrificial material strips 41 are completely removed from each alternating stack (31, 41) of insulating strips 31 and sacrificial material strips 41. Each backside recess 43 can be a laterally extending cavity having a lateral dimension that is greater than the vertical extent of the cavity. In other words, the lateral dimension of each backside recess 43 can be greater than the height of the backside recess 43.

In one embodiment, the memory array region 100 comprises an array of monolithic three-dimensional NAND strings having a plurality of device levels disposed above the substrate 8. In this case, each backside recess 43 can define a space for receiving a respective word line of the array of monolithic three-dimensional NAND strings. Each of the plurality of backside recesses 43 can extend substantially parallel to the top surface of the substrate 8. A backside recess 43 can be vertically bounded by a top surface of an underlying insulating strip 31 and a bottom surface of an overlying insulating strip 31. In one embodiment, each backside recess 43 can have a uniform height throughout. The memory stack assemblies 57, the dielectric pillar structures 64, and the dielectric wall structures 64' provide structural support to the first exemplary structure during formation of the backside recesses 43.

Figure 17A:
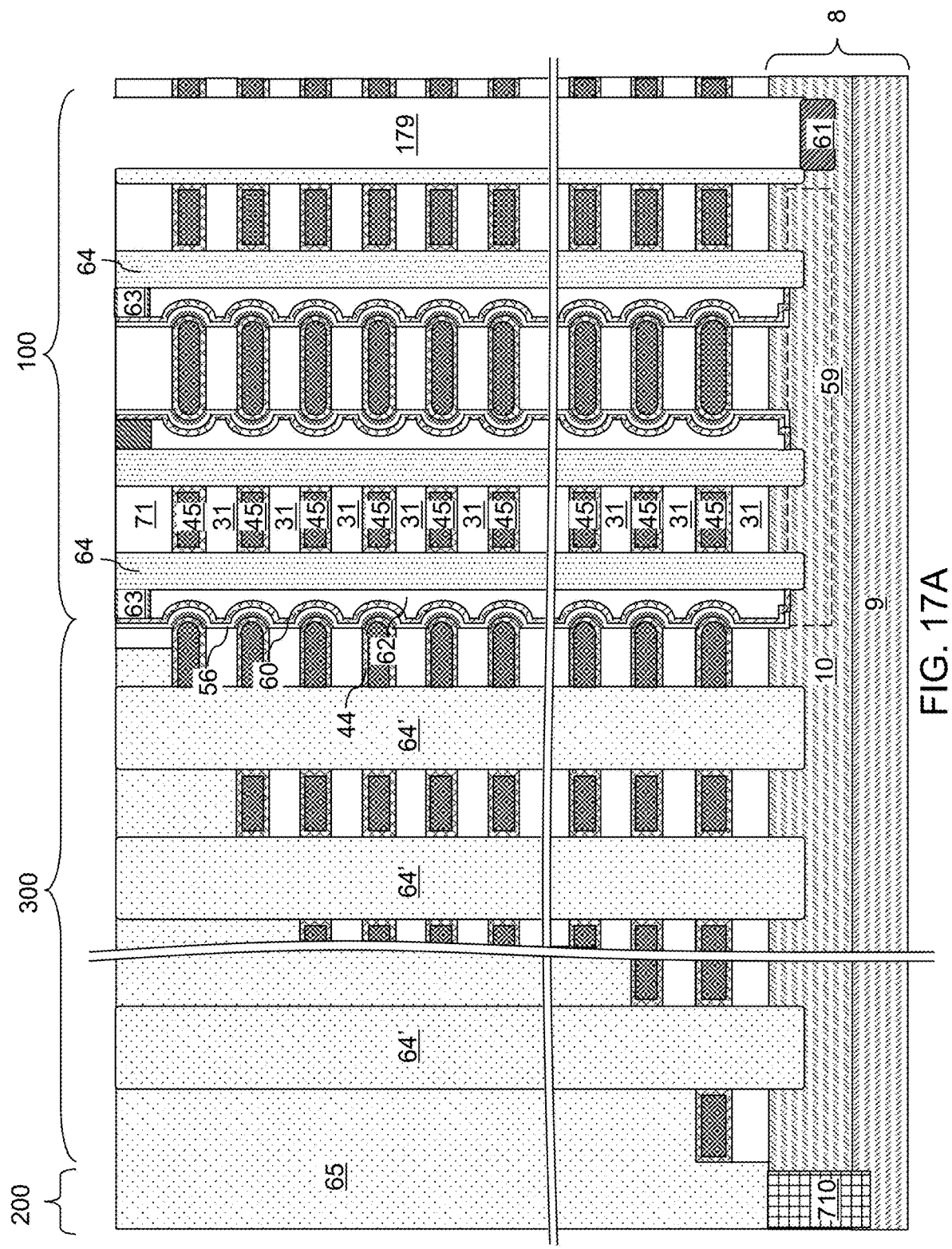
FIG. 17A is a schematic vertical cross-sectional view of the first exemplary structure after formation of source regions and formation of ferroelectric dielectric layers and electrically conductive strips in the backside recesses according to the first embodiment of the present disclosure.
Figure 17B:
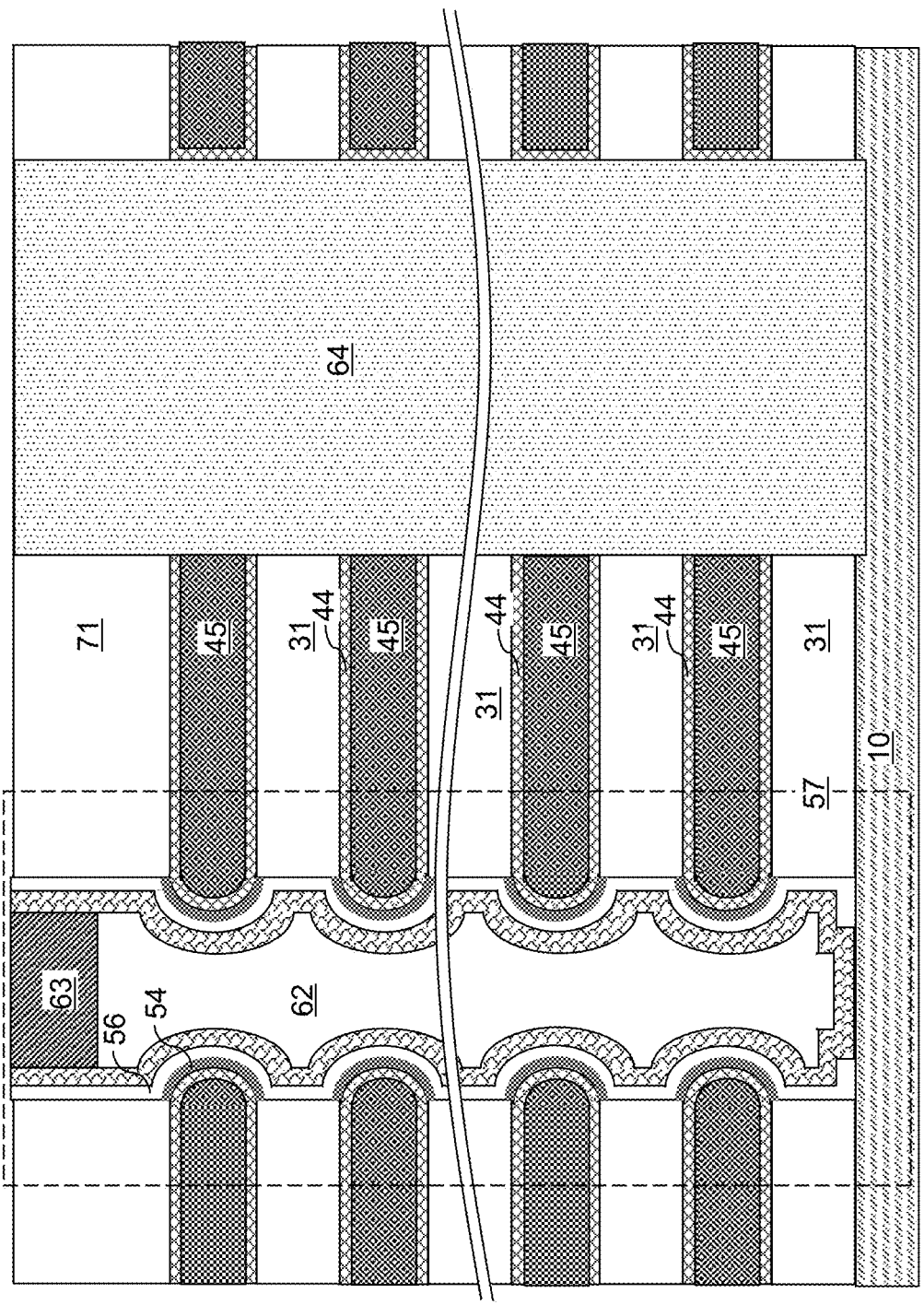
FIG. 17B is a schematic vertical cross-sectional view of a region of the first exemplary structure of FIG. 17A.

Referring to FIGS. 17A and 17B, a source region 61 can be formed at a surface portion of the upper substrate semiconductor layer 10 under each backside via cavity 179 by implantation of electrical dopants into physically exposed surface portions of the upper substrate semiconductor layer 10. Each source region 61 is formed in a surface portion of the substrate 8 that underlies a respective opening through the insulating spacer 174. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 174.

Each surface portion of the upper substrate semiconductor layer 10 located between a source region 61 and neighboring bottom ends of the vertical semiconductor channels 60 constitutes a horizontal semiconductor channel 59. Each horizontal semiconductor channel 59 contacts the source region 61 and a plurality of vertical semiconductor channels 60. Each source region 61 is formed in an upper portion of the substrate 8. Semiconductor channels (59, 60) extend between each source region 61 and a respective set of drain regions 63. The semiconductor channels (59, 60) include the vertical semiconductor channels 60 of the memory stack assemblies 57.

A ferroelectric dielectric layer 44 can be deposited in the backside recesses 43 by a conformal deposition process that deposits a ferroelectric dielectric material. The ferroelectric dielectric material includes, and/or consists essentially of, at least one ferroelectric material such as hafnium oxide, zirconium oxide, hafnium-zirconium oxide, barium titanate (such as $BaTiO_3$; BT), colemanite (such as $Ca_2B_6O_{11} \cdot 5H_2O$), bismuth titanate (such as $Bi_{12}TiO_{20}$, $Bi_4Ti_3O_{12}$ or $Bi_2Ti_2O_7$), europium barium titanate, ferroelectric polymer, germanium telluride, langbeinite (such as $M_2M'_2(SO_4)_3$ in which M is a monovalent metal and M' is a divalent metal), lead scandium tantalate (such as $Pb(Sc_xTa_{1-x})O_3$), lead titanate (such as $PbTiO_3$; PT), lead zirconate titanate (such as $Pb(Zr,Ti)O_3$; PZT), lithium niobate (such as $LiNbO_3$; LN), ($LaAlO_3$)), polyvinylidene fluoride ($(CH_2CF_2)_n$), potassium niobate (such as $KNbO_3$), potassium sodium tartrate (such as $KNaC_4H_4O_6 \cdot 4H_2O$), potassium titanyl phosphate (such as $KO_5PTi$), sodium bismuth titanate (such as $Na_{0.5}Bi_{0.5}TiO_3$ or $Bi_{0.5}Na_{0.5}TiO_3$), lithium tantalate (such as $LiTaO_3$ (LT)), lead lanthanum titanate (such as $(Pb,La)TiO_3$ (PLT)), lead lanthanum zirconate titanate (such as $(Pb,La)(Zr,Ti)O_3$ (PLZT)), ammonium dihydrogen phosphate (such as $NH_4H_2PO_4$ (ADP)), or potassium dihydrogen phosphate (such as $KH_2PO_4$ (KDP)). In one embodiment, the ferroelectric dielectric material can include orthorhombic phase hafnium oxide, and preferably including at least one dopant selected from Al, Zr, Y, Gd, La, Sr, and Si. The thickness of the ferroelectric dielectric layer 44 can be in a range from 1 nm to 12 nm, such as from 2 nm to 6 nm, although lesser and greater thicknesses can also be employed.

At least one conductive material can be deposited in remaining volumes of the backside recesses 43. For example, a metallic barrier layer can be deposited in the backside recesses 43 directly on the physically exposed surfaces of the ferroelectric dielectric layer 44. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

A metal fill material is deposited in remaining volumes of backside recesses 43, on the sidewalls of the at least one the backside via cavity 179, and over the top surface of the topmost insulating strips 71 to form a metallic fill material portion. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material portion can consist essentially of at least one elemental metal. The at least one elemental metal of the metallic fill material portion can be selected, for example, from tungsten, cobalt, ruthenium, molybdenum titanium, and tantalum. In one embodiment, the metallic fill material portion can consist essentially of a single elemental metal. In one embodiment, the metallic fill material portion can be deposited employing a fluorine-containing precursor gas such as $WF_6$. In one embodiment, the metallic fill material portion can be a tungsten layer including a residual level of boron, fluorine or silicon atoms as impurities.

A plurality of electrically conductive strips 45 (i.e., electrically conductive strips having strip shapes) can be formed in the plurality of backside recesses 43, and a continuous metallic material layer (not shown) can be formed on the sidewalls of each backside via cavity 179 and over the topmost insulating strips 71. Each electrically conductive strip 45 includes a portion of the metallic barrier layer and a metallic fill material portion that are located between a vertically neighboring pair of dielectric material strips such as a pair of insulating strips 31.

The deposited metallic material of the continuous metallic material layer is etched back from the sidewalls of each backside via cavity 179 and from above the topmost insulating strips 71, for example, by an isotropic wet etch, an anisotropic dry etch, or a combination thereof. Each remaining portion of the deposited metallic material in the backside recesses 43 constitutes an electrically conductive strip 45. Each electrically conductive strip 45 can be a conductive line structure. Thus, the sacrificial material strips 41 are replaced with the electrically conductive strips 45.

Each electrically conductive strip 45 can function as a combination of a plurality of control gate electrodes located at a same level and a word line electrically interconnecting, i.e., electrically shorting, the plurality of control gate electrodes located at the same level. The plurality of control gate electrodes within each electrically conductive strip 45 are the control gate electrodes for the vertical memory devices including the memory stack assemblies 57. In other words, each electrically conductive strip 45 can be a word line that functions as a common control gate electrode for the plurality of vertical memory devices.

Generally, the sacrificial material strips 41 are replaced with combinations of a ferroelectric dielectric layer 44 and an electrically conductive strip 45. Each ferroelectric dielectric layer 44 is deposited directly on a respective subset of the discrete intermediate metallic electrodes 54 that are located at a same level, i.e., located at a same vertical distance from the substrate 8. Each of the electrically conductive strips 45 is laterally spaced from each memory stack assembly 57 by a respective ferroelectric dielectric layer 44. Each ferroelectric dielectric layer 44 comprises a horizontally-extending portion that contacts a horizontal surface of a respective one of the insulating strips 31.

A ferroelectric memory cell including a combination of a gate dielectric layer, an intermediate metallic electrode, and a ferroelectric dielectric layer is prone to charge tunneling through the gate dielectric layer before electrical polarization in the ferroelectric dielectric layer can be flipped. According to an aspect of the present disclosure, each of the discrete intermediate metallic electrodes 54 has a greater contact area with a respective gate dielectric layer 56 than with a respective one of the ferroelectric dielectric layers 44. In one embodiment, the curvature in the vertical cross-sectional shape in each of the discrete intermediate metallic electrodes 54 provides a greater surface area for the inner convex sidewall of each discrete intermediate metallic electrode 54 than for the outer concave sidewall of the same discrete intermediate metallic electrode 54. The reduction in the interfacial area between a ferroelectric dielectric layer 44 and a discrete intermediate metallic electrode 54 relative the interfacial area between the discrete intermediate metallic electrode 54 and a gate dielectric layer 56 causes enhanced electrical coupling between the ferroelectric dielectric layer 44 and the discrete intermediate metallic electrode 54, and suppresses charge tunneling through the gate dielectric layer 56. Thus, undesirable charge tunneling through the gate dielectric layer 56 during programming of the electrical polarization of the portion of the ferroelectric dielectric layer 44 in contact with the discrete intermediate metallic electrode 54 can be suppressed in the ferroelectric memory devices of the present disclosure.

In one embodiment, the ratio of the contact area between a discrete intermediate metallic electrode 54 and a gate dielectric layer 56 to the contact area between the discrete intermediate metallic electrode 54 and a ferroelectric dielectric layer 44 can be in a range from 1.2 to 4, such as from 1.5 to 3, such as 2, although lesser and greater ratios greater than 1 may also be employed. The thickness of each discrete intermediate metallic electrode 54 can be uniform throughout, and can be in a range from 2 nm to 20 nm, such as from 3 nm to 12 nm, although lesser and greater thicknesses can also be employed.

Figure 18:
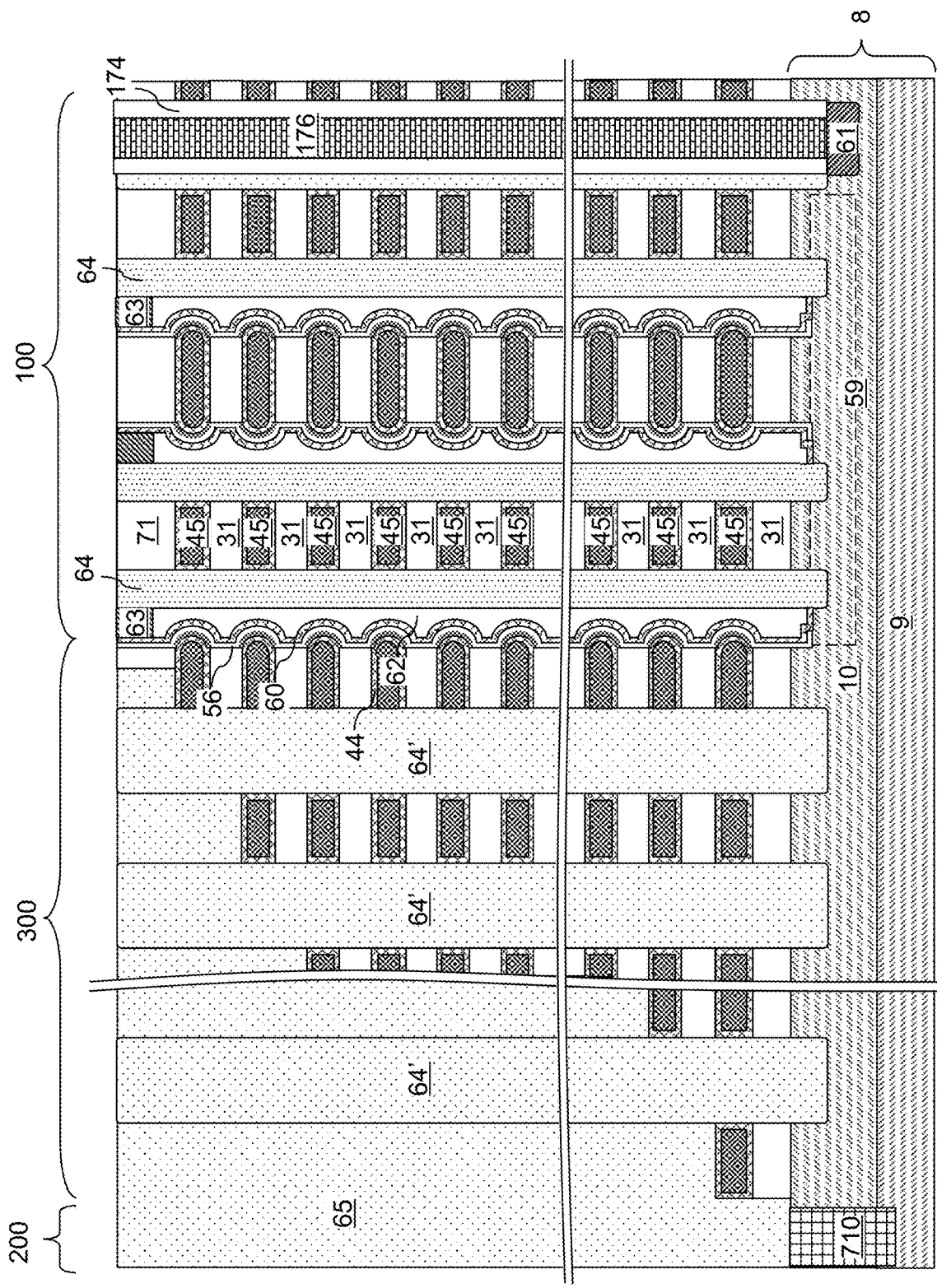
FIG. 18 is a schematic vertical cross-sectional view of the first exemplary structure after formation of insulating spacers and backside contact via structures according to the first embodiment of the present disclosure.

Referring to FIG. 18, an insulating material layer can be formed in the at least one backside via cavity 179 and over the topmost insulating strips 71 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the topmost insulating strips 71 and at the bottom of each backside via cavity 179. Each remaining portion of the insulating material layer constitutes an insulating spacer 174. A backside void is present within a volume surrounded by each insulating spacer 174. A top surface of the upper substrate semiconductor layer 10 can be physically exposed at the bottom of each backside void.

A backside contact via structure 176 can be formed within each backside voids. Each contact via structure 176 can fill a respective backside void. The contact via structures 176 can be formed by depositing at least one conductive material in the remaining unfilled volumes of the backside via cavities 179. For example, the at least one conductive material can include a conductive liner and a conductive fill material portion. The conductive liner can include a conductive metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the topmost insulating strips 71 overlying the alternating stacks (32, 45) as a stopping layer. If chemical mechanical planarization (CMP) process is employed, the topmost insulating strips 71 can be employed as a CMP stopping layer. Each remaining continuous portion of the at least one conductive material in the backside via cavities 179 constitutes a backside contact via structure 176. Each backside contact via structure 176 extends through the alternating stacks (32, 45), and contacts a top surface of a respective source region 61. Alternatively, a horizontal source line can be located under the alternating stacks (32, 45) in electrical contact with the lower parts of the vertical semiconductor channels 60. In this case, the at least one gate dielectric layer 56 comprises a single gate dielectric layer 56 instead of the two gate dielectric layers 56 described above, since the step shown in FIGS. 9A-9B may be omitted.

Figure 19A:
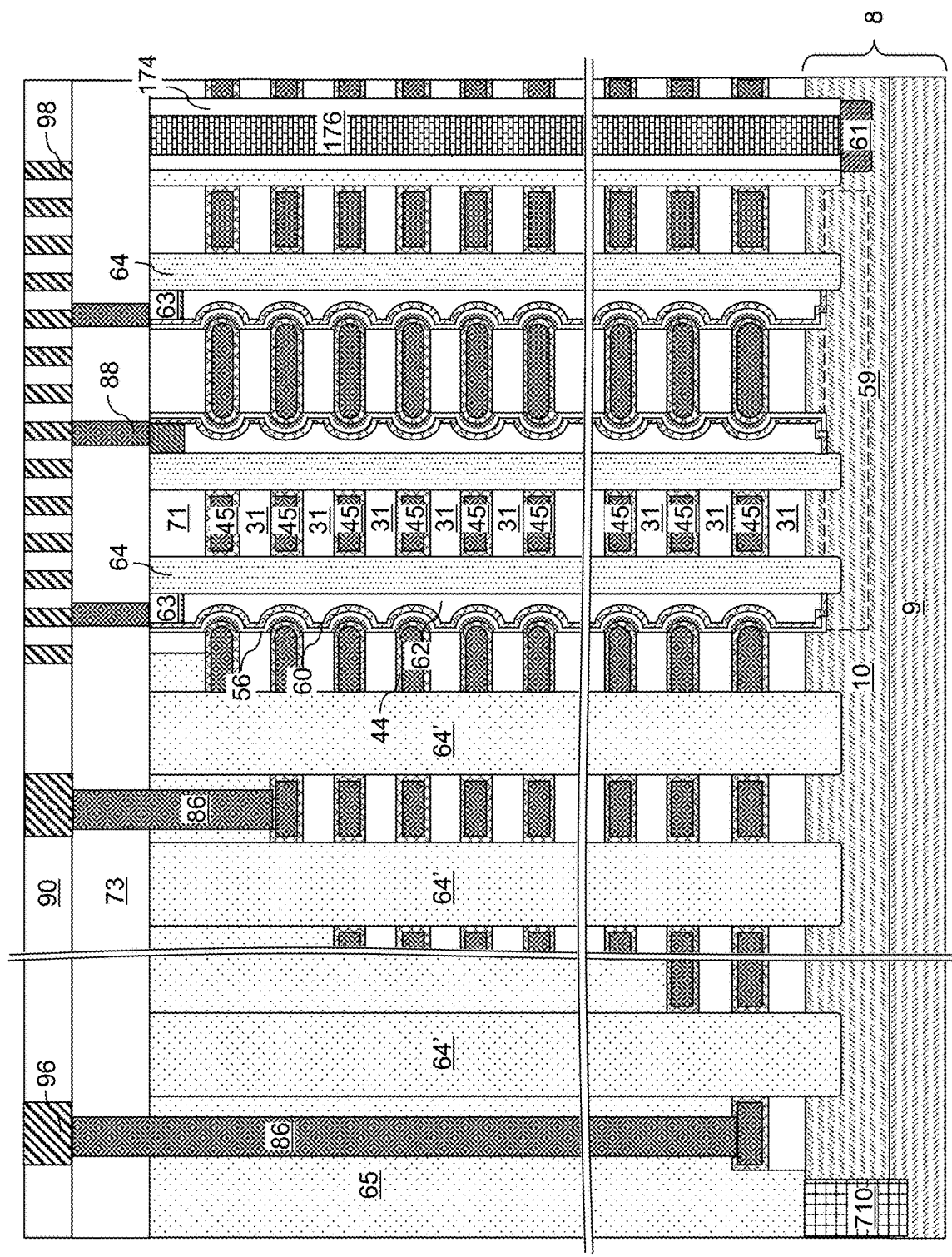
FIG. 19A is a schematic vertical cross-sectional view of the first exemplary structure after formation of word line contact via structures according to the first embodiment of the present disclosure.
Figure 19B:
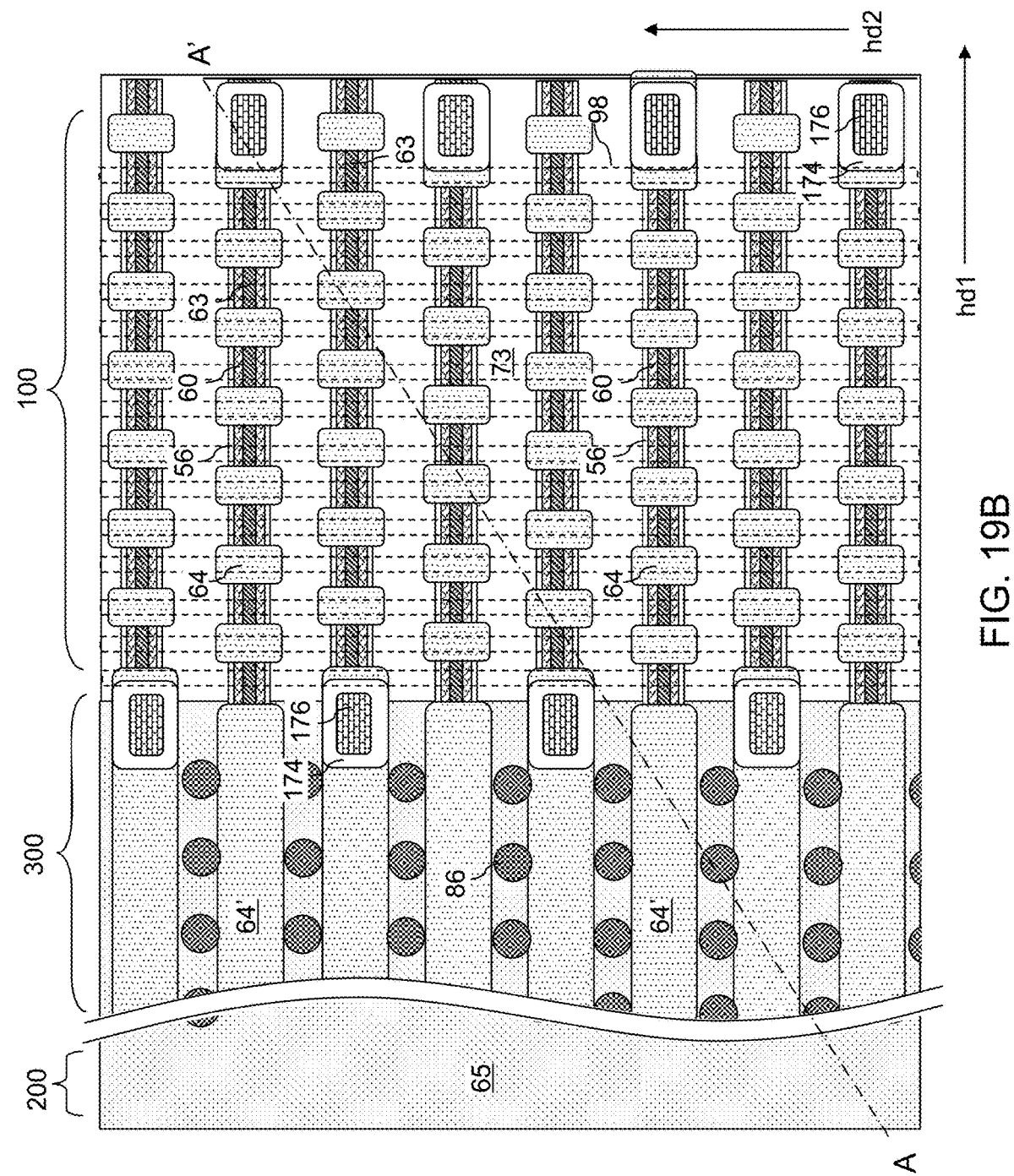
FIG. 19B is a top-down view of the first exemplary structure of FIG. 19A. The vertical plane A-A' is the plane of the cross-section for FIG. 19A.

Referring to FIGS. 19A and 19B, contact via structures 86 (which are herein referred to as word line contact via structures) can be formed on the electrically conductive strips 45 through the retro-stepped dielectric material portion 65. A two-dimensional array of contact via structures 86 can be formed on a top surface of a respective one of the electrically conductive strips 45 in the staircase region 300.

Additional contact via structures and additional dielectric material layers can be formed over the topmost insulating strips 71. For example, drain contact via structures 88 can be formed on a top surface of each drain region 63 within the active memory stack assemblies 57 (i.e., memory stack assemblies 57 that are not employed as dummy structures and are electrically active). Bit lines 98 can be formed to electrically contact every other drain region 63 along the second horizontal direction hd2, i.e., a respective set of drain regions 63 located within every other line trench 149 along the second horizontal direction. In one embodiment, each electrically conductive strip 45, functioning as a word line, activates only a single vertically-extending curved cylindrical portion of a ferroelectric dielectric layer 44 per bit line 98, and can program or read the uniquely selected memory cell corresponding to the single vertically-extending curved cylindrical portion of the ferroelectric dielectric layer 44.

Referring to FIGS. 20A and 20B, a region of an alternative configuration of the first exemplary structure is illustrated after formation of a gate dielectric material layer 56L. The first exemplary structure at the processing steps of FIGS. 20A and 20B can be the same as the first exemplary structure at the processing steps of FIGS. 8A and 8B.

Referring to FIGS. 21A and 21B, the optional processing steps of FIGS. 9A and 9B can be optionally performed to form an opening through the gate dielectric material layer 56L by performing the processing steps of FIGS. 9A and 9B. Alternatively, this step may be omitted.

Referring to FIGS. 22A and 22B, a sacrificial channel material layer 161L can be formed on the over the gate dielectric material layer 56L and directly on the physically exposed surfaces of the substrate 8 through the openings in the gate dielectric material layer 56L. The sacrificial channel material layer 161L includes a material that can be subsequently removed selective to the materials of the gate dielectric material layer 56L, the substrate 8, and dielectric core rails to be subsequently formed. For example, the sacrificial channel material layer 161L can include amorphous carbon, a polymer material that can be subsequently thermally decomposed, polysilicon, germanium, or a silicon-germanium alloy. The thickness of the sacrificial channel material layer 161L can be in a range from 2 nm to 20 nm, such as from 3 nm to 10 nm, although lesser and greater thicknesses can also be employed.

Referring to FIGS. 23A and 23B, a patterning film 47 can be deposited over the sacrificial channel material layer 161L by an anisotropic deposition process. An anisotropic etch process can be performed to form an opening through each horizontal portion of the sacrificial channel material layer 161L that contacts the substrate 8. The patterning film 47 can be subsequently removed, for example, by ashing.

In one alternative embodiment, the steps shown in FIGS. 21A and 21B may be omitted and the opening through the gate dielectric material layer 56L is formed during the anisotropic etch shown in FIGS. 23A and 23B. In this case, the at least one gate dielectric layer 56 comprises a single gate dielectric layer 56 instead of the two gate dielectric layers 56 described above. In another alternative embodiment the steps shown in FIGS. 23A and 23B are omitted and the opening through each horizontal portion of the sacrificial channel material layer 161L that contacts the substrate 8 is omitted.

Figure 24B:
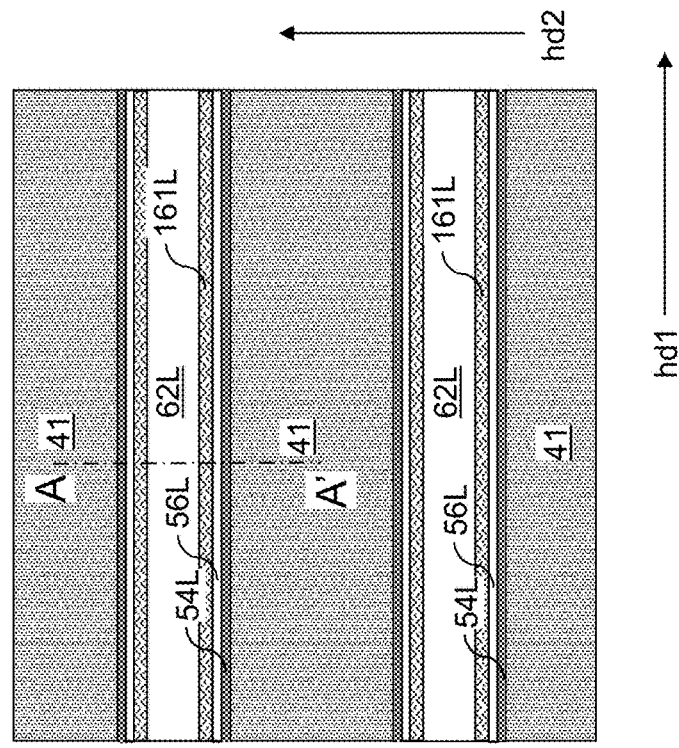
FIG. 24B is a horizontal cross-sectional view along the plane B-B' of FIG. 24A. The vertical plane A-A' is the plane of the cross-section for FIG. 24A.
Figure 24A:
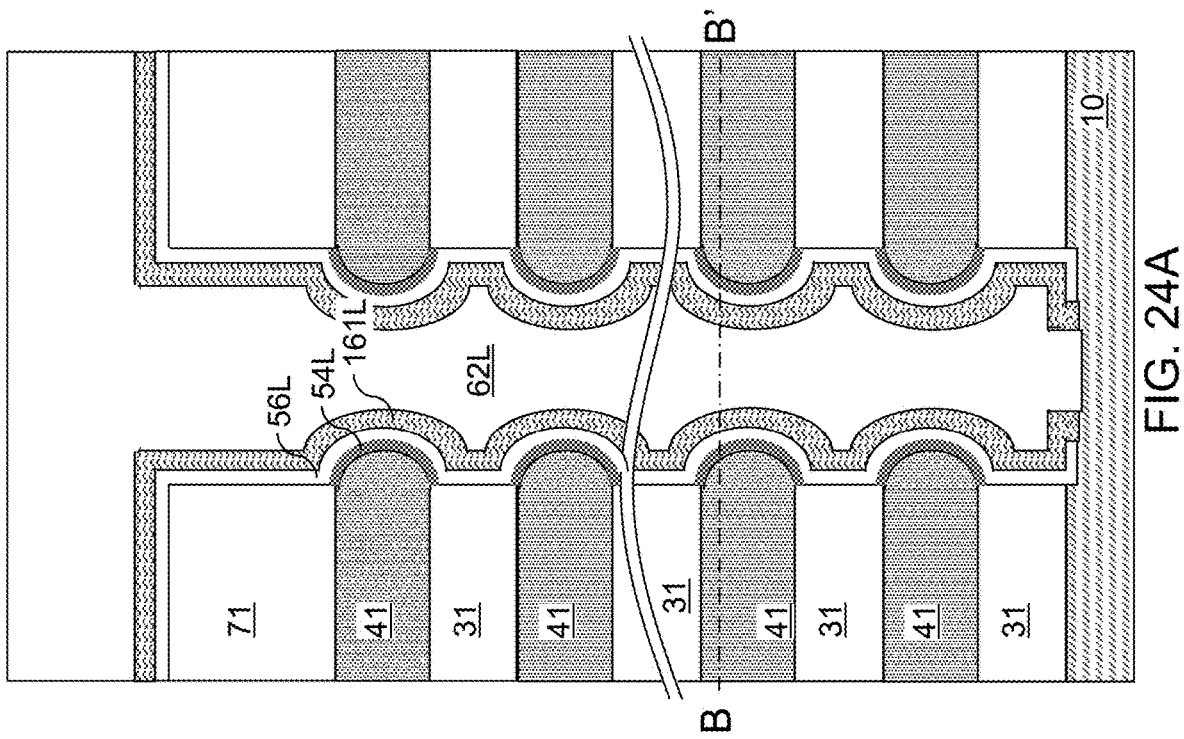
FIG. 24A is a vertical cross-sectional view of a line trench in the alternative configuration of the first exemplary structure after formation of a continuous dielectric fill material layer according to the first embodiment of the present disclosure.
Figure 26A:
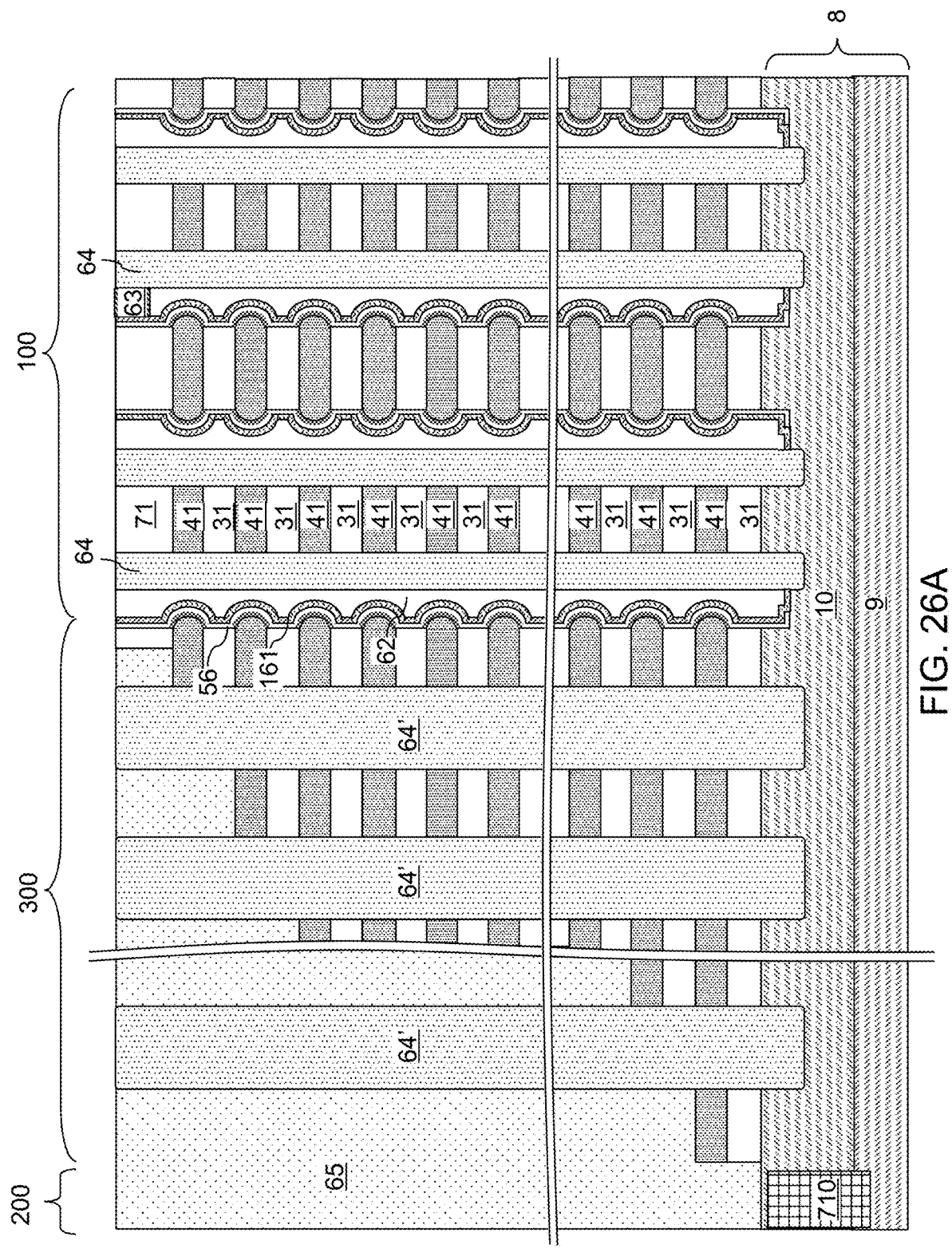
FIG. 26A is a vertical cross-sectional view of the alternative embodiment of the first exemplary structure after formation of dielectric pillar structures according to the first embodiment of the present disclosure.
Figure 26B:
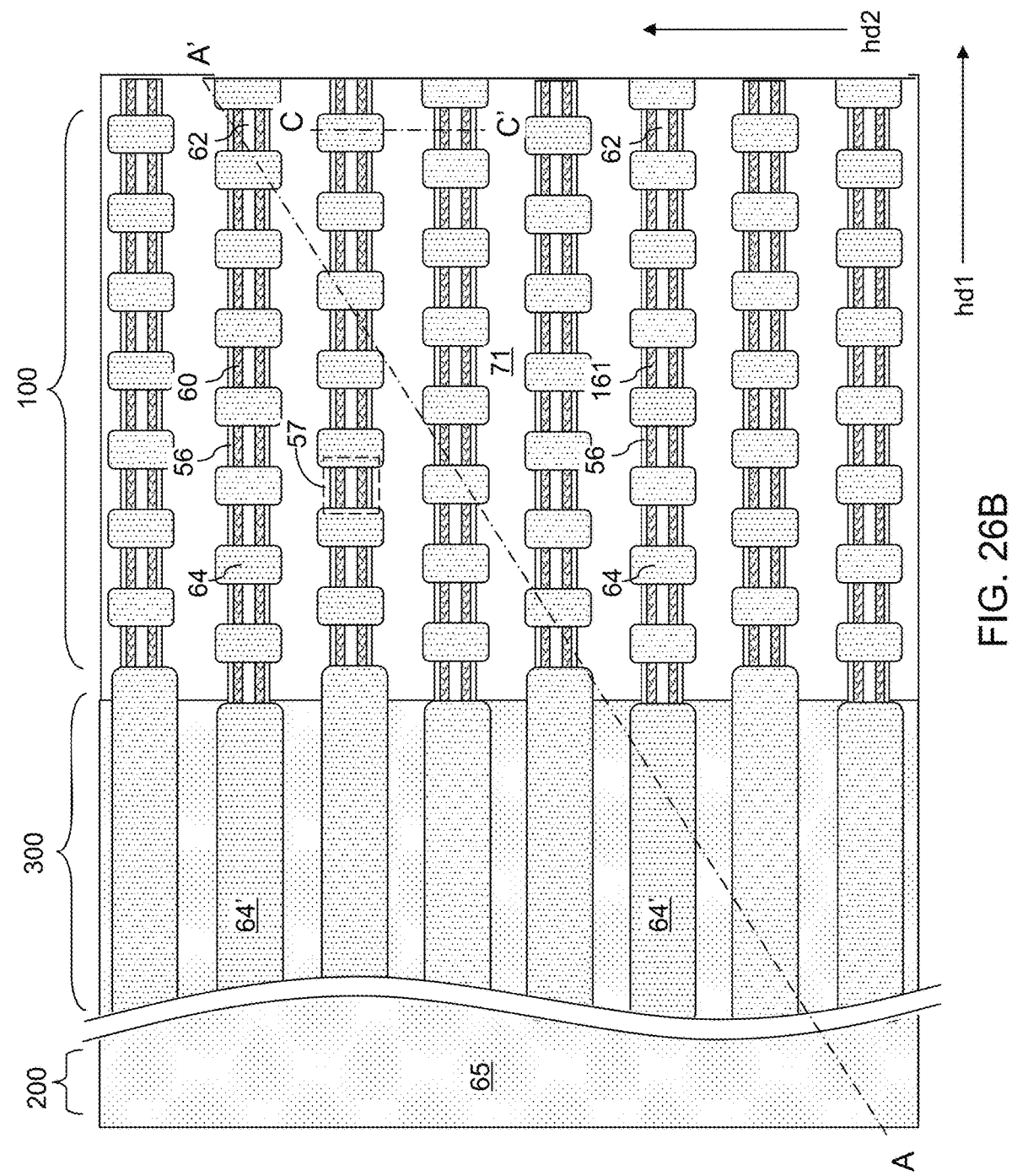
FIG. 26B is a top-down view of the first exemplary structure of FIG. 26A. The vertical plane A-A' is the plane of the cross-section for FIG. 26A.
Figure 26C:
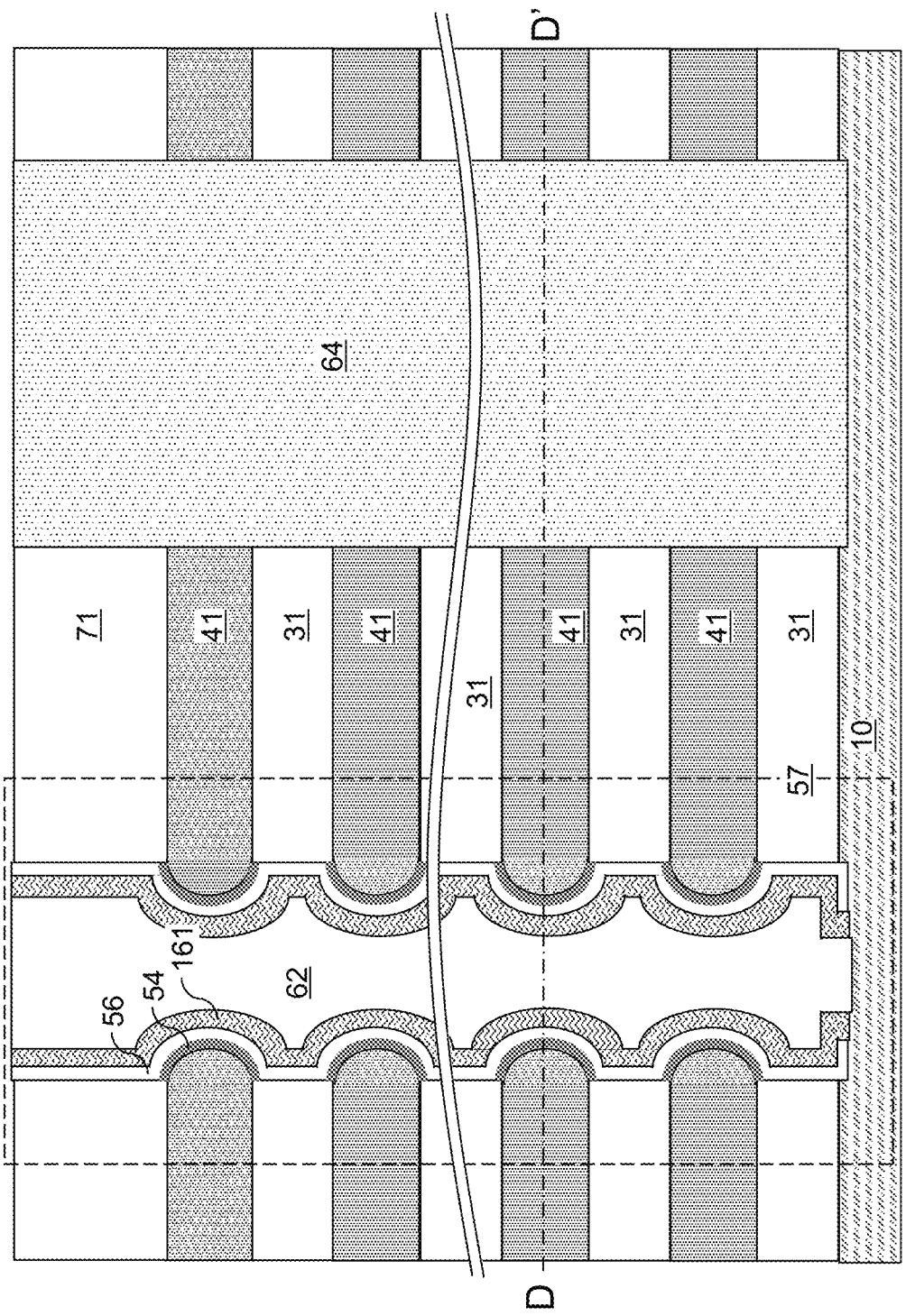
FIG. 26C is a vertical cross-sectional view of a portion of the alternative embodiment of the first exemplary structure along the vertical plane C-C' of FIG. 26B.
Figure 26D:
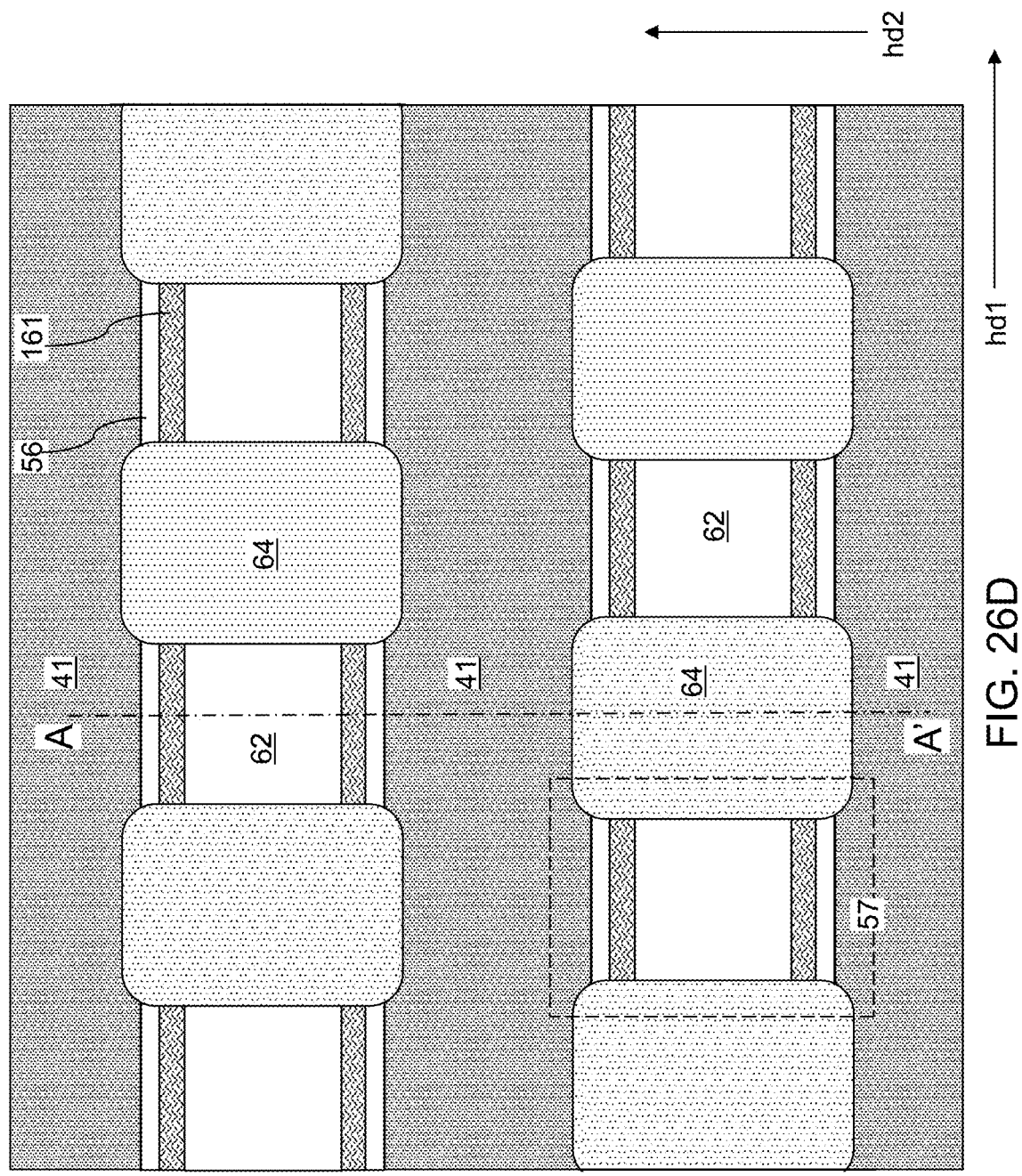
FIG. 26D is a horizontal cross-sectional view along the plane D-D' of 26C. The vertical plane C-C' is the plane of the cross-section for FIG. 26C.

Referring to FIGS. 24A and 24B, a continuous dielectric fill material layer 62L including a dielectric fill material such as silicate glass can be deposited in remaining volumes of the line trenches 149 by a conformal deposition process (such as low pressure chemical vapor deposition) or a self-planarizing deposition process (such as spin coating). The continuous dielectric fill material layer 62L fills the remaining volumes of the line trenches 149, and is deposited over horizontal portions of the sacrificial channel material layer 161L that overlie the topmost insulating strips 71.

Referring to FIGS. 25A and 25B, horizontal portions the continuous dielectric fill material layer 62L, the sacrificial channel material layer 161L, and the gate dielectric material layer 56L that overlie the horizontal plane including top surfaces of the topmost insulating strips 71 can be removed, for example, by a chemical mechanical planarization (CMP) process. Each remaining portion of the continuous dielectric fill material layer 62L in a respective line trench 149 comprises a dielectric core rail 62R.

Each contiguous set of material portions that fills a line trench 149 comprises a line trench fill structure 158. Each line trench fill structure 158 includes two vertical stacks of metallic liners 54L, a gate dielectric material layer 56L which is a patterned portion of the gate dielectric material layer 56L as formed at the processing steps of FIGS. 20A and 20B, a sacrificial channel material layer 161L which is a patterned portion of the sacrificial channel material layer 161L as formed at the processing steps of FIGS. 22A and 22B, and a dielectric core rail 62. A laterally alternating sequence of alternating stacks (31, 41) and line trench fill structures 158 is formed. The alternating stacks (31, 41) (each of which is a vertically-alternating stack) and the line trench fill structures 158 can laterally alternate along the second horizontal direction hd2.

Referring to FIGS. 26A-26D, the processing steps of FIGS. 13A-13D can be performed to form a two-dimensional array of pillar cavities 69 and elongated isolation cavities 169 through the line trench fill structures 158. Subsequently, the processing steps of FIGS. 14A-14D can be performed to form dielectric pillar structures 64 within the volumes of the pillar cavities 69, and to form dielectric wall structures 64' in the elongated isolation cavities 169. The dielectric wall structures 64' laterally extend along the first horizontal direction hd1. Each of the line trenches 149 can be filled with a respective laterally alternating sequence of memory stack assemblies 57 and dielectric pillar structures 64. Each of the memory stack assemblies 57 comprises a respective one of the vertical semiconductor channels 60. The two-dimensional array of dielectric pillar structures 64 can be located in the line trenches 149, and can be laterally offset from, and can be interlaced with, the two-dimensional array of memory stack structures 57. Each line trench 149 can be filled with a respective row of memory stack structures 57 and a respective row of dielectric pillar structures 64 that is interlaced with the respective row of memory stack structures 57.

A two-dimensional array of memory stack assemblies 57 is formed. Each memory stack assembly 57 is a patterned portion of a line trench fill structure 158. Each memory stack assembly 57 includes a sacrificial channel material layer 161 that is a patterned portion of the sacrificial channel material layer 161L, at least one gate dielectric layer 56 (e.g., two gate dielectric layers 56), two vertical stacks of discrete intermediate metallic electrodes 54, and a dielectric core 62 that is a patterned portion of the dielectric core rail 62R. The two gate dielectric layers 56 comprise patterned portions of a gate dielectric material layer 56L within the respective line trench 149. The two vertical stacks of discrete intermediate metallic electrodes 54 comprise patterned portions of two vertical stacks of metallic liners 54L. The two-dimensional array of memory stack assemblies 57 is formed in the line trenches 149, and is interlaced with a two-dimensional array of pillar cavities 69.

Figure 27A:
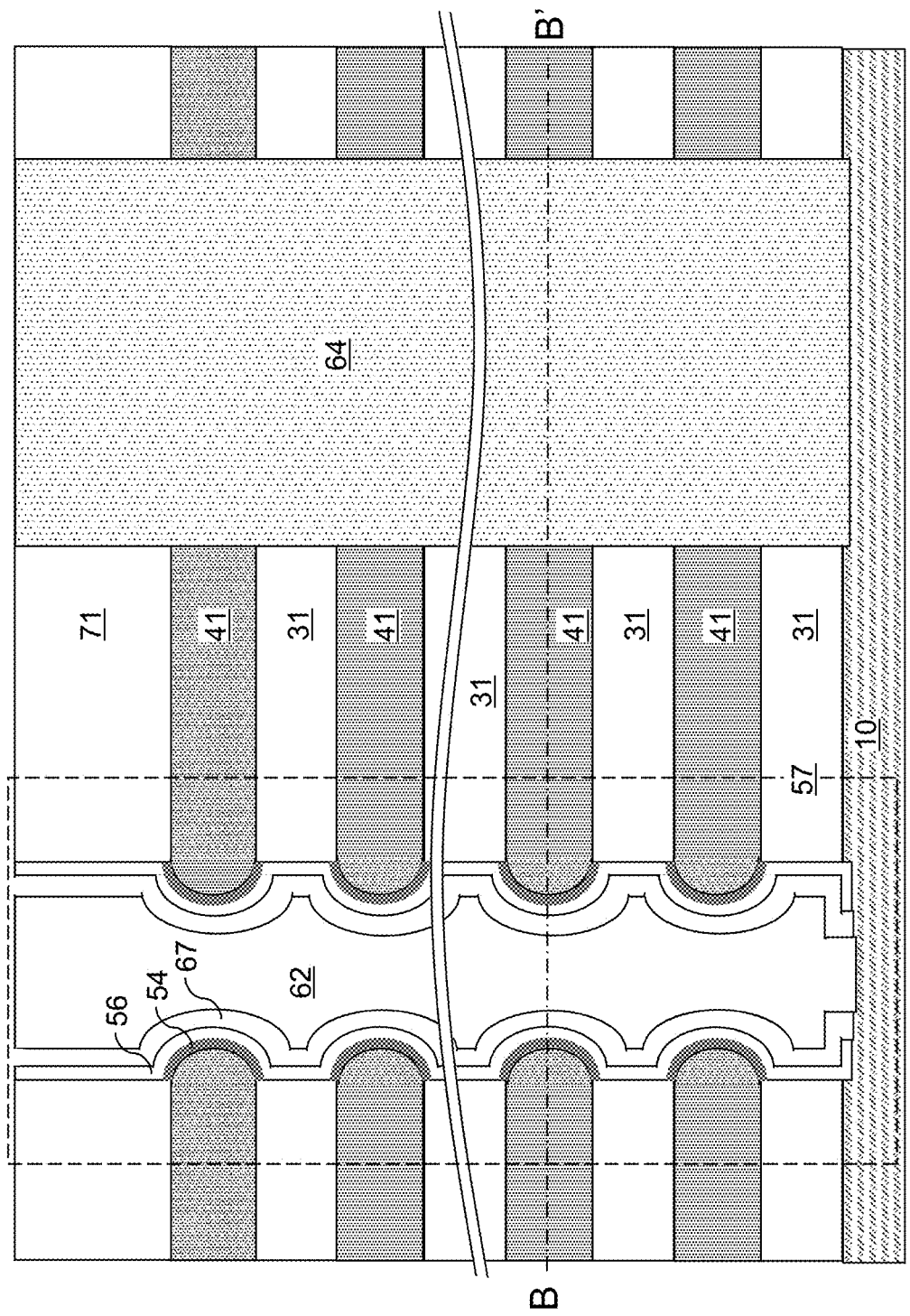
FIG. 27A is a vertical cross-sectional view of a line trench in the alternative embodiment of the first exemplary structure after formation of channel cavities according to the first embodiment of the present disclosure.
Figure 27B:
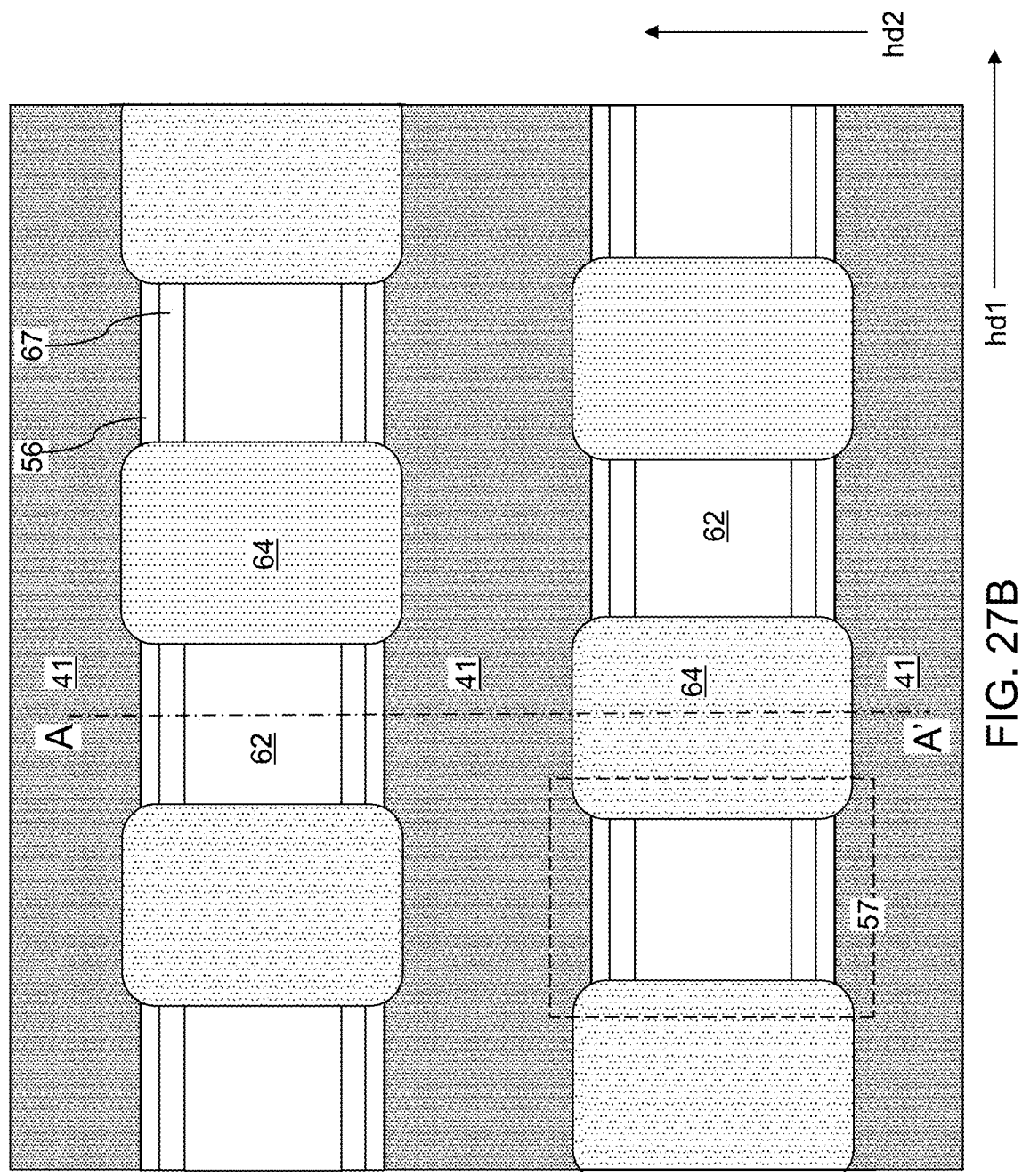
FIG. 27B is a horizontal cross-sectional view along the plane B-B' of 27A. The vertical plane A-A' is the plane of the cross-section for FIG. 27A.

Referring to FIGS. 27A and 27B, channel cavities 67 can be formed in the memory stack assemblies 57 by removing the sacrificial channel material layers 161 selective to the materials of the gate dielectric layers 56, the substrate 8, the dielectric cores 62, and the dielectric pillar structures 64. If the sacrificial channel material layers 161 include amorphous carbon, then an ashing process may be employed to remove the sacrificial channel material layers 161. If the sacrificial channel material layers 161 include polysilicon, then a selective etch process which selectively etches polysilicon compared to the single crystalline silicon of layer 10 of the substrate 8, and to silicon oxide of gate dielectric layers 56 and the dielectric cores 62 may be used.

Figure 28A:
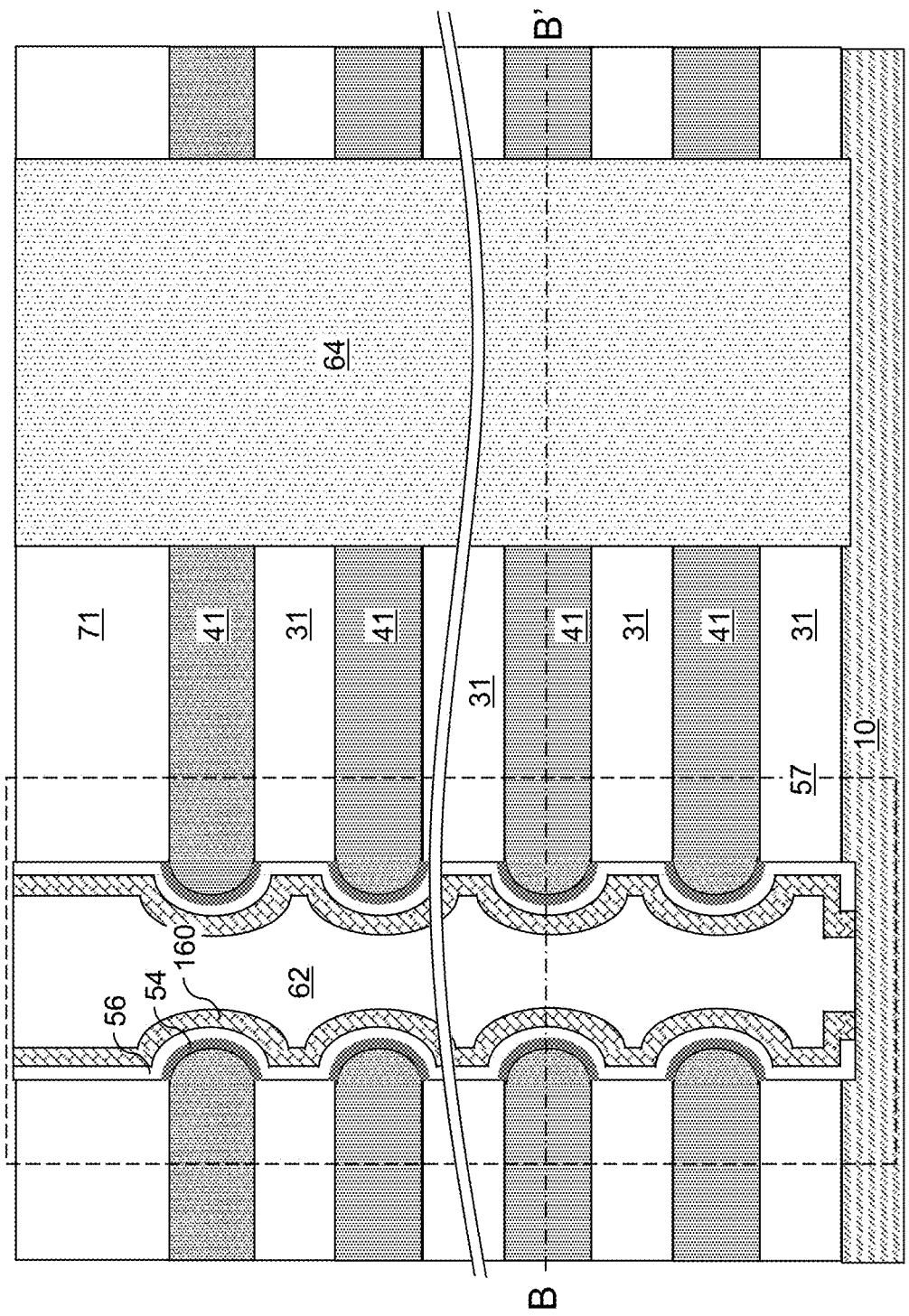
FIG. 28A is a vertical cross-sectional view of a line trench in the alternative embodiment of the first exemplary structure after formation of vertical semiconductor channels according to the first embodiment of the present disclosure.
Figure 28B:
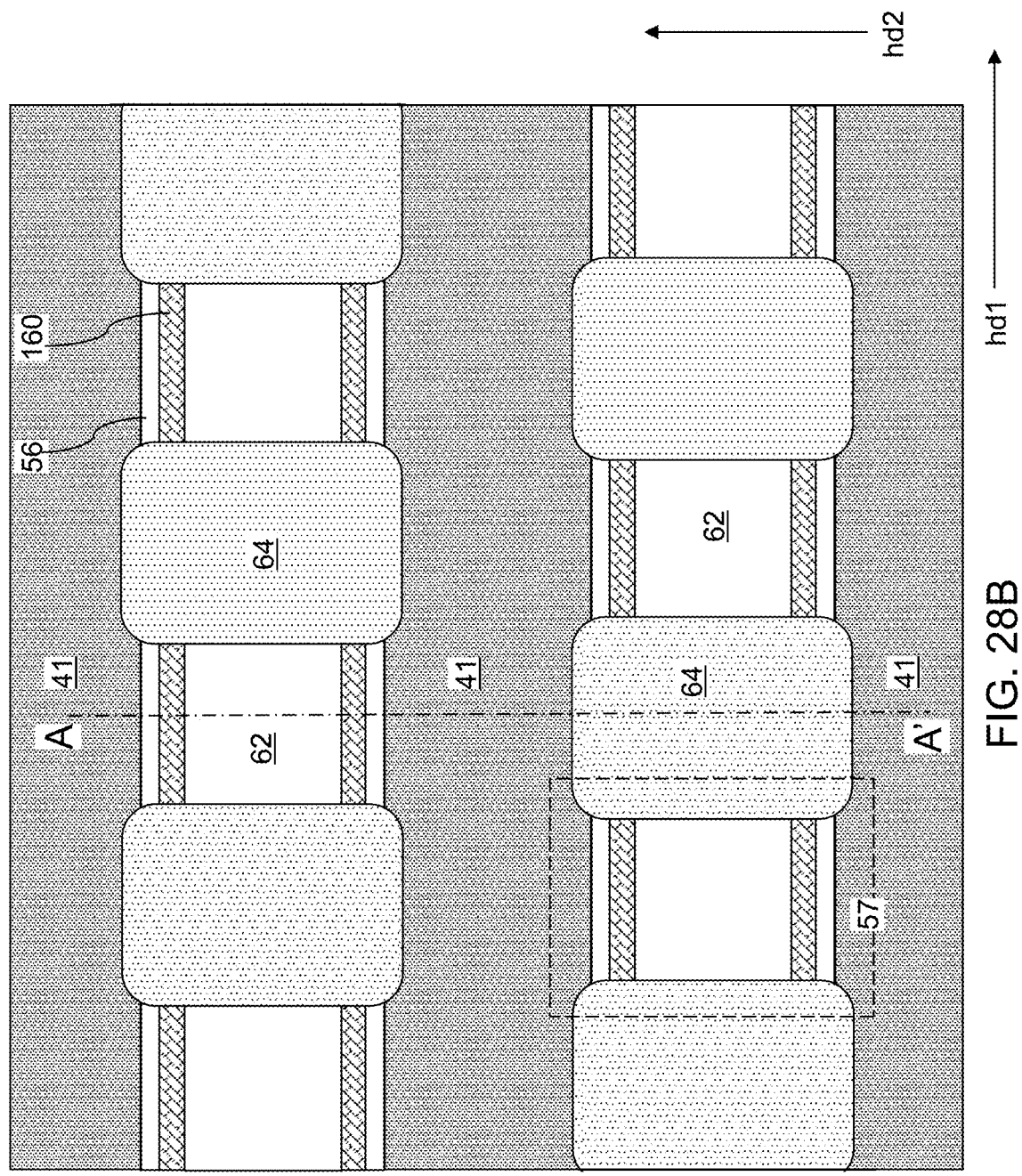
FIG. 28B is a horizontal cross-sectional view along the plane B-B' of 28A. The vertical plane A-A' is the plane of the cross-section for FIG. 28A.

Referring to FIGS. 28A and 28B, vertical semiconductor channels 160 can be formed in the channel cavities 67. A selective epitaxy process can be performed to epitaxially grow a single crystalline semiconductor material (e.g., single crystal silicon) in the channel cavities 67 to form the vertical semiconductor channels 160. Each vertical semiconductor channel 160 can be epitaxially grown directly on the single crystal silicon substrate semiconductor layer (9, 10) through a respective opening in the gate dielectric layers 56. Each vertical semiconductor channel 160 can have a laterally-undulating vertical cross-sectional profile, and can include straight semiconductor channel segments located at levels of the insulating strips 31 and curved semiconductor channel segments located at levels of the vertical stacks of discrete intermediate metallic electrodes 54. In one embodiment, the substrate comprises a semiconductor material layer (comprising a first single crystalline semiconductor material (such as single crystalline silicon)), and the vertical semiconductor channels can comprise, and/or can consist essentially of, a second single crystalline semiconductor material (such as single crystalline silicon having a doping of the first conductivity type) that is in epitaxial alignment with the first single crystalline semiconductor material.

Figure 29:
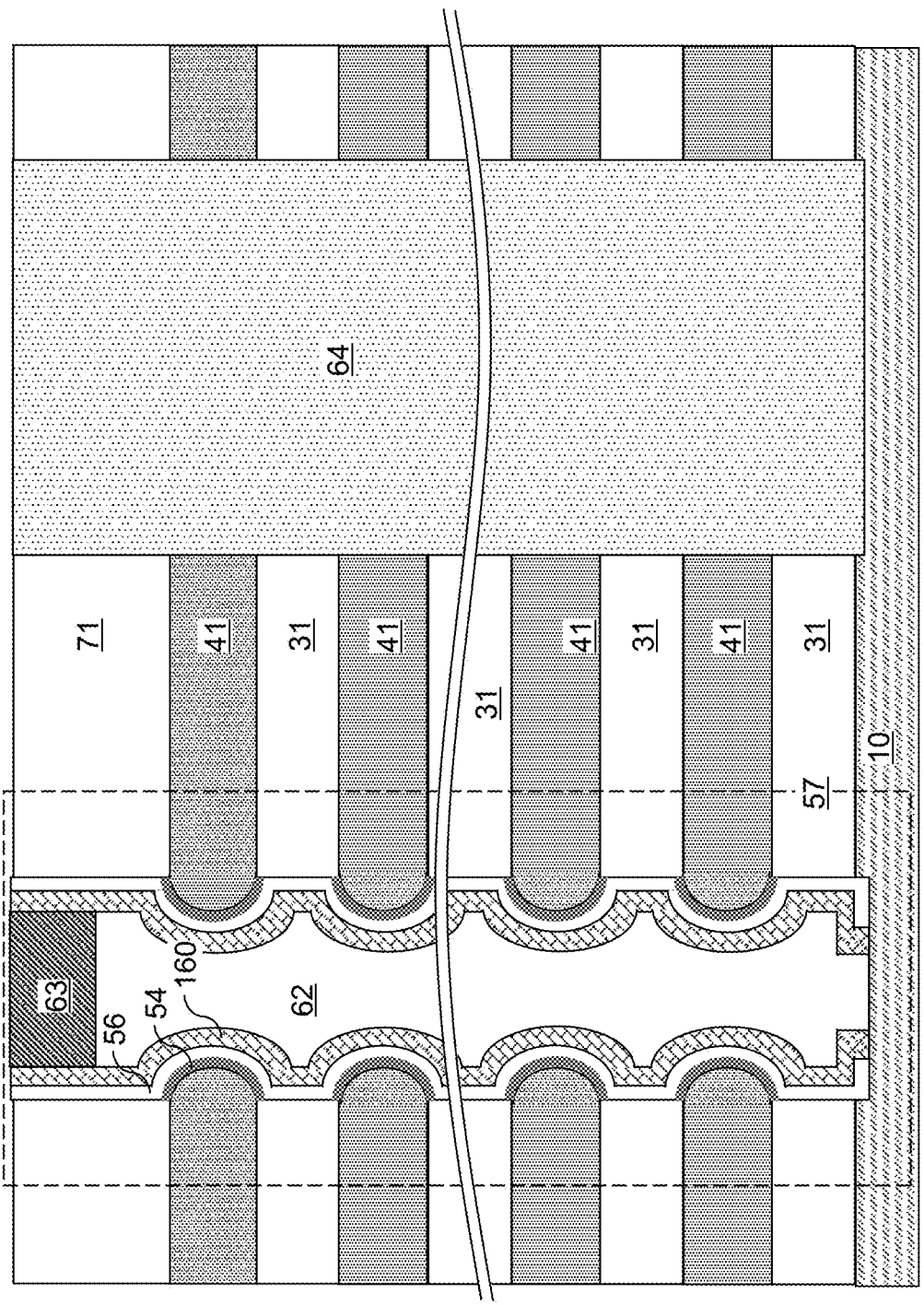
FIG. 29 is a vertical cross-sectional view of a line trench in the alternative embodiment of the first exemplary structure after formation of drain regions according to the first embodiment of the present disclosure.

Referring to FIG. 29, each dielectric core 62 can be vertically recessed to form drain cavities. A doped semiconductor material having a doping of the second conductivity type can be deposited in the drain cavities to form drain regions 63, which can have the same material composition as the drain region rails 63R formed at the processing steps of FIGS. 12A and 12B.

Figure 30A:
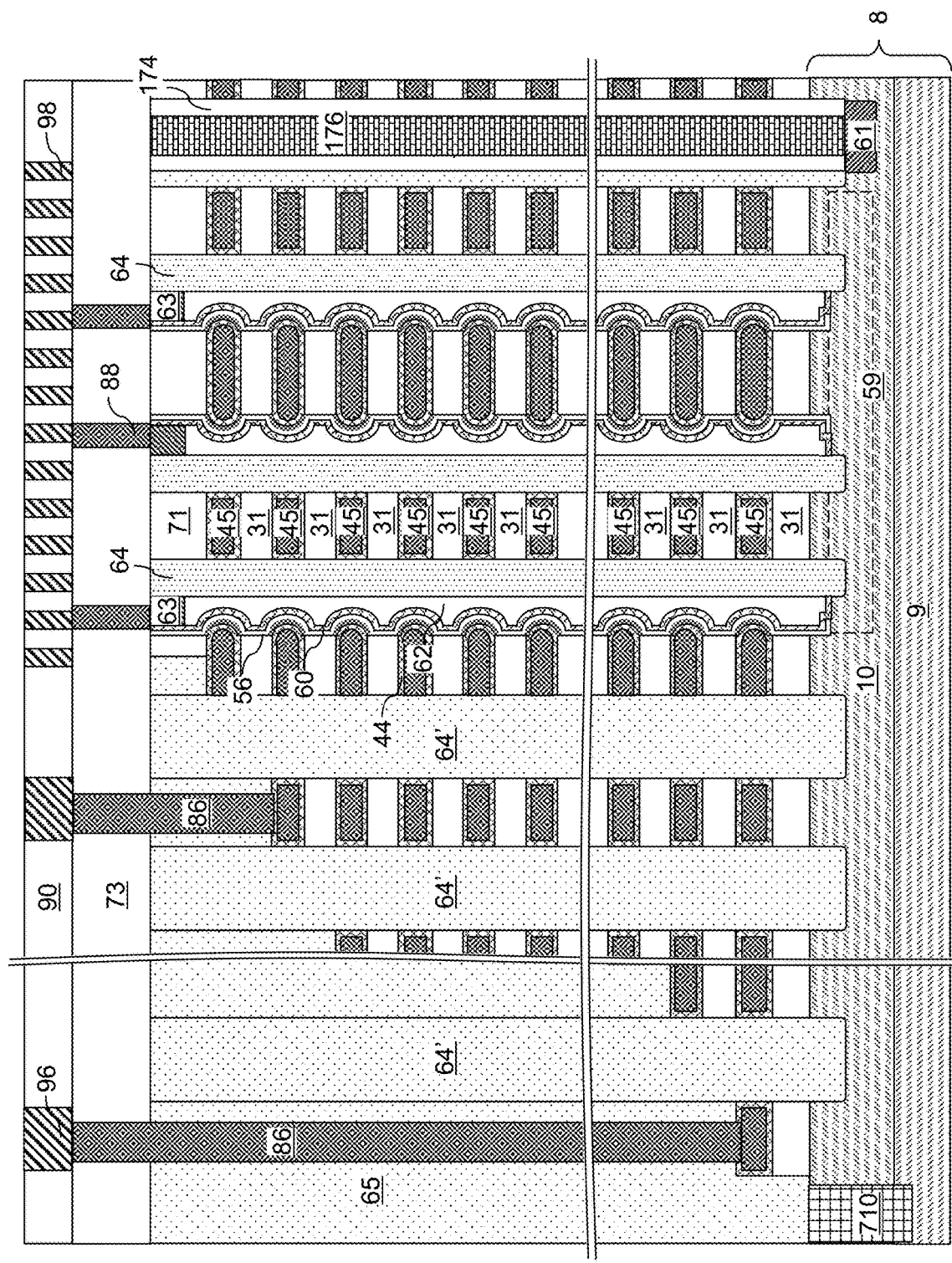
FIG. 30A is a schematic vertical cross-sectional view of the alternative embodiment of the first exemplary structure after formation of word line contact via structures according to the first embodiment of the present disclosure.
Figure 30B:
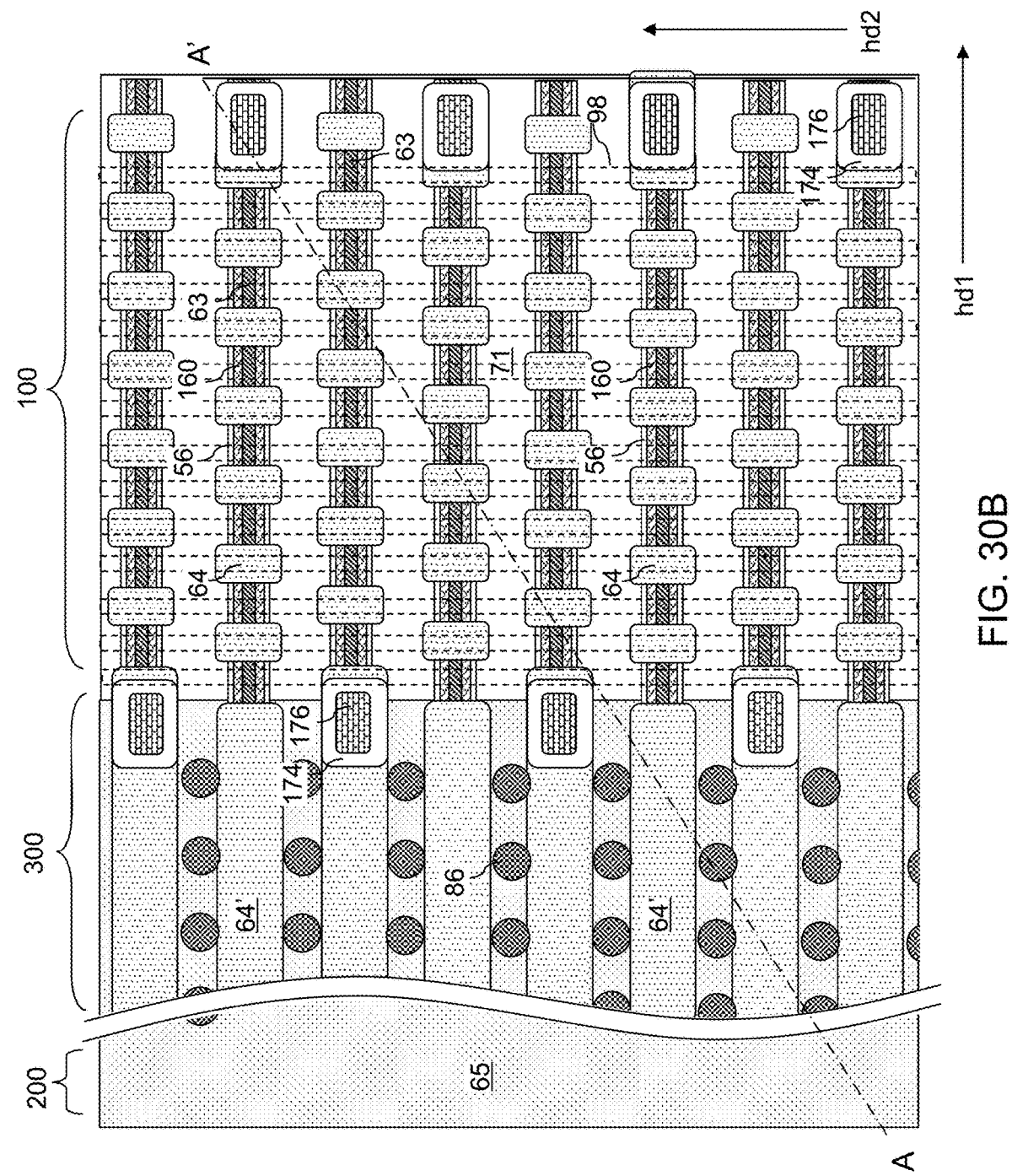
FIG. 30B is a top-down view of the first exemplary structure of FIG. 30A. The vertical plane A-A' is the plane of the cross-section for FIG. 30A.

Referring to FIGS. 30A and 30B, the processing steps of FIGS. 15A and 15B, 16, 17A and 17B, 18, and 19A and 19B can be performed.

Referring collectively to FIGS. 1-30B and according to various embodiments of the present disclosure, a three-dimensional memory device is provided, which comprises: alternating stacks of insulating strips 31 and electrically conductive strips 41 located over a substrate 8 and laterally spaced apart from each other by line trenches 149 laterally extending along a first horizontal direction hd1 and spaced apart from each other along a second horizontal direction hd2; a two-dimensional array of memory stack assemblies 57 located in the line trenches 149; and a two-dimensional array of dielectric pillar structures 64 located in the line trenches 149 and laterally offset from, and interlaced with, the two-dimensional array of memory stack assemblies 57, wherein each line trench 149 is filled with a respective row of memory stack assemblies 57 and a respective row of dielectric pillar structures 64 that is interlaced with the respective row of memory stack assemblies 57, wherein each memory stack assembly 57 comprises a vertical semiconductor channel (60 or 160), at least one gate dielectric layer 56, and two vertical stacks of discrete intermediate metallic electrodes 54; each of the electrically conductive strips 45 is laterally spaced from each memory stack assembly 57 by a respective ferroelectric dielectric layer 44; and each of the discrete intermediate metallic electrodes 54 has a greater contact area with a respective at least one gate dielectric layer 56 than with the respective ferroelectric dielectric layer 44.

In one embodiment, each ferroelectric dielectric layer 44 comprises a horizontally-extending portion that contacts a horizontal surface of a respective one of the insulating strips 31. In one embodiment, each of the discrete intermediate metallic electrodes 54 comprises a concave outer sidewall that contacts a convex inner sidewall the ferroelectric dielectric layer 44. In one embodiment, the at least one gate dielectric layer 56 contacts a respective vertical stack of discrete intermediate metallic electrodes 54 within the two vertical stacks of discrete intermediate metallic electrodes 54.

In one embodiment, the at least one gate dielectric layer 56 has a laterally-undulating vertical cross-sectional profile that includes straight gate dielectric segments that contact a respective one of the insulating strips 31 and curved gate dielectric segments contacting a respective vertical stack of discrete intermediate metallic electrodes 54. In one embodiment, each of the curved gate dielectric segments comprises a concave outer sidewall that contacts a respective one of the discrete intermediate metallic electrodes 54 and a convex inner sidewall that contacts a concave sidewall segment of the vertical semiconductor channel (60 or 160). In one embodiment, the vertical semiconductor channel (60 or 160) has a laterally-undulating vertical cross-sectional profile, and includes straight semiconductor channel segments located at levels of the insulating strips 31 and curved semiconductor channel segments located at levels of the vertical stacks of discrete intermediate metallic electrodes 54. In one embodiment, the vertical semiconductor channel 60 comprises a polycrystalline semiconductor material.

In one embodiment, the substrate 8 comprises a single crystalline semiconductor material (e.g., single crystal silicon layer 10); and the vertical semiconductor channel 160 comprises a single crystalline semiconductor material that is in epitaxial alignment with the single crystalline semiconductor material of the substrate.

In one embodiment, the two vertical stacks of discrete intermediate metallic electrodes 54 consist essentially of an elemental metal. The metal can consist essentially of a single transition metal element that is selected from iridium, ruthenium, palladium, osmium, rhenium, molybdenum, cobalt or tungsten.

In one embodiment, each discrete intermediate metallic electrode 54 within the two vertical stacks of discrete intermediate metallic electrodes 54 comprises: an outer concave sidewall in contact with a respective one of the ferroelectric dielectric layers 44; and an inner convex sidewall in contact with the at least one gate dielectric layer 56. In one embodiment, each discrete intermediate metallic electrode 54 within the two vertical stacks of discrete intermediate metallic electrodes 54 comprises: an upper vertical sidewall connecting an upper periphery of the inner convex sidewall and an upper periphery of the outer concave sidewall; and a lower vertical sidewall connecting a lower periphery of the inner convex sidewall and a lower periphery of the outer concave sidewall. In one embodiment, each of the memory stack assemblies 57 comprises a dielectric core 62 contacting convex surfaces of the vertical semiconductor channel (60 or 160).

Figure 31:
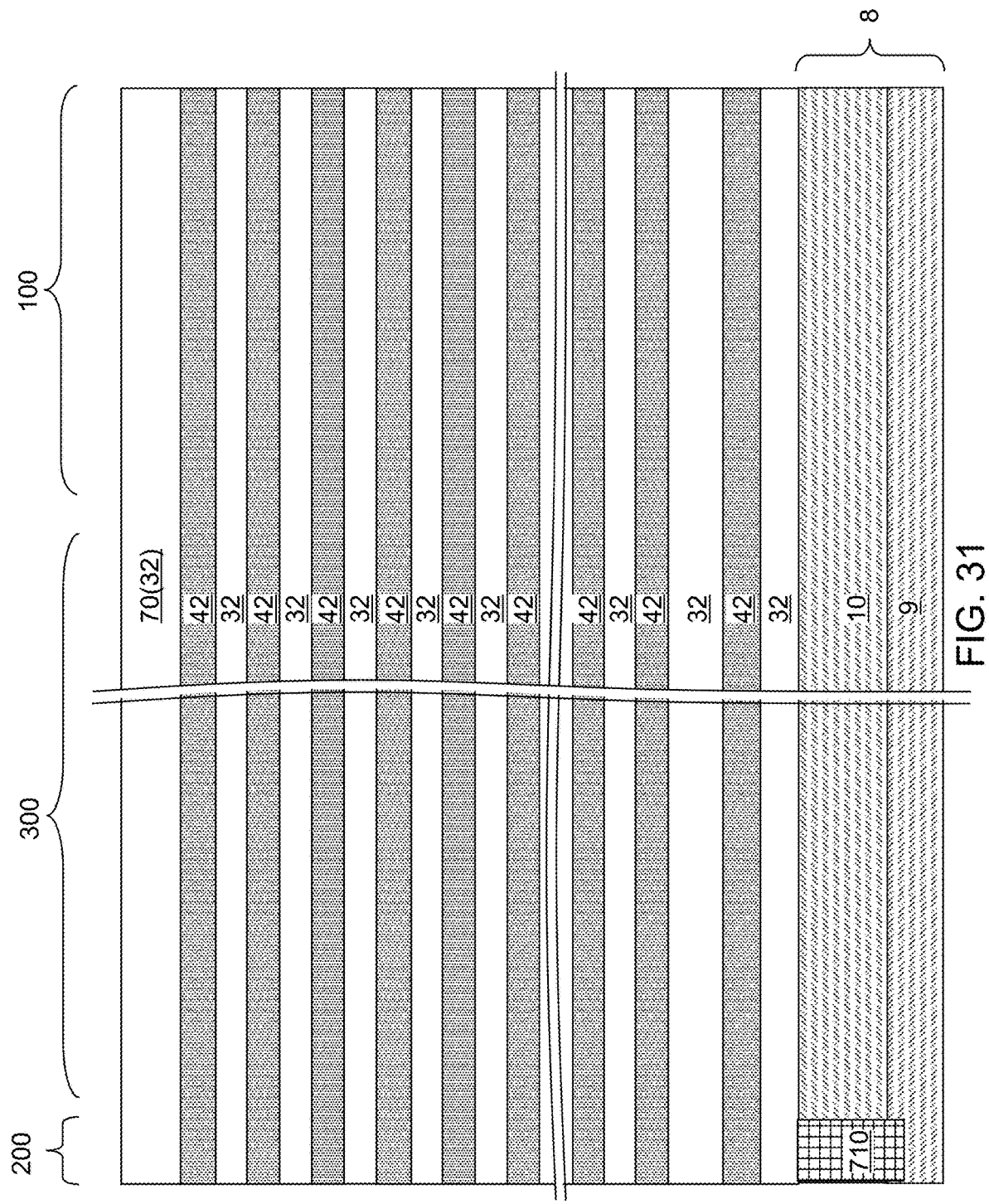
FIG. 31 is a schematic vertical cross-sectional view of a second exemplary structure after formation of an alternating stack of insulating layers and sacrificial material layers according to a second embodiment of the present disclosure.

Referring to FIG. 31, a second exemplary structure according to a second embodiment of the present disclosure is illustrated, which may be the same as the first exemplary structure illustrated in FIG. 2. In one alternative embodiment, the peripheral device region 200 containing the at least one semiconductor device 710 for a peripheral circuitry may be located under the memory array region 100 in a CMOS under array configuration. In another alternative embodiment, the peripheral device region 200 may be located on a separate substrate which is subsequently bonded to the memory array region 100.

Figure 32:
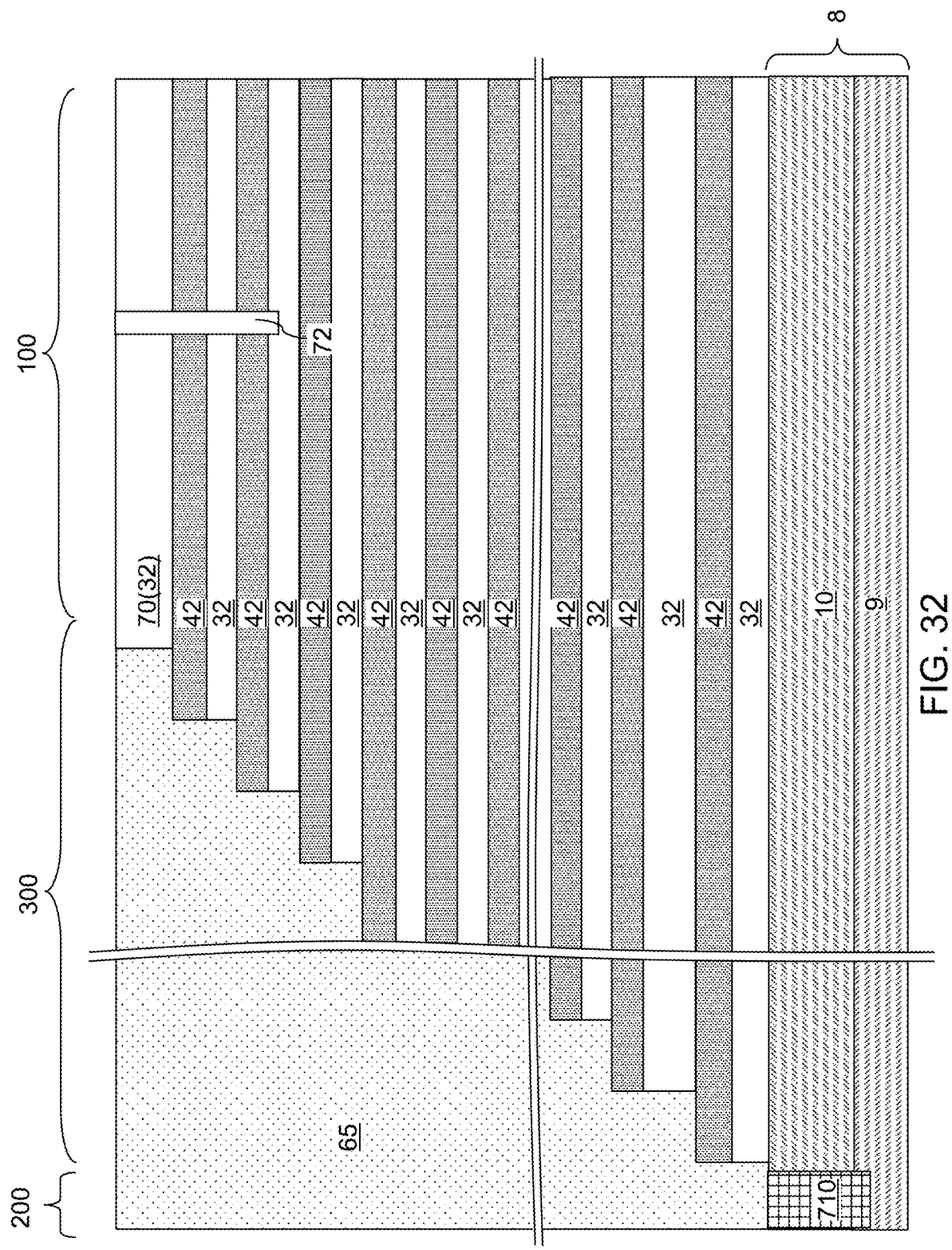
FIG. 32 is a schematic vertical cross-sectional view of the second exemplary structure after formation of stepped terraces and a retro-stepped dielectric material portion according to the second embodiment of the present disclosure.

Referring to FIG. 32, the processing steps of FIG. 3 can be performed on the second exemplary structure to form stepped surfaces and a retro-stepped dielectric material portion 65 in each staircase region 300. Optionally, drain select level isolation structures 72 can be formed through the topmost insulating layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the topmost insulating layer 70.

Figure 33A:
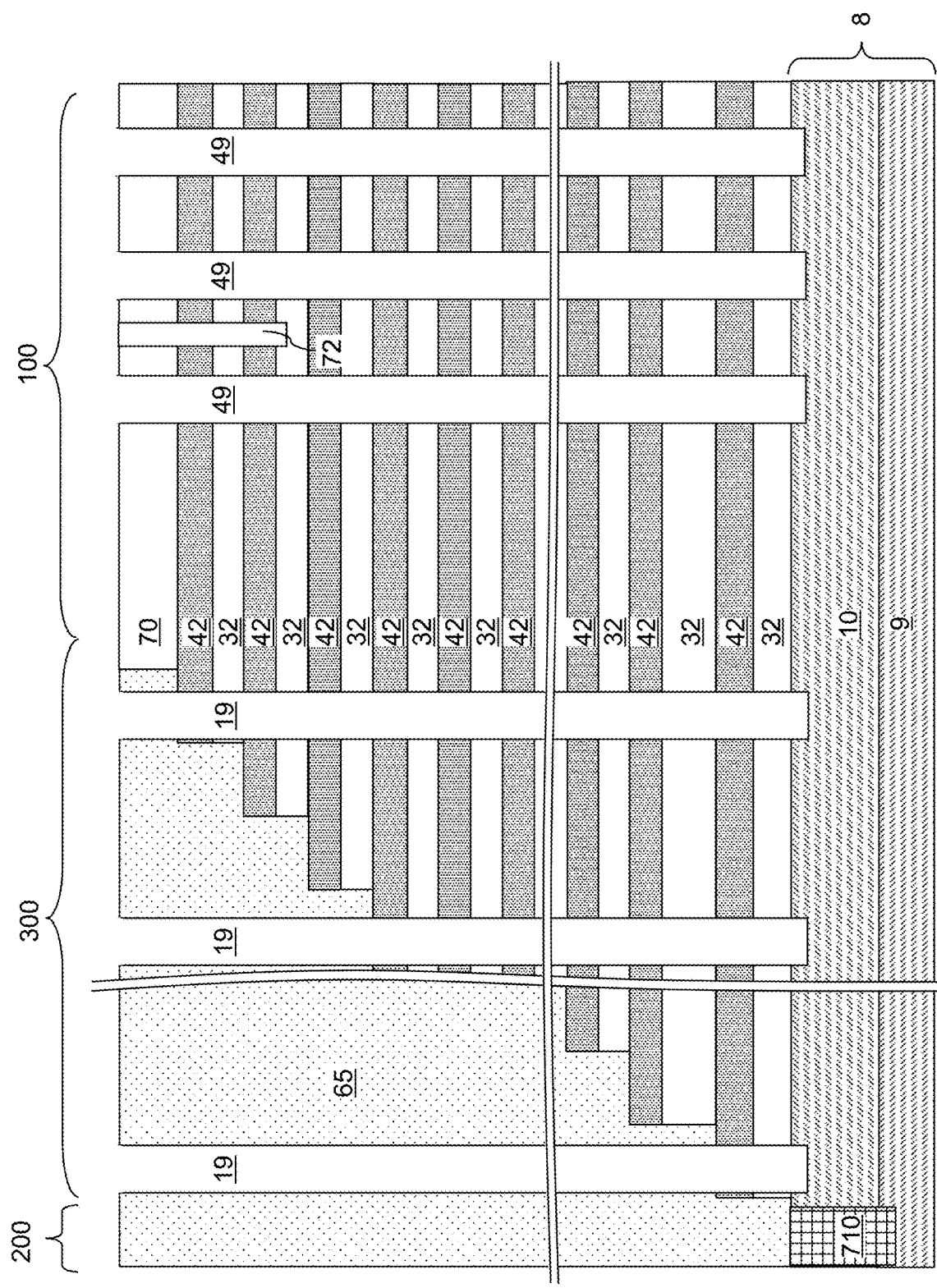
FIG. 33A is a schematic vertical cross-sectional view of the second exemplary structure after formation of memory openings and support openings according to the second embodiment of the present disclosure.
Figure 33B:
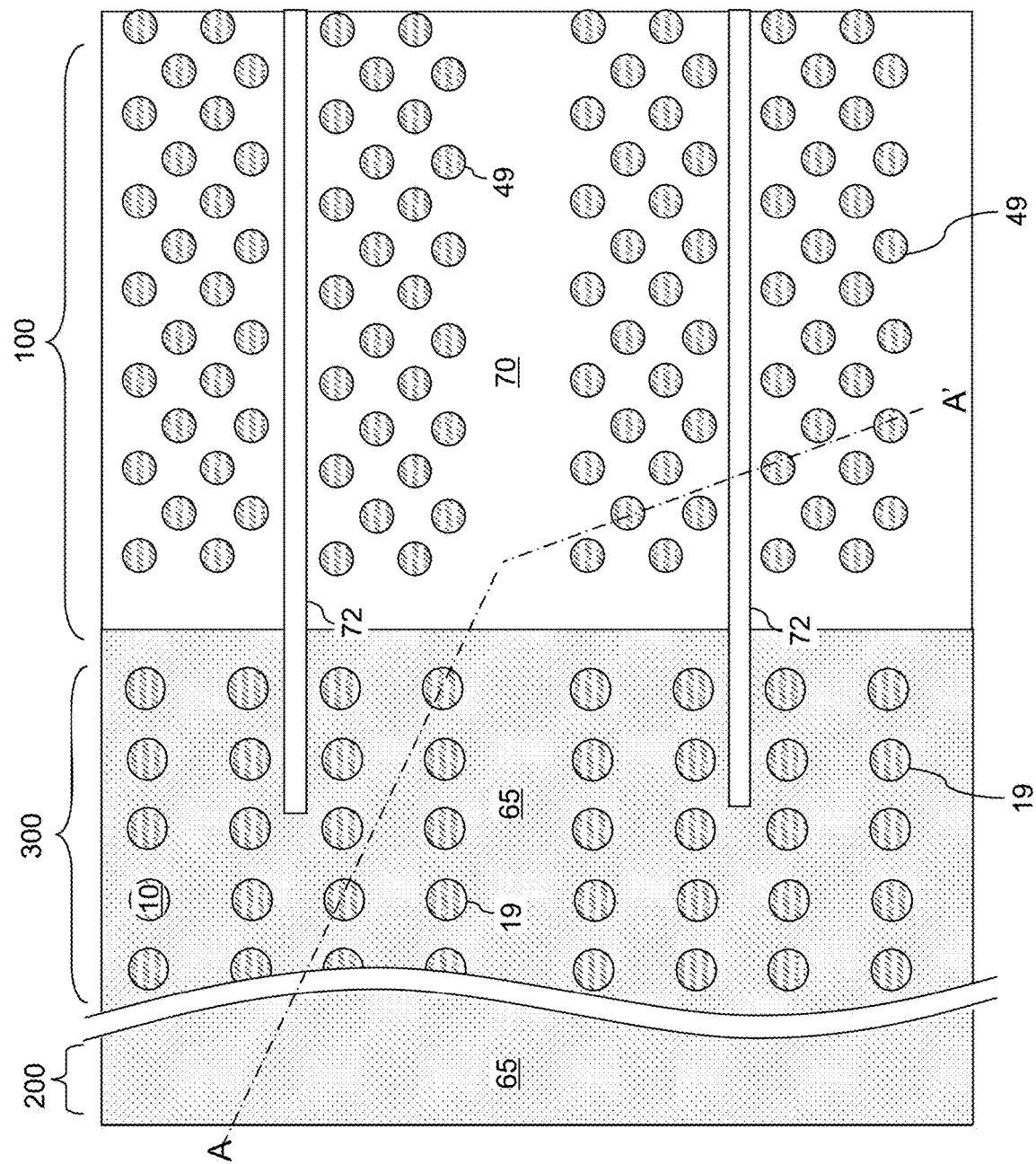
FIG. 33B is a top-down view of the second exemplary structure of FIG. 33A. The vertical plane A-A' is the plane of the cross-section for FIG. 33A.

Referring to FIGS. 33A, 33B, and 34A, a lithographic material stack (not shown) including at least a photoresist layer can be formed over the topmost insulating layer 70 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the topmost insulating layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the topmost insulating layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the upper substrate semiconductor layer 10. In one embodiment, an overetch into the upper substrate semiconductor layer 10 may be optionally performed after the top surface of the upper substrate semiconductor layer 10 is physically exposed at a bottom of each memory opening 49 and each support opening 19. The overetch may be performed prior to, or after, removal of the lithographic material stack. In other words, the recessed surfaces of the upper substrate semiconductor layer 10 may be vertically offset from the un-recessed top surfaces of the upper substrate semiconductor layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the upper substrate semiconductor layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. The lower substrate semiconductor layer 9 and the upper substrate semiconductor layer 10 collectively constitutes a substrate 8, which can be a semiconductor substrate. Alternatively, the upper substrate semiconductor layer 10 may be omitted, and the memory openings 49 and the support openings 19 can be extend to a top surface of the lower substrate semiconductor layer 9.

Each memory opening 49 extends through the topmost insulating layer 70, the alternating stack (32, 42), and optionally into an upper portion of the upper substrate semiconductor layer 10. Each support opening 19 can extend through the retro-stepped dielectric material portion 65, a subset of layers in the alternating stack (32, 42), and optionally through the upper portion of the upper substrate semiconductor layer 10. The recess depth of the bottom surface of each memory opening with respect to the top surface of the upper substrate semiconductor layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 34B, at least one isotropic etch process etches is performed to laterally recess the insulating layers 32 relative to the sacrificial material layers 42. The at least one isotropic etch process etches the material of the insulating layers 32 at a higher etch rate than a material of the sacrificial material layers 42. According to an aspect of the present disclosure, the at least one isotropic etch process can form convex sidewalls on the sacrificial material layers 42 by collaterally etching the material of the sacrificial material layers 42 while laterally recessing the insulating layers 32. For example, if the insulating layers 32 include silicon oxide and if the sacrificial material layers 42 include silicon nitride, a wet etch process employing an organic HF-containing etchant (i.e., hydrofluoric acid and an organic additive) that enables collateral etching of silicon nitride. The amount of the organic additive is selected such that the selectivity of the etchant between silicon oxide and silicon nitride can be in a range from 1.1 to 10, such as from 2 to 6. In other words, the etch rate for silicon oxide can be greater than the etch rate for silicon nitride by a factor in a range from 1.1 to 10. Organic HF-containing etchants include, for example, a mixture of hydrofluoric acid and a polyol (such as ethylene glycol, propylene glycol, or a glycerol). Additional polyols that can be employed in the organic HF-containing etchant include carboxylic acid polyols such as glyceric acid (2,3-dihydroxypropanoic acid), 2,3-dihydroxybutanoic acid, and 3,4-dihydroxy-butanoic acid. The amount of the organic additive can be selected to provide a suitable etch rate ratio between silicon oxide and silicon nitride. In one embodiment, the at least one isotropic etch process may include a plurality of isotropic etch process providing different etch ratios between silicon oxide and silicon nitride. For example, a first isotropic etch process having a low etch rate ratio (for example, 1.5) between silicon oxide and silicon nitride can be performed to laterally recess sidewalls of the sacrificial material layers with a vertical center segment, a tapered upper segment, and a tapered lower segment. A second isotropic etch process having a medium etch rate ratio (for example, 2) can be subsequently performed to increase the taper angle at the top end and at the bottom end of each recessed sidewall of the sacrificial material layers 42. A third isotropic etch process having a high etch rate ratio (for example, 4) can be subsequently performed to increase the taper angle at the top end and at the bottom end of each recessed sidewall of the sacrificial material layers 42. The resulting vertical cross-sectional profile of the sidewalls of the sacrificial material layers 42 can be convex. The resulting vertical cross-sectional profile of the sidewalls of the insulating layers 32 can be vertical. The convex sidewalls of the sacrificial material layers 42 protrude inward laterally in each of the memory openings 49 after the at least one isotropic etch process.

Figure 34C:
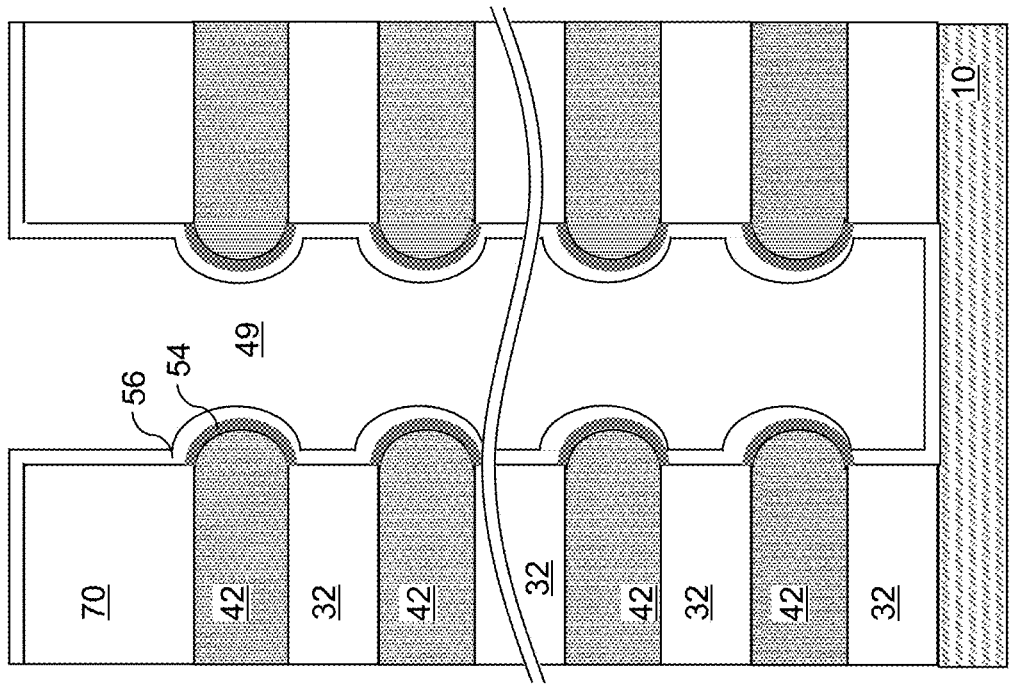

Referring to FIG. 34C, a selective metal deposition process can be performed to selectively grow metal from the physically exposed surfaces of the sacrificial material layers 42 without growth of the metal from the physically exposed surfaces of the insulating layers 32. A metal-containing precursor gas that induces nucleation of the metal on the physically exposed surfaces of sacrificial material layers 42 without inducing nucleation of the metal on the physically exposed surfaces of the insulating layers 32. Generally, any selective metal deposition process can be employed which can selectively deposit on the physically exposed surfaces of the sacrificial material layers 42 while suppressing deposition of the metal on the surfaces of the insulating layers 32. The metal can consist essentially of at least one transition metal element (such as a single transition metal element) that is selected from iridium, ruthenium, palladium, osmium, rhenium, molybdenum, cobalt or tungsten. For example, ruthenium may be selectively deposited by metal organic atomic layer deposition (MOALD). In an illustrative example, the insulating layers 32 can include silicon oxide and the sacrificial material layers 42 can include silicon nitride, and the metal-containing precursor gas can include ruthenium tetroxide ($RuO_4$). In this case, atomic layer deposition process including an alternating sequence of a precursor adsorption step (i.e., a ruthenium tetroxide adsorption step) and a reduction step can be employed. An atomic layer of ruthenium tetroxide can be adsorbed on silicon nitride surfaces or on surfaces of previously deposited ruthenium in each precursor adsorption step. The atomic layer of ruthenium tetroxide can be reduced to ruthenium in each reduction step.

Discrete intermediate metallic electrodes 54 are formed by selectively growing a metallic material on physically exposed surfaces of the sacrificial material layers 42 in the memory openings 49. A vertical stack of discrete intermediate metallic electrodes 54 can be formed within each memory opening 49. Each discrete intermediate metallic electrode 54 can include, and/or can consist essentially of, an elemental metal. The metallic material can consist essentially of at least one transition metal element (such as a single transition metal element) that is selected from iridium, ruthenium, palladium, osmium, rhenium, molybdenum, cobalt or tungsten. In one embodiment, the elemental metal can be ruthenium. The discrete intermediate metallic electrodes 54 are formed directly on the convex sidewalls of the sacrificial material layers 42. Each discrete intermediate metallic electrode 54 comprises an outer concave sidewall in contact with a respective one of the sacrificial material layers 42, and an inner convex sidewall that is physically exposed. Each discrete intermediate metallic electrode 54 can comprise an upper vertical sidewall 54A connecting an upper periphery of the inner convex sidewall and an upper periphery of the outer concave sidewall, and a lower vertical sidewall 54B connecting a lower periphery of the inner convex sidewall and a lower periphery of the outer concave sidewall. The upper vertical sidewall 54A can contact a portion of a sidewall of an insulating layer 32, and the lower vertical sidewall 54B can contact a portion of a sidewall of another insulating layer 32. The thickness of the discrete intermediate metallic electrode 54 can be uniform throughout, and can be in a range from 2 nm to 20 nm, such as from 3 nm to 12 nm, although lesser and greater thicknesses can also be employed.

Figure 34D:
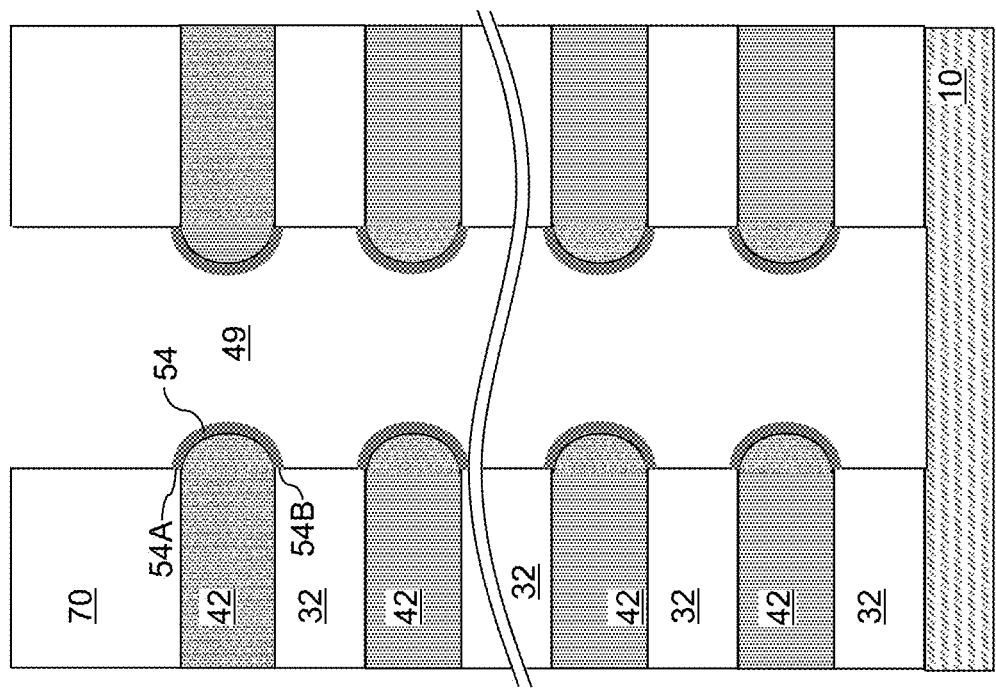

Referring to FIG. 34D, a gate dielectric layer 56 can be formed by conformal deposition of a gate dielectric material. The gate dielectric layer 56 can include silicon oxide, a dielectric metal oxide (such as aluminum oxide), or a combination thereof. The thickness of the gate dielectric layer 56 can be in a range from 1 nm to 12 nm, such as from 2 nm to 6 nm, although lesser and greater thicknesses can also be employed.

Figure 34F:
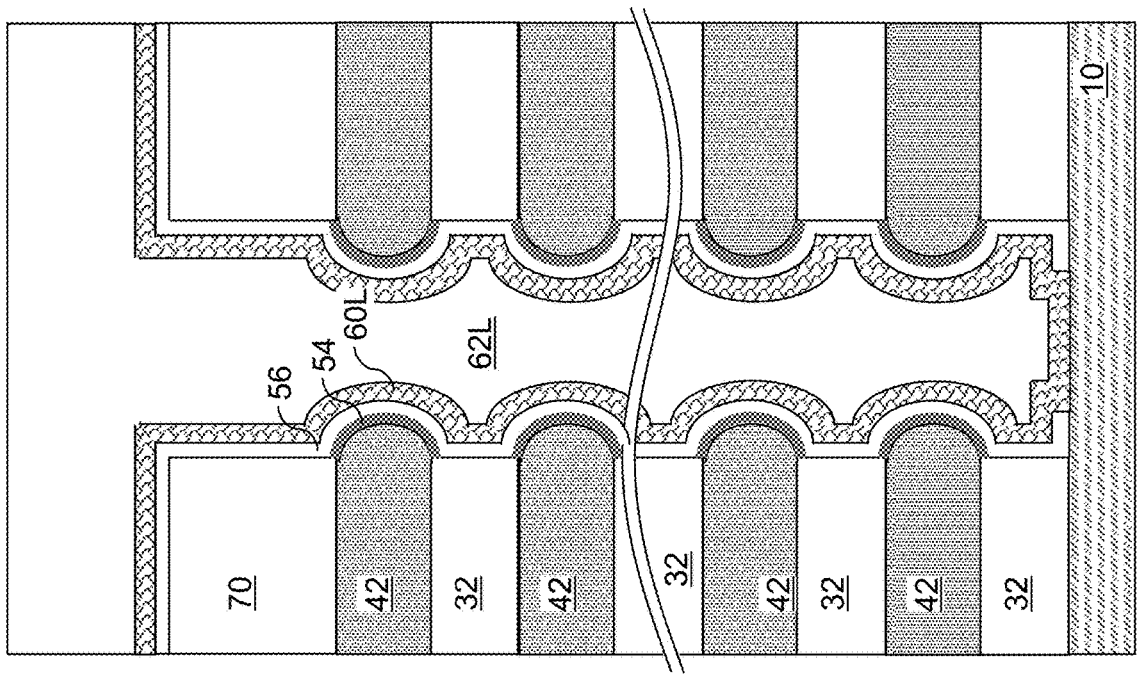
Figure 34E:
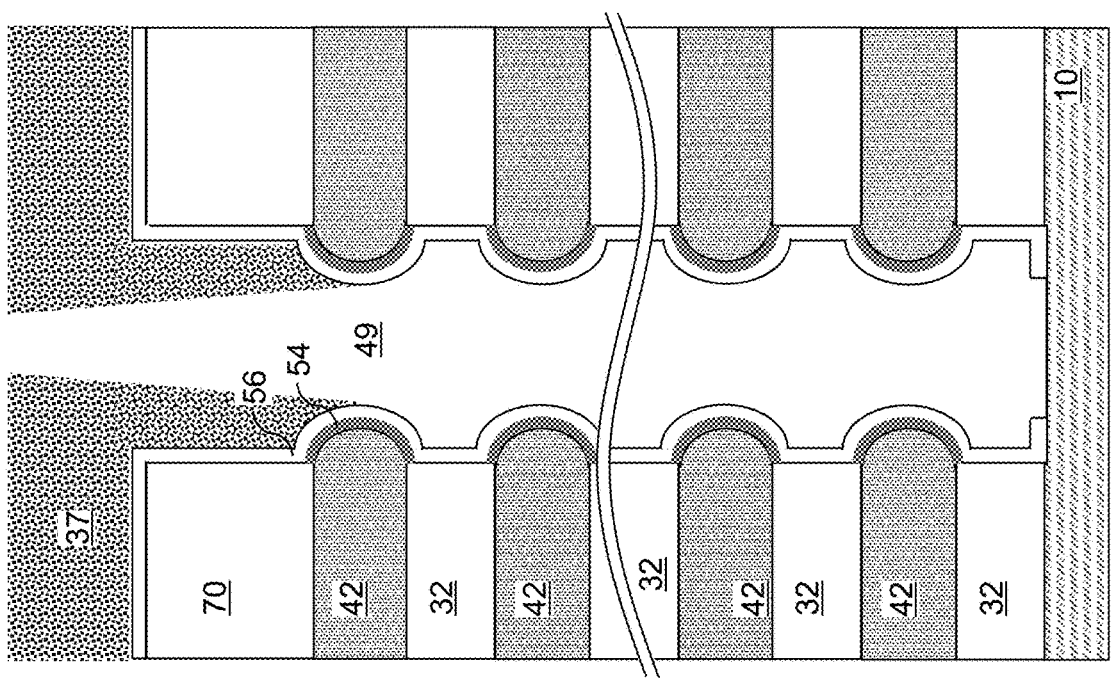

Referring to FIG. 34E, an optional opening is formed through the gate dielectric layer 56 at the bottom of each memory opening 49. For example, a patterning film 37 can be anisotropically deposited to over the top surface of the topmost insulating layer 70 and over the topmost one of the laterally protruding portions of the gate dielectric layer 56. The patterning film 37 can include an amorphous carbon-based etch resistant material such as Advanced Patterning Film™ provided by Applied Materials, Inc™. An anisotropic etch process can be performed to etch through a horizontal portion of the gate dielectric layer 56 at the bottom of each memory opening 49. A top surface of the substrate 8, such as a top surface of the upper substrate semiconductor layer 10, can be physically exposed within each opening in the gate dielectric layer 56 at the bottom of each memory opening 49. The patterning film 37 can be subsequently removed, for example, by ashing. Alternatively, a sacrificial cover material layer can be conformally deposited in lieu of the patterning film 37, and may be employed as a protective material layer during formation of the opening in the gate dielectric layer 56 at the bottom of each memory opening 49. The sacrificial cover material layer may include amorphous carbon or any other sacrificial material that can be removed selective to the material of the gate dielectric layer 56, and can be removed after formation of the opening in the gate dielectric layer 56, for example, by ashing.

Referring to FIG. 34F, a semiconductor channel material layer 60L can be deposited over the gate dielectric layer 56 by a conformal deposition process. The semiconductor channel material layer 60L can extend through the openings in the gate dielectric layer 56, and can directly contact physically exposed top surfaces of the upper substrate semiconductor layer 10. The semiconductor channel material layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L includes amorphous silicon or polysilicon. The semiconductor channel material layer 60L can be formed by a conformal deposition method such as low pressure chemical vapor deposition (LPCVD). In one embodiment, the semiconductor channel material layer 60L can be formed by conformally depositing a conformal polycrystalline semiconductor material layer over the gate dielectric layer 56. The thickness of the semiconductor channel material layer 60L can be in a range from 2 nm to 20 nm, such as from 3 nm to 10 nm, although lesser and greater thicknesses can also be employed. In one embodiment, the semiconductor channel material layer 60L can have a doping of the first conductivity type, which is the same conductivity type as the conductivity type of the doping of the upper substrate semiconductor layer 10. In one embodiment, the semiconductor channel material layer 60L can comprise a semiconducting material including electrical dopants at an atomic concentration in a range from $1\times10^{14}/cm^3$ to $1\times10^{18}/cm^3$.

A continuous dielectric fill material layer 62L including a dielectric fill material such as silicate glass can be deposited in remaining volumes of the memory openings 49 by a conformal deposition process (such as low pressure chemical vapor deposition) or a self-planarizing deposition process (such as spin coating). The continuous dielectric fill material layer 62L fills the remaining volumes of the memory openings 49, and is deposited over horizontal portions of the semiconductor channel material layer 60L that overlie the topmost insulating layer 70.

Referring to FIG. 34G, the horizontal portion of the continuous dielectric fill material layer 62L can be removed, for example, by a recess etch from above the top surface of the semiconductor channel material layer 60L. Further, the material of the continuous dielectric fill material layer 62L can be vertically recessed selective to the semiconductor material of the semiconductor channel material layer 60L into each memory opening 49 down to a depth between a first horizontal plane including the top surface of the topmost insulating layer 70 and a second horizontal plane including the bottom surface of the topmost insulating layer 70. Each remaining portion of the continuous dielectric fill material layer 62L constitutes a dielectric core 62.

Figure 35:
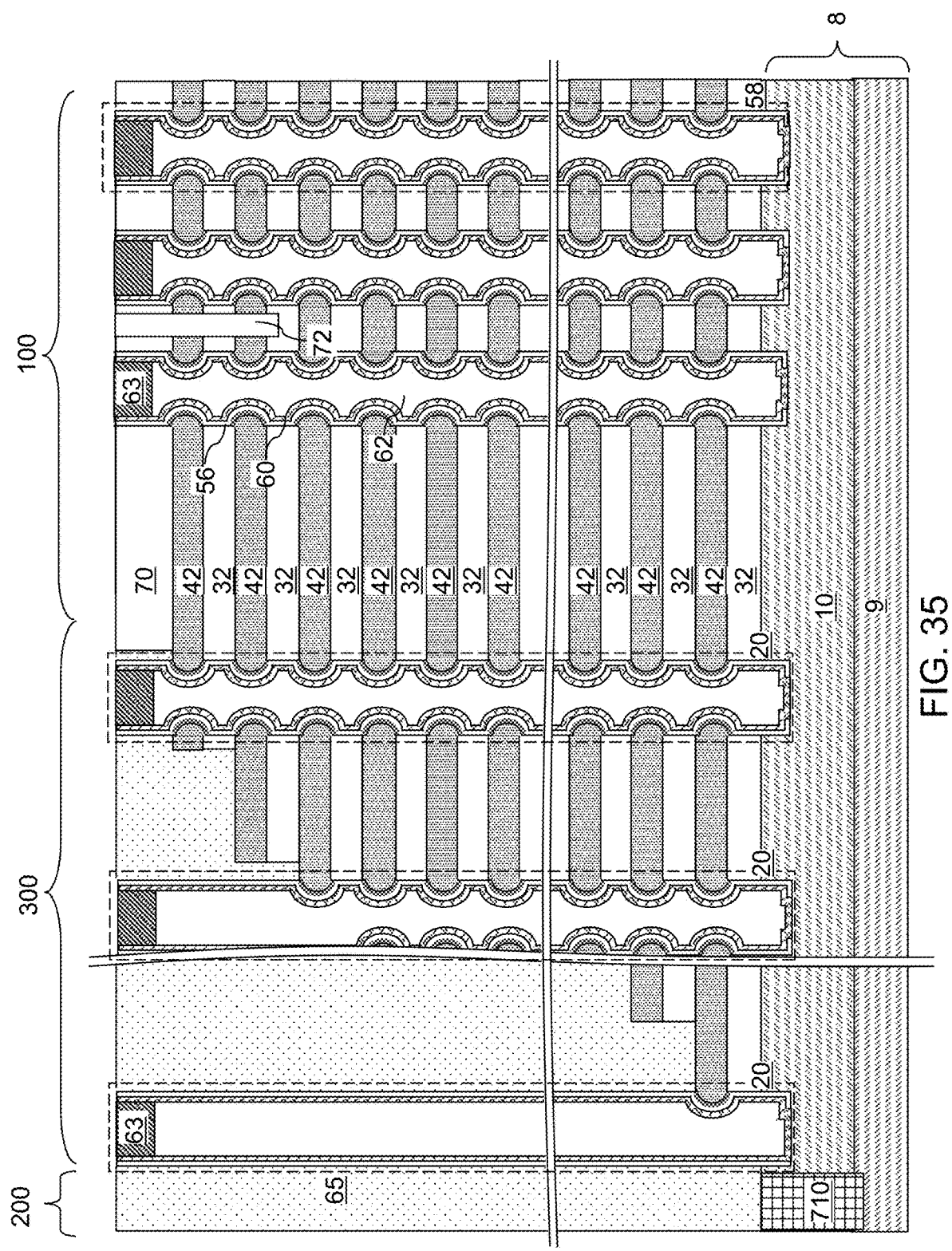
FIG. 35 is a schematic vertical cross-sectional view of the second exemplary structure after formation of memory stack structures and support pillar structures according to the second embodiment of the present disclosure.

Referring to FIGS. 34H and 35, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration of the doped semiconductor material can be in a range from $5\times10^{18}/cm^3$ to $2\times10^{21}/cm^3$, although lesser and greater dopant concentrations can also be employed. The doped semiconductor material can be, for example, doped polysilicon.

Excess portions of the deposited semiconductor material can be removed from above the top surface of the topmost insulating layer 70, for example, by chemical mechanical planarization (CMP) or a recess etch. Each remaining portion of the semiconductor material having a doping of the second conductively type constitutes a drain region 63. The horizontal portion of the semiconductor channel material layer 60L located above the top surface of the topmost insulating layer 70 can be concurrently removed by a planarization process. Each remaining portion of the semiconductor channel material layer 60L can be located entirely within a memory opening 49 or entirely within a support opening 19.

Each remaining portion of the doped semiconductor material having a doping of the second conductivity type located constitutes a drain region 63. Each remaining portion of the semiconductor channel material layer 60L constitutes a vertical semiconductor channel 60, through which electrical current can flow when a vertical NAND device including the vertical semiconductor channel 60 is turned on. A gate dielectric layer 56 is surrounded by a vertical stack of discrete intermediate metallic electrodes 54, and laterally surrounds a vertical semiconductor channel 60.

An entire set of material portions filling a memory opening 49 constitutes a memory opening fill structure 58. Each memory opening fill structure 58 can include a vertical stack of discrete intermediate metallic electrodes 54, a gate dielectric layer 56, a vertical semiconductor channel 60, a dielectric core 62, and a drain region 63. An entire set of material portions filling a memory opening 49 constitutes a support pillar structure 20. Each support pillar structure 20 can include one or more discrete intermediate metallic electrodes 54 or no discrete intermediate metallic electrodes 54, a gate dielectric layer 56, a vertical semiconductor channel 60, a dielectric core 62, and a drain region 63. The total number of discrete intermediate metallic electrodes 54 in a support pillar structure can be the same as the number of sacrificial material layers 42 through which a respective support opening 19 vertically extends. An instance of a memory opening fill structure 58 can be formed within each memory opening 49 of the structure of FIGS. 33A and 33B. An instance of the support pillar structure 20 can be formed within each support opening 19 of the structure of FIGS. 33A and 33B.

Figure 36A:
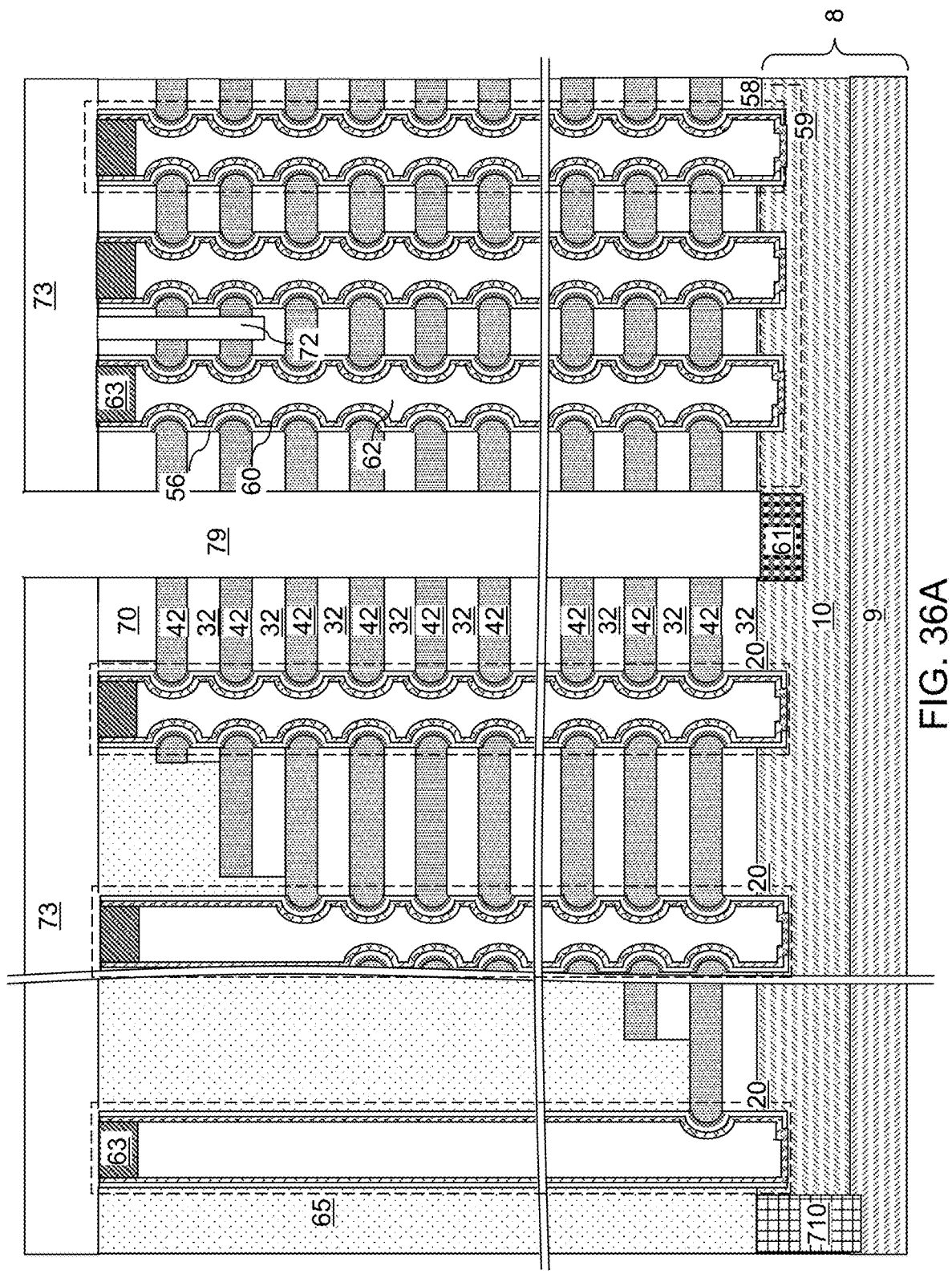
FIG. 36A is a schematic vertical cross-sectional view of the second exemplary structure after formation of a contact-level dielectric layer and backside trenches according to the second embodiment of the present disclosure.
Figure 36B:
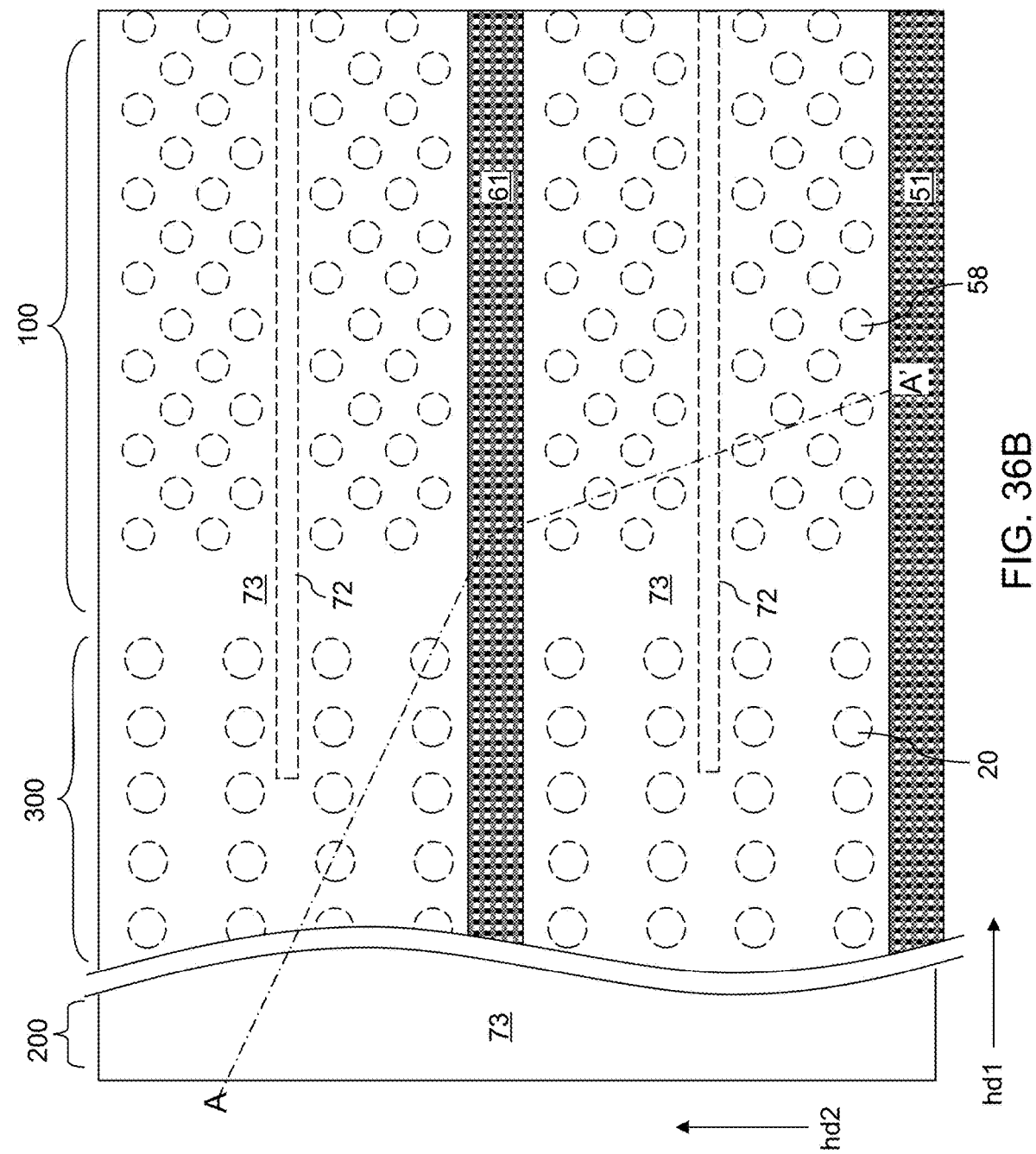
FIG. 36B is a partial see-through top-down view of the second exemplary structure of FIG. 37A. The vertical plane A-A' is the plane of the schematic vertical cross-sectional view of FIG. 37A.

Referring to FIGS. 36A and 36B, a contact-level dielectric layer 73 can be formed over the alternating stack (32, 42) of insulating layer 32 and sacrificial material layers 42, and over the memory opening fill structures 58 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory opening fill structures 58. The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate 8, and laterally extend through the memory array region 100 and the staircase region 300.

In one embodiment, the backside trenches 79 can laterally extend along a first horizontal direction hd1 and can be laterally spaced apart from each other along a second horizontal direction hd2 that is perpendicular to the first horizontal direction hd1. The memory opening fill structures 58 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory opening fill structures 58 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Dopants of the second conductivity type can be implanted into portions of the upper substrate semiconductor layer 10 that underlie the backside trenches 79 to form source regions 61. The atomic concentration of the dopants of the second conductivity type in the source regions 61 can be in a range from $5 \times 10^{18}/cm^3$ to $2 \times 10^{21}/cm^3$, although lesser and greater atomic concentrations can also be employed. Surface portions of the upper substrate semiconductor layer 10 that extend between each source region 61 and adjacent memory opening fill structures 58 comprise horizontal semiconductor channels 59.

Figure 37:
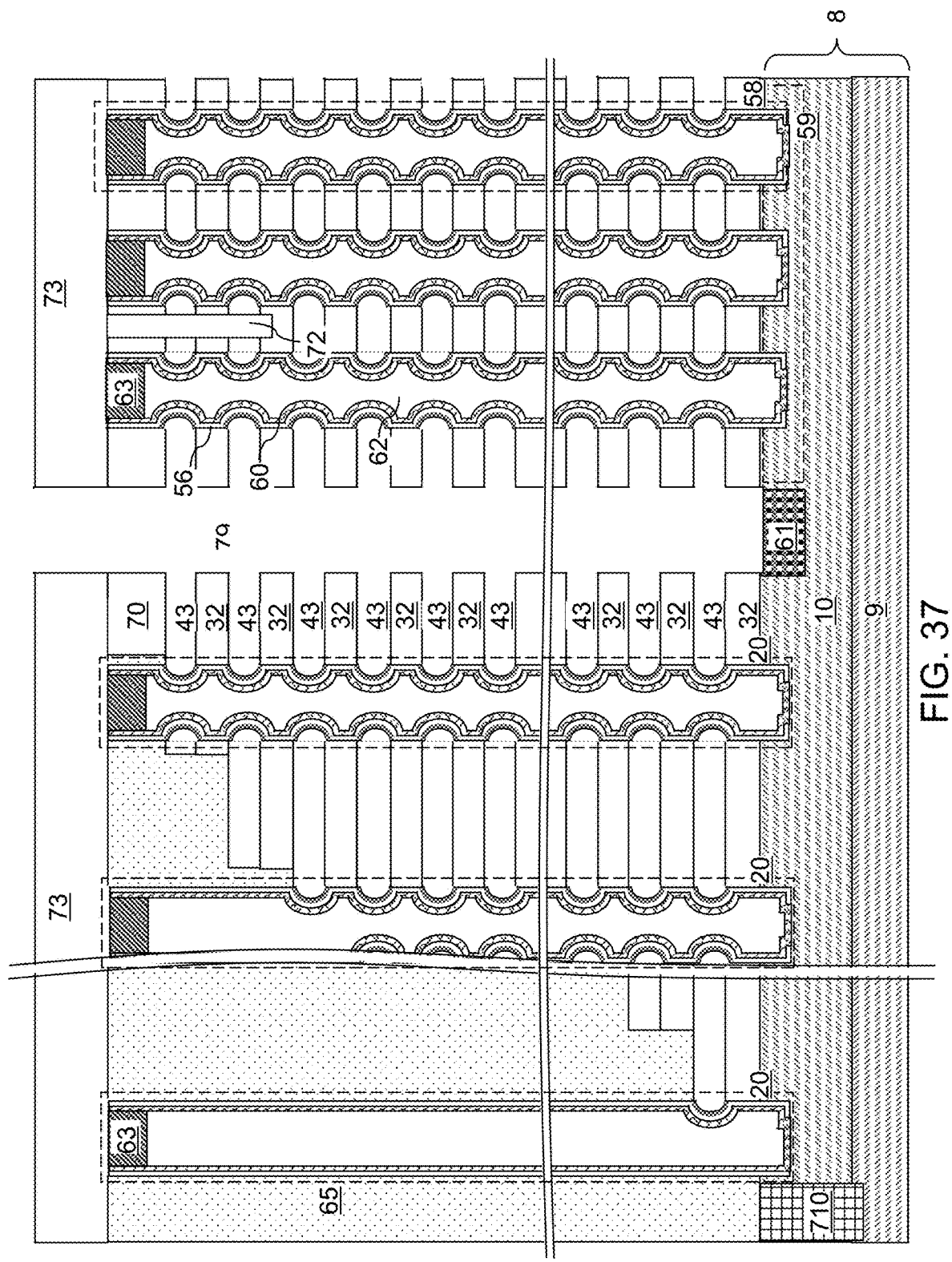
FIG. 37 is a schematic vertical cross-sectional view of the second exemplary structure after formation of backside recesses according to the second embodiment of the present disclosure.

Referring to FIG. 37, an etchant that selectively etches the second material of the sacrificial material layers 42 with respect to the first material of the insulating layers 32 can be introduced into the backside trenches 79, for example, by performing the isotropic etch process of FIG. 16. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the upper substrate semiconductor layer 10, and the material of the discrete intermediate metallic electrodes 54. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the discrete intermediate metallic electrodes 54 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the second exemplary structure is immersed within a wet etch tank including phosphoric acid, which etches silicon nitride selective to silicon oxide, silicon, and various other materials employed in the art. The support pillar structures 20, the retro-stepped dielectric material portion 65, and the memory opening fill structures 58 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory opening fill structures 58 are formed are herein referred to as front side openings or front side cavities in contrast with the backside recesses 43. In one embodiment, the memory array region 100 comprises an array of monolithic three-dimensional NAND strings having a plurality of device levels disposed above the substrate 8. In this case, each backside recess 43 can define a space for receiving a respective word line of the array of monolithic three-dimensional NAND strings.

Each of the plurality of backside recesses 43 can extend substantially parallel to the top surface of the substrate 8. A backside recess 43 can be vertically bounded by a top surface of an underlying insulating layer 32 and a bottom surface of an overlying insulating layer 32. In one embodiment, each backside recess 43 can have a uniform height throughout.

Figure 38:
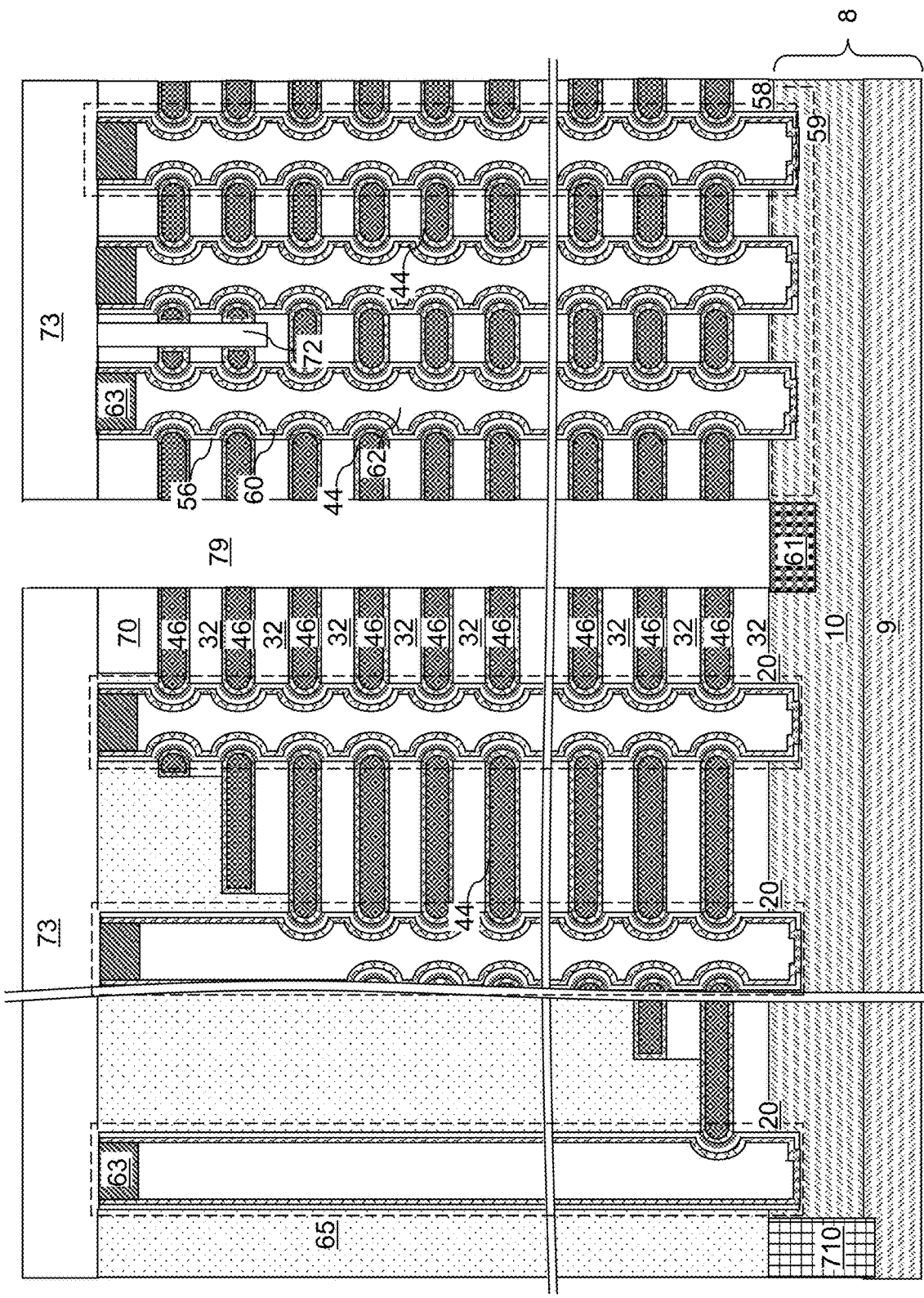
FIG. 38 is a schematic vertical cross-sectional view of the second exemplary structure after replacement of the sacrificial material layers with combinations of a ferroelectric dielectric layer and an electrically conductive layer according to the second embodiment of the present disclosure.

Referring to FIG. 38, a ferroelectric dielectric layer 44 can be deposited in the backside recesses 43. The ferroelectric dielectric layer 44 can include any ferroelectric dielectric material that may be employed for the ferroelectric dielectric layer 44 in the first exemplary structure. The ferroelectric dielectric layer 44 can be formed in the backside recesses 43 and on a sidewall of the backside trench 79. The ferroelectric dielectric layer 44 can be formed directly on horizontal surfaces of the insulating layers 32 and sidewalls of the memory opening fill structures 58 within the backside recesses 43.

According to an aspect of the present disclosure, each of the discrete intermediate metallic electrodes 54 has a greater contact area with a respective gate dielectric layer 56 than with a respective one of the ferroelectric dielectric layers 44. In one embodiment, the curvature in the vertical cross-sectional shape in each of the discrete intermediate metallic electrodes 54 provides a greater surface area for the inner convex sidewall of each discrete intermediate metallic electrode 54 than for the outer concave sidewall of the same discrete intermediate metallic electrode 54. The reduction in the interfacial area between a ferroelectric dielectric layer 44 and a discrete intermediate metallic electrode 54 relative the interfacial area between the discrete intermediate metallic electrode 54 and a gate dielectric layer 56 causes enhanced electrical coupling between the ferroelectric dielectric layer 44 and the discrete intermediate metallic electrode 54, and suppresses charge tunneling through the gate dielectric layer 56. Thus, undesirable charge tunneling through the gate dielectric layer 56 during programming of the electrical polarization of the portion of the ferroelectric dielectric layer 44 in contact with the discrete intermediate metallic electrode 54 can be reduced in the ferroelectric memory devices of the present disclosure.

In one embodiment, the ratio of the contact area between a discrete intermediate metallic electrode 54 and a gate dielectric layer 56 to the contact area between the discrete intermediate metallic electrode and a ferroelectric dielectric layer 44 can be in a range from 1.2 to 4, such as from 1.5 to 3, such as 2, although lesser and greater ratios greater than 1 may also be employed. The thickness of each discrete intermediate metallic electrode 54 can be uniform throughout, and can be in a range from 2 nm to 20 nm, such as from 3 nm to 12 nm, although lesser and greater thicknesses can also be employed.

At least one conductive material can be deposited in remaining volumes of the backside recesses 43. For example, a metallic barrier layer can be deposited in the backside recesses 43 directly on the physically exposed surfaces of the ferroelectric dielectric layer 44, or on the physically exposed surfaces of the discrete intermediate metallic electrodes 54 and the insulating layers 32 in case a ferroelectric dielectric layer is not employed. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

A metal fill material is deposited in remaining volumes of backside recesses 43, on the sidewalls of the at least one backside trench 79, and over the top surface of the contact-level dielectric layer 73 to form a metallic fill material portion. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material portion can consist essentially of at least one elemental metal. The at least one elemental metal of the metallic fill material portion can be selected, for example, from tungsten, cobalt, ruthenium, molybdenum titanium, and tantalum. In one embodiment, the metallic fill material portion can consist essentially of a single elemental metal. In one embodiment, the metallic fill material portion can be deposited employing a fluorine-containing precursor gas such as $WF_6$. In one embodiment, the metallic fill material portion can be a tungsten layer including a residual level of boron, fluorine or silicon atoms as impurities.

A plurality of electrically conductive layers 46 (i.e., electrically conductive strips having strip shapes) can be formed in the plurality of backside recesses 43, and a continuous metallic material layer (not shown) can be formed on the sidewalls of each backside trench 79 and over the contact-level dielectric layer 73. Each electrically conductive layer 46 includes a portion of the metallic barrier layer and a metallic fill material portion that are located between a vertically neighboring pair of dielectric material strips such as a pair of insulating layers 32.

The deposited metallic material of the continuous metallic material layer is etched back from the sidewalls of each backside trench 79 and from above the contact-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack assemblies 57. In other words, each electrically conductive layer 46 can be a word line that functions as a common control gate electrode for the plurality of vertical memory devices.

Generally, the sacrificial material layers 42 are replaced with combinations of a ferroelectric dielectric layer 44 and an electrically conductive layer 46. Each ferroelectric dielectric layer 44 is deposited directly on a respective subset of the discrete intermediate metallic electrodes 54 that are located at a same level, i.e., located at a same vertical distance from the substrate 8. Each of the electrically conductive layers 46 is laterally spaced from each memory stack assembly 57 by a respective ferroelectric dielectric layer 44. Each ferroelectric dielectric layer 44 comprises a horizontally-extending portion that contacts a horizontal surface of a respective one of the insulating layers 32.

According to an aspect of the present disclosure, each of the discrete intermediate metallic electrodes 54 has a greater contact area with a respective gate dielectric layer 56 than with a respective one of the ferroelectric dielectric layers 44. In one embodiment, the curvature in the vertical cross-sectional shape in each of the discrete intermediate metallic electrodes 54 provides a greater surface area for the inner convex sidewall of each discrete intermediate metallic electrode 54 than for the outer concave sidewall of the same discrete intermediate metallic electrode 54. The reduction in the interfacial area between a ferroelectric dielectric layer 44 and a discrete intermediate metallic electrode 54 relative the interfacial area between the discrete intermediate metallic electrode 54 and a gate dielectric layer 56 causes enhanced electrical coupling between the ferroelectric dielectric layer 44 and the discrete intermediate metallic electrode 54, and suppresses charge tunneling through the gate dielectric layer 56. Thus, undesirable charge tunneling through the gate dielectric layer 56 during programming of the electrical polarization of the portion of the ferroelectric dielectric layer 44 in contact with the discrete intermediate metallic electrode 54 can be suppressed in the ferroelectric memory devices of the present disclosure.

In one embodiment, the ratio of the contact area between a discrete intermediate metallic electrode 54 and a gate dielectric layer 56 to the contact area between the discrete intermediate metallic electrode and a ferroelectric dielectric layer 44 can be in a range from 1.2 to 4, such as from 1.5 to 3, although lesser and greater ratios greater than 1 may also be employed. The thickness of each discrete intermediate metallic electrode 54 can be uniform throughout, and can be in a range from 2 nm to 20 nm, such as from 3 nm to 12 nm, although lesser and greater thicknesses can also be employed.

Figure 39:
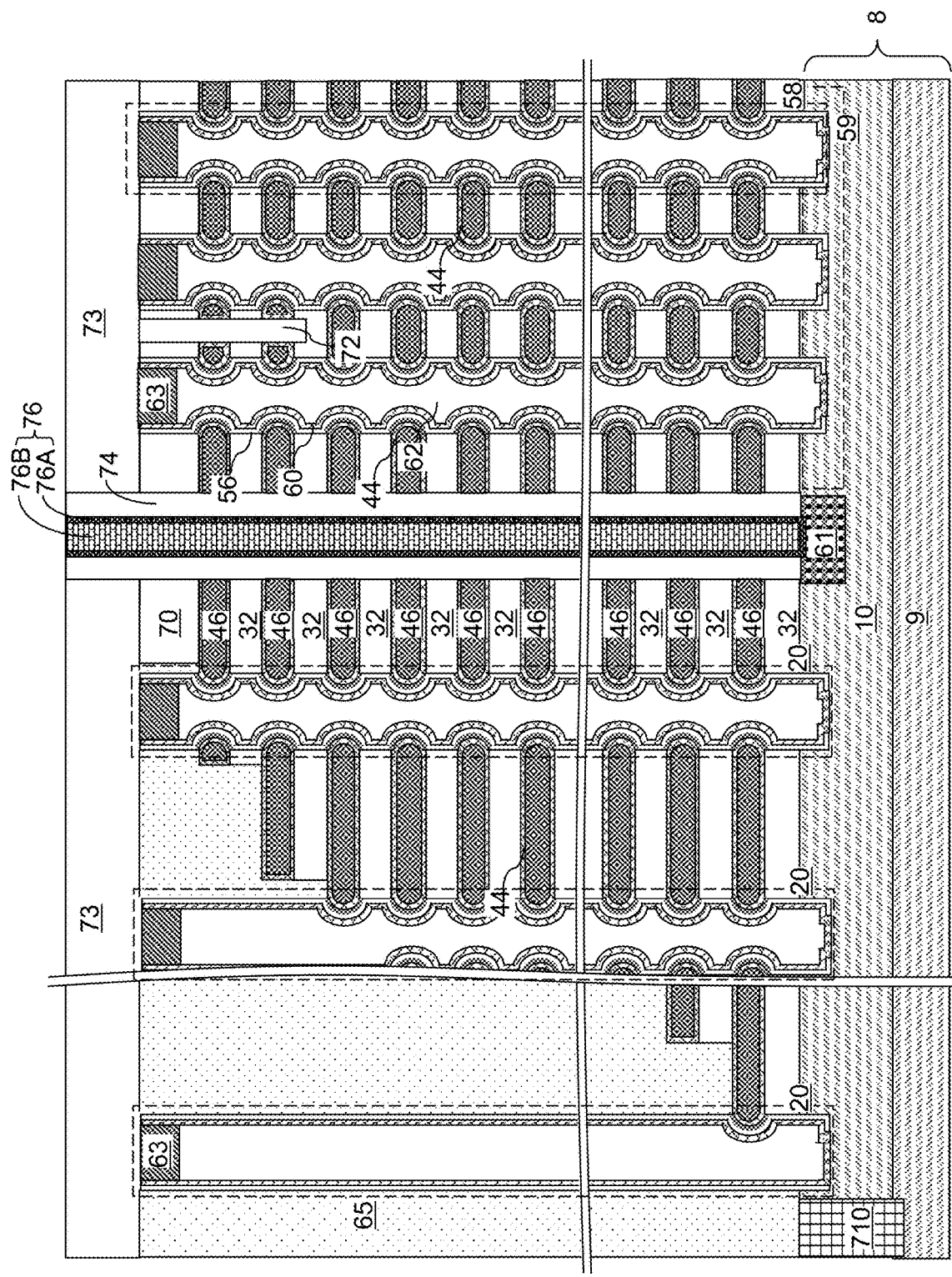
FIG. 39 is a schematic vertical cross-sectional view of the second exemplary structure after formation of an insulating spacer and a backside contact structure according to the second embodiment of the present disclosure.

Referring to FIG. 39, an insulating material layer can be formed in the backside trenches 79 and over the contact-level dielectric layer 73 by a conformal deposition process. Second exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity is present within a volume surrounded by each insulating spacer 74. A top surface of the upper substrate semiconductor layer 10 can be physically exposed at the bottom of each backside trench 79.

An upper portion of the upper substrate semiconductor layer 10 that extends between the source region 61 and a plurality of vertical semiconductor channels 60 constitutes a horizontal semiconductor channel 59 for a plurality of field effect transistors. The horizontal semiconductor channel 59 contacts the source region 61 and the plurality of vertical semiconductor channels 60. Each source region 61 is formed in an upper portion of the substrate 8. Semiconductor channels (59, 60) extend between each source region 61 and a respective set of drain regions 63. The semiconductor channels (59, 60) include the vertical semiconductor channels 60 of the memory opening fill structures 58.

A backside contact via structure 76 can be formed within each backside cavity. Each contact via structure 76 can fill a respective backside cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of the source region 61.

Alternatively, at least one dielectric material, such as silicon oxide, may be conformally deposited in the backside trenches 79 by a conformal deposition process. Each portion of the deposited dielectric material that fills a backside trench 79 constitutes a backside trench fill structure. In this case, each backside trench fill structure may fill the entire volume of a backside trench 79 and may consist essentially of at least one dielectric material. In this alternative embodiment, the source region 61 may be omitted, and a horizontal source line (e.g., direct strap contact) may contact an side of the lower portion of the semiconductor channel 60. Likewise, the gate dielectric layer 56 patterning step shown in FIG. 36E may also be omitted in this alternative embodiment and the horizontal portion of the gate dielectric layer 56 may remain unpatterned at the bottom of the memory opening 49 because the source line makes contact with the side of the semiconductor channel 60 through an opening etched through a side of the ferroelectric dielectric layer 44 and the gate dielectric layer 56. In this case, the at least one gate dielectric layer 56 comprises a single gate dielectric layer 56 instead of the two gate dielectric layers 56 described above.

Figure 40A:
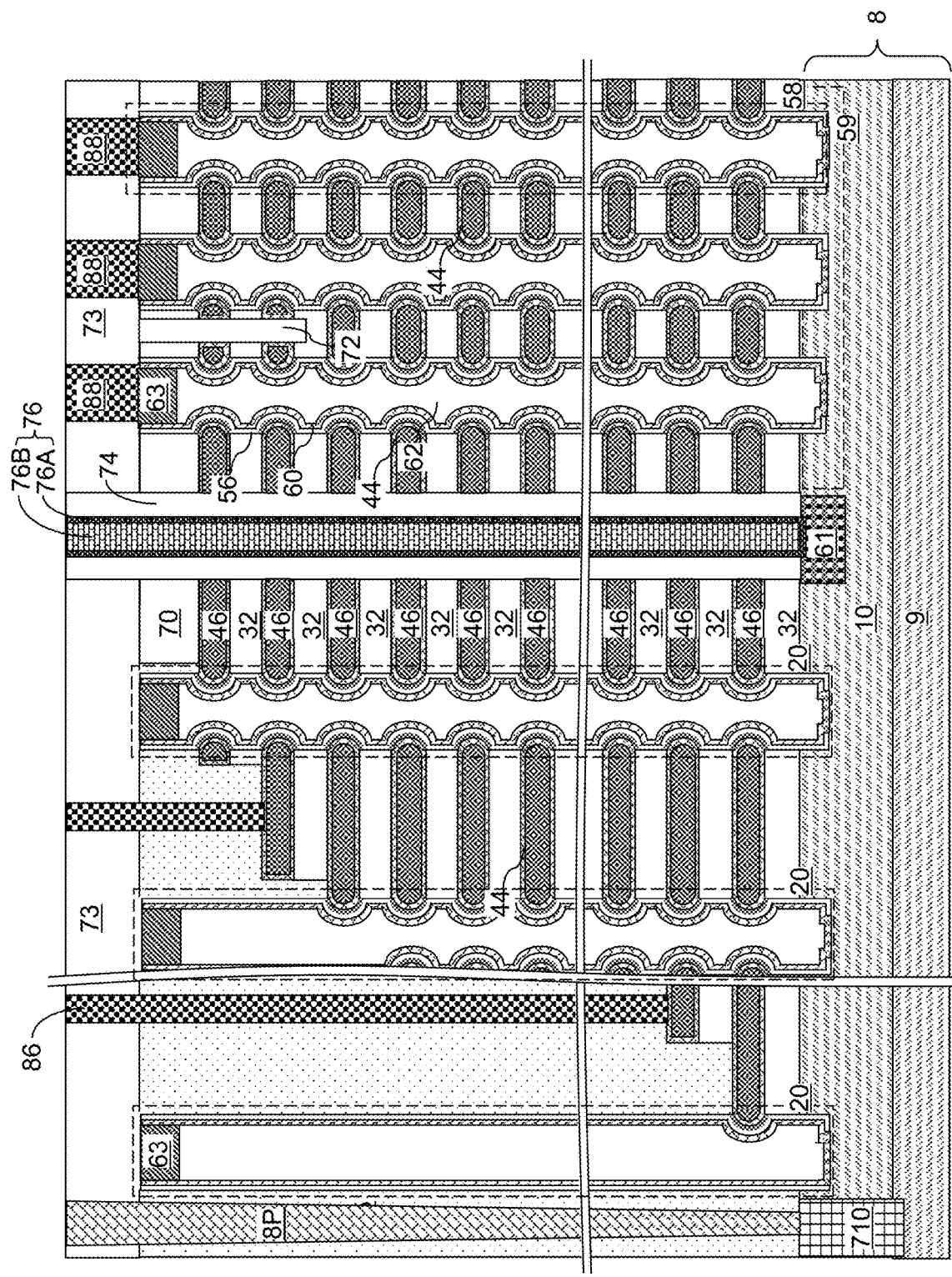
FIG. 40A is a schematic vertical cross-sectional view of the second exemplary structure after formation of additional contact via structures according to the second embodiment of the present disclosure.
Figure 40B:
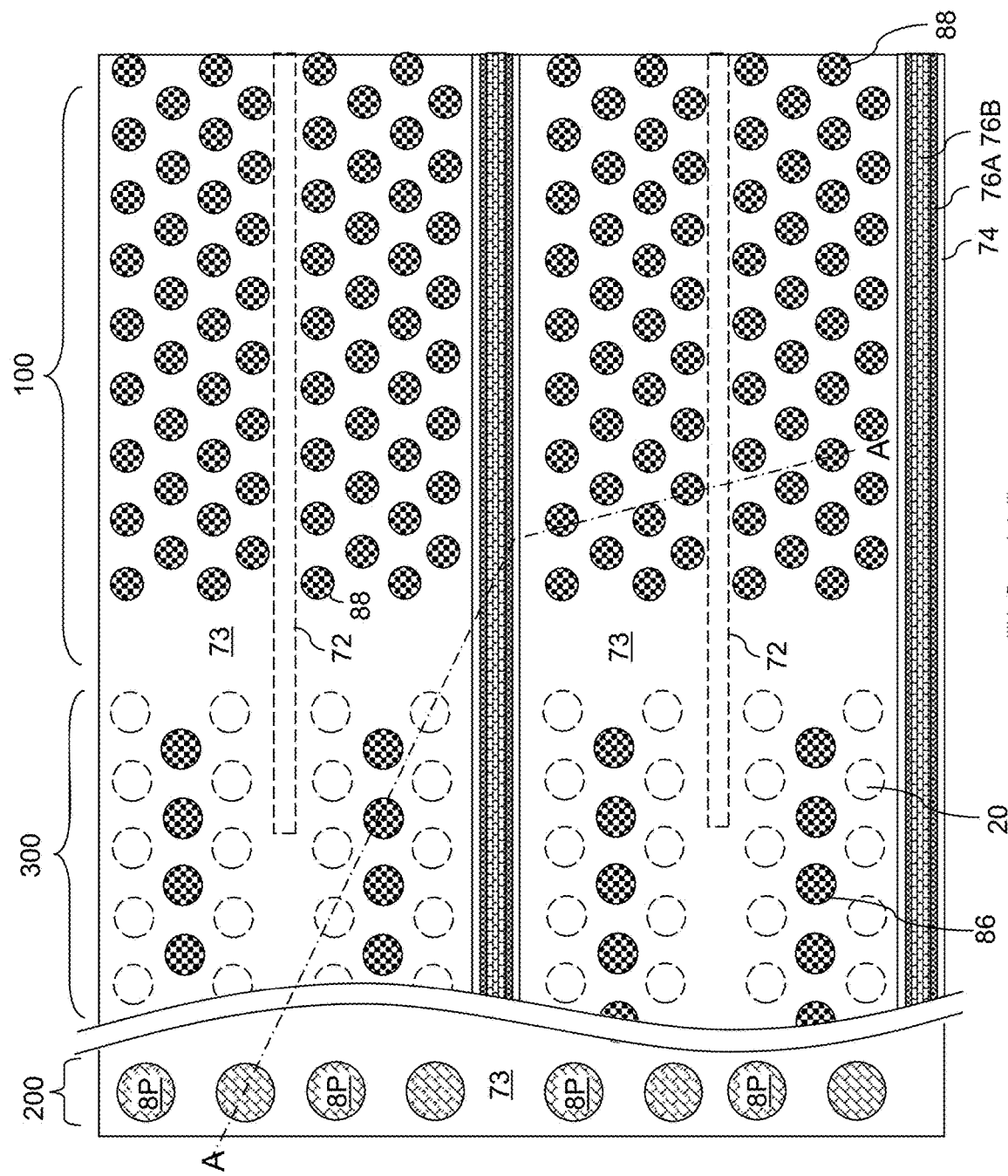
FIG. 40B is a top-down view of the second exemplary structure of FIG. 40A. The vertical plane A-A' is the plane of the schematic vertical cross-sectional view of FIG. 40A.

Referring to FIGS. 40A and 40B, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices.

Referring collective to FIGS. 31-40B and according to various embodiments of the present disclosure, a three-dimensional memory device is provided, which comprises: an alternating stack of insulating layers 32 and electrically conductive layers 46 located over a substrate 8; a memory opening 49 vertically extending through the alternating stack (32, 46); and a memory opening fill structure 58 located in the memory opening 49 and comprising a vertical stack of discrete intermediate metallic electrodes 54, a gate dielectric layer 56, and a vertical semiconductor channel (60 or 160), wherein each of the electrically conductive layers 46 is laterally spaced from the memory opening fill structure 58 by a respective ferroelectric dielectric layer 44 and each of the discrete intermediate metallic electrodes 54 has a greater contact area with the gate dielectric layer 56 than with the respective ferroelectric dielectric layer 44.

In one embodiment, each ferroelectric dielectric layer 44 comprises a horizontally-extending portion that contacts a horizontal surface of a respective one of the insulating layers 32. In one embodiment, each of the discrete intermediate metallic electrodes 54 comprises a concave outer sidewall that contacts a convex inner sidewall of the respective ferroelectric dielectric layer 44 in a vertical cross-sectional view.

In one embodiment, the gate dielectric layer 56 contacts the vertical stack of discrete intermediate metallic electrodes 54. In one embodiment, the gate dielectric layer 56 has a laterally-undulating vertical cross-sectional profile that includes straight gate dielectric segments that contact a respective one of the insulating layers 32 and curved gate dielectric segments contacting a respective discrete intermediate metallic electrode 54 within the vertical stack of discrete intermediate metallic electrodes 54. In one embodiment, each of the curved gate dielectric segments comprises a concave outer sidewall that contacts a respective one of the discrete intermediate metallic electrodes 54 and a convex inner sidewall that contacts a concave sidewall segment of the vertical semiconductor channel (60 or 160).

In one embodiment, the vertical semiconductor channel (60 or 160) has a laterally-undulating vertical cross-sectional profile, and includes straight semiconductor channel segments located at levels of the insulating layers 32 and curved semiconductor channel segments located at levels of the vertical stacks of discrete intermediate metallic electrodes 54.

In one embodiment, the vertical semiconductor channel 60 comprises a polycrystalline semiconductor material.

In one embodiment, the substrate 8 comprises a semiconductor material layer (such as a substrate semiconductor layer (9, 10) comprising a first single crystalline semiconductor material; and the vertical semiconductor channel 160 comprises a second single crystalline semiconductor material that is in epitaxial alignment with the first single crystalline semiconductor material.

In one embodiment, the vertical stack of discrete intermediate metallic electrodes 54 consists essentially of an elemental metal. The metal can consist essentially of a single transition metal element that is selected from iridium, ruthenium, palladium, osmium, rhenium, molybdenum, cobalt or tungsten. In one embodiment, the elemental metal is ruthenium.

In one embodiment, each discrete intermediate metallic electrode 54 within the vertical stack of discrete intermediate metallic electrodes 54 comprises: an outer concave sidewall in contact with a respective one of the ferroelectric dielectric layers 44; and an inner convex sidewall in contact with the gate dielectric layer 56. In one embodiment, each discrete intermediate metallic electrode 54 within the vertical stack of discrete intermediate metallic electrodes 54 comprises: an upper vertical sidewall connecting an upper periphery of the inner convex sidewall and an upper periphery of the outer concave sidewall; and a lower vertical sidewall connecting a lower periphery of the inner convex sidewall and a lower periphery of the outer concave sidewall.

In one embodiment, the memory opening fill structure 58 comprises a dielectric core contacting convex surfaces of the vertical semiconductor channel.

The various embodiments of the present disclosure provide a ferroelectric memory device including a ferroelectric-metal-insulator memory cell in which the contact area between each discrete intermediate metallic electrode 54 and the gate dielectric layer 56 is greater than the contact area between the discrete intermediate metallic electrode 54 and the ferroelectric dielectric layer 44. This configuration reduces tunneling of electrical charge (e.g., electrons) through the gate dielectric layer 56 during programming of the electrical polarization of the portion of the ferroelectric dielectric layer 44 that stores information in the form of the direction of electrical polarization therein. This configuration also improves the electric field coupling onto the ferroelectric dielectric layer 44 compared to the gate dielectric layer 56. This allows for optimal charge matching between ferroelectric dielectric layer 44 and the gate dielectric layer 56, effectively driving up the On/Off current ratio. Thus, an improved On/Off current ratio may be provided by using the ferroelectric-metal-insulator memory cell and by increasing the capacitance area of the gate dielectric layer 56 with respect to the capacitance area of the ferroelectric dielectric layer 44.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   alternating stacks of insulating strips and electrically conductive strips located over a substrate and laterally spaced apart from each other by line trenches laterally extending along a first horizontal direction and spaced apart from each other along a second horizontal direction;
   a two-dimensional array of memory stack assemblies located in the line trenches;
   a two-dimensional array of dielectric pillar structures located in the line trenches and laterally offset from, and interlaced with, the two-dimensional array of memory stack assemblies, wherein each line trench is filled with a respective row of memory stack assemblies and a respective row of dielectric pillar structures that is interlaced with the respective row of memory stack assemblies,
   wherein:
   each memory stack assembly comprises a vertical semiconductor channel, at least one gate dielectric layer, and two vertical stacks of discrete intermediate metallic electrodes;

each of the electrically conductive strips is laterally spaced from each memory stack assembly by a respective ferroelectric dielectric layer; and each of the discrete intermediate metallic electrodes has a greater contact area with a respective gate dielectric layer than with the respective ferroelectric dielectric layer.

2. The three-dimensional memory device of claim 1, wherein the ferroelectric dielectric layer comprises a horizontally-extending portion that contacts a horizontal surface of a respective one of the insulating strips.

3. The three-dimensional memory device of claim 1, wherein each of the discrete intermediate metallic electrodes comprises a concave outer sidewall that contacts a convex inner sidewall of the respective ferroelectric dielectric layer.

4. The three-dimensional memory device of claim 3, wherein the at least one gate dielectric layer contacts a respective vertical stack of discrete intermediate metallic electrodes within the two vertical stacks of discrete intermediate metallic electrodes.

5. The three-dimensional memory device of claim 3, wherein the at least one gate dielectric layer has a laterally-undulating vertical cross-sectional profile that includes straight gate dielectric segments that contact a respective one of the insulating strips and curved gate dielectric segments contacting a respective vertical stack of discrete intermediate metallic electrodes.

6. The three-dimensional memory device of claim 5, wherein each of the curved gate dielectric segments comprises a concave outer sidewall that contacts a respective one of the discrete intermediate metallic electrodes and a convex inner sidewall that contacts a concave sidewall segment of the vertical semiconductor channel.

7. The three-dimensional memory device of claim 1, wherein the vertical semiconductor channel has a laterally-undulating vertical cross-sectional profile, and includes straight semiconductor channel segments located at levels of the insulating strips and curved semiconductor channel segments located at levels of the vertical stacks of discrete intermediate metallic electrodes.

8. The three-dimensional memory device of claim 7, wherein the vertical semiconductor channel comprises a polycrystalline semiconductor material.

9. The three-dimensional memory device of claim 1, wherein:
the substrate comprises a single crystalline semiconductor material; and
the vertical semiconductor channel comprises a single crystalline semiconductor material that is in epitaxial alignment with the single crystalline semiconductor material of the substrate.

10. The three-dimensional memory device of claim 1, wherein the two vertical stacks of discrete intermediate metallic electrodes consist essentially of ruthenium.

11. The three-dimensional memory device of claim 1, wherein each discrete intermediate metallic electrode within the two vertical stacks of discrete intermediate metallic electrodes comprises:
an outer concave sidewall in contact with a respective one of the ferroelectric dielectric layers; and
an inner convex sidewall in contact with the at least one gate dielectric layer.

12. The three-dimensional memory device of claim 11, wherein each discrete intermediate metallic electrode within the two vertical stacks of discrete intermediate metallic electrodes comprises:
an upper vertical sidewall connecting an upper periphery of the inner convex sidewall and an upper periphery of the outer concave sidewall; and
a lower vertical sidewall connecting a lower periphery of the inner convex sidewall and a lower periphery of the outer concave sidewall.

13. The three-dimensional memory device of claim 1, wherein each of the memory stack assemblies comprises a dielectric core contacting convex surfaces of the vertical semiconductor channel.

* * * * *